(12) United States Patent
Hatakeyama et al.

(10) Patent No.: US 10,005,868 B2
(45) Date of Patent: Jun. 26, 2018

(54) RESIST COMPOSITION AND PATTERNING PROCESS USING THE SAME

(71) Applicant: SHIN-ETSU CHEMICAL CO., LTD., Tokyo (JP)

(72) Inventors: Jun Hatakeyama, Jyoetsu (JP); Koji Hasegawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 15/195,387

(22) Filed: Jun. 28, 2016

(65) Prior Publication Data

US 2017/0029547 A1 Feb. 2, 2017

(30) Foreign Application Priority Data

Jul. 29, 2015 (JP) .................................. 2015-149895

(51) Int. Cl.
*G03F 7/039* (2006.01)
*G03F 7/20* (2006.01)
(Continued)

(52) U.S. Cl.
CPC ........ *C08F 222/14* (2013.01); *C08F 216/165* (2013.01); *C08F 220/68* (2013.01);
(Continued)

(58) Field of Classification Search
None
See application file for complete search history.

(56) References Cited

U.S. PATENT DOCUMENTS 2,864,831 A * 12/1958 Eppstein ................. C12P 33/00
435/60
5,879,851 A 3/1999 Takahashi et al.
(Continued)

FOREIGN PATENT DOCUMENTS

CA 2049772 A1 2/1992
FR 2270849 * 12/1975
(Continued)

OTHER PUBLICATIONS

"Sigma Steroids",ThermoFischer Scientific, (2007) 43 pages.*
(Continued)

*Primary Examiner* — Martin J Angebranndt
(74) *Attorney, Agent, or Firm* — Oliff PLC

(57) ABSTRACT

The present invention provides a resist composition containing a base resin composed of a polymer compound having a repeating unit in which a hydrogen atom of a carboxyl group is substituted with one or more acid-labile groups selected from groups shown by the following general formulae (1-1) to (1-5),

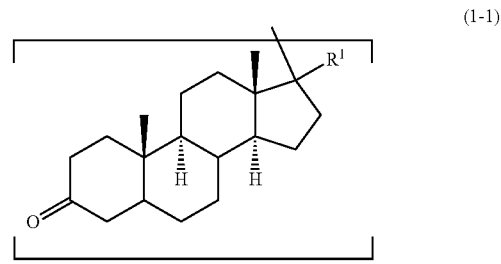
(1-1)

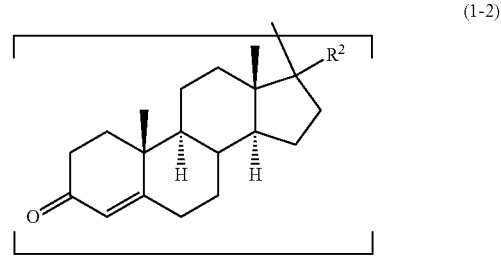

(1-2)

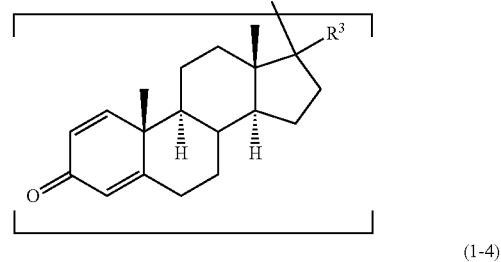

(1-3)

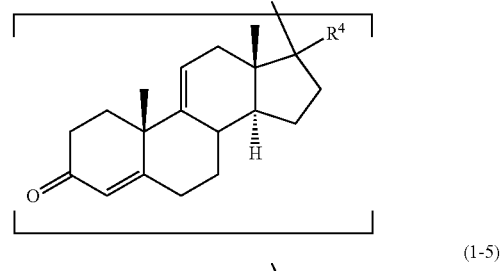

(1-4)

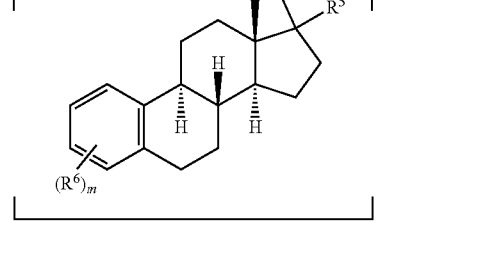

(1-5)

wherein $R^1$ to $R^5$ represent a linear, branched, or cyclic alkyl group having 1 to 4 carbon atoms, an alkenyl group having 2 to 4 carbon atoms, or an alkynyl group having 2 to 4 carbon atoms; $R^6$ represents a hydroxyl group or an alkoxy group or acyloxy group having 1 to 6 carbon atoms; and "m" represents 1 or 2. There can be provided a resist composition (Continued)

that can improve the dissolution contrast of a resist film and reduce the film shrinkage after PEB, and a patterning process using the same.

13 Claims, No Drawings

(51) Int. Cl.
  *G03F 7/38* (2006.01)
  *C08F 222/14* (2006.01)
  *C08F 220/68* (2006.01)
  *C08F 216/16* (2006.01)
  *G03F 7/32* (2006.01)

(52) U.S. Cl.
  CPC .......... *G03F 7/0395* (2013.01); *G03F 7/2059* (2013.01); *G03F 7/322* (2013.01); *G03F 7/38* (2013.01)

(56) References Cited

U.S. PATENT DOCUMENTS

| | | | |
|---|---|---|---|
| 6,042,991 A | 3/2000 | Aoai et al. | |
| 6,416,925 B1 * | 7/2002 | Aoai | G03F 7/039 430/270.1 |
| 2002/0115874 A1 | 8/2002 | Kinsho et al. | |
| 2007/0231708 A1 | 10/2007 | Matsumaru et al. | |
| 2008/0090172 A1 | 4/2008 | Hatakeyama et al. | |
| 2008/0118860 A1 | 5/2008 | Harada et al. | |
| 2008/0187860 A1 | 8/2008 | Tsubaki et al. | |
| 2008/0241736 A1 | 10/2008 | Kobayashi et al. | |
| 2009/0011366 A1 | 1/2009 | Tsubaki et al. | |
| 2014/0170563 A1 * | 6/2014 | Hatakeyama | G03F 7/40 430/285.1 |

FOREIGN PATENT DOCUMENTS

| | | |
|---|---|---|
| JP | H04-230645 A | 8/1992 |
| JP | H10232495 A | 9/1998 |
| JP | 2000-327633 A | 11/2000 |
| JP | 3429592 B2 | 7/2003 |
| JP | 2005-084365 A | 3/2005 |
| JP | 2006-045311 A | 2/2006 |
| JP | 2006-178317 A | 7/2006 |
| JP | 2008-111103 A | 5/2008 |
| JP | 2008-122932 A | 5/2008 |
| JP | 2008-239918 A | 10/2008 |
| JP | 2008-281974 A | 11/2008 |
| JP | 2008-281975 A | 11/2008 |
| JP | 4554665 B2 | 9/2010 |
| JP | 2012-063653 A | 3/2012 |
| TW | 201405250 A | 2/2014 |
| TW | 201407272 A | 12/2014 |
| TW | 201523136 A | 6/2015 |

OTHER PUBLICATIONS

Batz et al., "Pharmacologically active polymers, 7", Makromol. Chem., vol. 175 pp. 2229-2239 (1974).*
Kim et al., "Chemically amplified resist based upon the norbornene copolymers with steroid derivatives", Proc. SPIE, vol. 3678 pp. 36-43 (Mar. 1999).*
Yakoyama et al., ArF Negative resist system . . . , Proc SPIE, vol. 4345 pp. 58-66 (2001).*
Nakamura et al, Contact Hole Formation by Multiple Exposure Technique in Ultra-low k1 Lithography, "Opitcal Microlithography XVII," Proceedings of SPIE, vol. 5377, 2004, pp. 255-263.
Nakao et al, 0.12mm Hole Pattern Formation by KrF Litography for Giga Bit DRAM, IEE IEDM Tech. Digest 61, 1996.
Truffert et al, Ultimate Contact Hole Resolution using Immersion Lithography with Line/Space Imaging, "Optical Microlithography XXII," Proceedings of SPIE, vol. 7274, 2009, pp. 72740N-1 to 72740N-12.
Fang et al, A Physics-based Model for Negative Tone Development Materials, "Journal of Photopolymer Science and Technology," vol. 27, No. 1, pp. 53-59, 2014.
Dec. 12, 2017 Office Action issued in Taiwanese Application No. 105123502.
Mar. 13, 2018 Notification of Reasons for Refusal issued in Japanese Application No. 2015-149895.

* cited by examiner

RESIST COMPOSITION AND PATTERNING PROCESS USING THE SAME

BACKGROUND OF THE INVENTION

Field of the Invention

The present invention relates to a resist composition and a patterning process, and more particularly to a resist composition using a polymer compound suitable for a base resin of a chemically amplified resist composition.

Description of the Related Art

A finer pattern rule has been recently required for Large-Scale Integrated circuits (LSI) with higher integration and higher processing speed. Under such circumstances, photo-exposure, which has been currently used as a general technique, is approaching to essential limit of resolution according to the wavelength of a light source. As the exposure light used in resist patterning, g-line beam (436 nm) or i-line beam (365 nm) of mercury lamp had been widely used in 1980s. Shifting the exposure light to shorter wavelength was assumed to be effective in finer patterning. Thus, KrF excimer laser (248 nm), whose wavelength is shorter than i-line beam (365 nm), had been used in place of i-line beam as the exposure light source in the mass production process of Dynamic Random Access Memory (DRAM) with 64 MB (work size of 0.25 m or less) in 1990s and later ones. However, the production of DRAM with integration of 256 MB and 1 GB or higher, which requires still finer processing technologies (work size of 0.2 μm or less), needs a light source with still shorter wavelength, and thus a photolithography using ArF excimer laser (193 nm) has been investigated seriously over a decade. It was expected at first that the ArF lithography would be applied to the production of 180 nm-node devices. However, the KrF excimer lithography survives to the mass production of 130 nm-node devices, so that a full-fledged application of the ArF lithography starts from 90 nm-node. Furthermore, the mass production of 65 nm-node devices is now underway by combining the ArF lithography with a lens having an increased numerical aperture (NA) of 0.9. For next 45 nm-node devices, the wavelength of the exposure light has further shortened, and $F_2$ lithography with 157 nm wavelength comes up. However, there are many problems in the $F_2$ lithography: cost-up of a scanner due to use of a quantity of expensive $CaF_2$ single crystals for a projection lens; extremely poor durability of a soft pellicle; change of an optical system caused by introducing a hard pellicle; a decrease in etching resistance of a resist film, and so forth. For these problems, development of the $F_2$ lithography was suspended, and ArF immersion lithography was introduced.

In the ArF immersion lithography, water having a refractive index of 1.44 is put between a projection lens and a wafer by a partial fill method. This enables high speed scanning, and the mass production of the 45 nm-node devices is now underway by using a lens with a NA of 1.3.

For 32 nm-node lithography, a lithography with an extreme ultraviolet ray (EUV) of 13.5 nm wavelength is considered to be a candidate. Unfortunately, the EUV lithography has problems such as needs for a higher output power of the laser, a higher sensitivity of the resist film, a higher resolution, a lower edge roughness (LER, LWR), a non-defect MoSi laminate mask, a lower aberration of the reflective mirror, and so forth. Thus, there are innumerable problems to be solved.

Development of an immersion lithography with high refractive index, which is another candidate for the 32 nm-node, was suspended because of low transmittance of LUAG, a candidate for a high refractive index lens, and an inability to obtain a target value of a liquid's refractive index at 1.8.

In recent years, a double patterning process, in which a first pattern is formed by first exposure and development, and then a pattern is formed exactly in the space of the first pattern by second exposure, draws attention. As the double patterning process, many processes are proposed. One example is a method that includes forming a photoresist pattern with a line-to-space ratio of 1:3 by first exposure and development; processing an underlayer hard mask by dry etching; laying another hard mask thereon; forming a line pattern by subjecting the photoresist film to exposure and development at the space obtained by the first exposure; processing the hard mask by dry etching to form a line and space pattern having half pitch of the first pattern. Another example is a method that includes forming a photoresist pattern with a space-to-line ratio of 1:3 by first exposure and development; processing an underlayer hard mask by dry etching; applying a photoresist film thereon; forming a second space pattern on a remaining portion of the hard mask by second exposure; and processing the hard mask by dry etching. In both methods, the hard mask is processed by dry etching twice.

A hole pattern is more difficult to be made fine than the line pattern. When a positive resist film is combined with a hole pattern mask and then subjected to under-exposure to form fine holes by the conventional method, exposure margin becomes extremely narrow. It is then proposed to form large holes and shrink the holes by thermal flow or RELACS™ method after development. Unfortunately, these methods cause a large difference between a pattern size after development and a pattern size after shrinking, and thus decrease a control accuracy with an increase in shrinkage. Moreover, the hole-shrinking methods fail to narrow the pitch although they can decrease the hole size.

In addition, there is proposed a method that includes forming a line pattern in X-direction with a positive resist film by dipole light; curing the resist pattern; applying a resist composition thereon again; exposing a line pattern in Y-direction by dipole light to form a hole pattern from gaps of the grid-like line pattern (Non-Patent Document 1). The combination of X and Y lines by dipole light with high contrast enables the hole pattern to be formed with a wide margin. However, the combined line patterns are difficult to be etched with high dimensional precision. On the other hand, there is proposed a method in which a negative resist film combining a Levenson-type phase shift mask in X-direction and a Levenson-type phase shift mask in Y-direction is exposed to light to form a hole pattern (Non-Patent Document 2). However, the negative resist film has disadvantage of lower resolution than the positive resist film because a limiting resolution of ultrafine hole of the crosslinkable negative resist film depends on a bridge margin.

A hole pattern formed by twice exposure combining a line in X-direction and a line in Y-direction followed by conversion into a negative pattern can be obtained by using a line pattern light with high contrast. Thus, this pattern has finer holes with a narrower pitch than that obtained by the conventional method.

Non-Patent Document 3 discloses the following three methods for forming a hole pattern by inversion: a method including forming a dot pattern by twice exposure of X and Y lines of a positive resist composition by double dipole, forming a SiO$_2$ film thereon by low-pressure chemical vapor deposition (LPCVD), and inversing the dots into holes by O$_2$ reactive ion etching (O$_2$-RIE); a method including forming a dot pattern with a resist composition that is solubilized in an alkali and insolubilized in a solvent by heating in the same manner as above, applying a phenolic over-coating film thereon, and inversing the dot pattern into a hole pattern by alkali development; a method including exposure of a positive resist composition by double dipole and inversion into a hole pattern by organic solvent development.

The organic solvent development is a conventional technique for forming a negative pattern. A resist composition of a cyclized rubber type uses an alkene such as xylene as the developer, and an early chemical amplified resist composition which is based on poly-tert-butoxycarbonyloxystyrene uses anisole as the developer to form a negative pattern.

The organic solvent development has recently attracted attention again. Specifically, the organic solvent development is used for forming a negative pattern with a positive resist composition having high resolution to resolve an ultrafine hole pattern, which is not achievable by positive tone, by negative tone exposure.

The conventional negative resist of an alkali development type uses crosslinking reaction. This crosslinkable negative resist advances crosslinking halfway at the middle region between exposed and unexposed parts, thus causing swelling. The swelling disadvantageously reduces dimensional uniformity and resolution due to pattern connection and pattern collapse. By contrast, the organic solvent development does not cause swelling. This is a point that the negative resist by the organic solvent development is superior to the crosslinkable negative resist by the alkali development. Thus, investigation of the negative resist by the organic solvent development is accelerated.

As an ArF resist composition for negative tone development with an organic solvent, conventional positive ArF resist compositions can be used. Patent Documents 1 to 3 discloses a patterning process using the same.

These documents propose a resist composition, for use in the organic solvent development, that is copolymerized with hydroxyadamantane methacrylate, norbornanelactone methacrylate, or methacrylate in which acidic groups such as a carboxyl group, a sulfo group, a phenol group, and a thiol group are substituted with two or more acid-labile groups; and a patterning process using the same.

In the positive development which produces a carboxyl group by deprotection reaction and improves dissolution rate by neutralization reaction with an alkali developer, the ratio of the dissolution rate between an unexposed part and an exposed part is 1,000 or more, and thus a large dissolution contrast is achieved. By contrast, the negative development with an organic solvent shows a low dissolution rate at an unexposed part by solvation, and thus the ratio of the dissolution rate between an unexposed part and an exposed part is 100 or less. Accordingly, the negative development with an organic solvent requires developing a novel material to increase the dissolution contrast.

In addition, there arises a problem of deformation of an isolated trench pattern formed by negative tone development (Non-Patent Document 4). Specifically, the film surface of the isolated trench is largely open, and thus a tapered pattern is formed. The tapered pattern is undesirable because this pattern causes dimensional shift in dry etching after development. When the isolated trench pattern is formed by alkali development of positive resist, such pattern deformation does not occur. Moreover, when an isolated line pattern is formed by alkali development of positive resist, such pattern deformation also does not occur although the line pattern is formed in the same manner, until development, as the isolated trench pattern is formed by the organic solvent development. Non-Patent Document 4 describes as follows: the film shrinks by deprotection of a protective group, the shrunk part remains after development in the negative tone development, and thus stress is applied to the remaining film, which causes deformation of the trench pattern.

PRIOR ART DOCUMENTS

Patent Documents

Patent Document 1: Japanese Patent Laid-Open Publication No. 2008-281974
Patent Document 2: Japanese Patent Laid-Open Publication No. 2008-281975
Patent Document 3: Japanese Patent No. 4554665

Non-Patent Documents

Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)
Non-Patent Document 4: Journal of Photopolymer Sci. and Tech. Vo. 27 No. 1 p 53 (2014)

SUMMARY OF THE INVENTION

As mentioned above, the film shrinkage after PEB, which causes deformation of an isolated pattern, needs to be reduced especially in the organic solvent development. To reduce the film shrinkage, decreasing the ratio of protective groups of acid-labile groups is effective. In this case, however, the dissolution contrast decreases, and thus the resolution also decreases. There is a conflict relationship, i.e., a trade-off relationship between the reduction in film shrinkage and the improvement in dissolution contrast. Thus, it is desired to develop a resist composition, particularly a resist composition using a polymer compound suitable for a base resin of a chemically amplified resist composition to overcome the trade-off relationship.

The present invention was accomplished in view of the circumstances, and an object thereof is to provide a resist composition that can improve the dissolution contrast of a resist film and reduce the film shrinkage after PEB, and to provide a patterning process using the same.

To accomplish the object, the present invention provides resist composition comprising a base resin composed of a polymer compound having a repeating unit in which a hydrogen atom of a carboxyl group is substituted with one or more acid-labile groups selected from groups shown by the following general formulae (1-1) to (1-5),

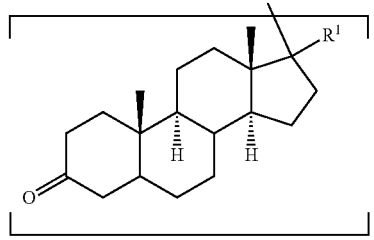
(1-1)

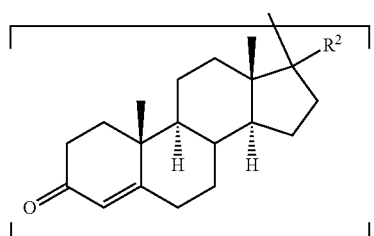
(1-2)

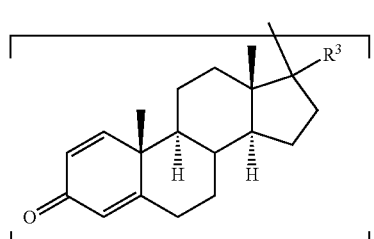
(1-3)

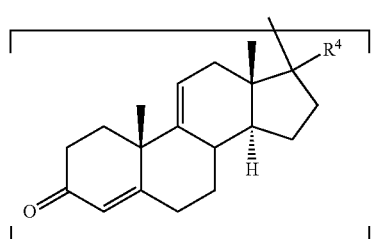
(1-4)

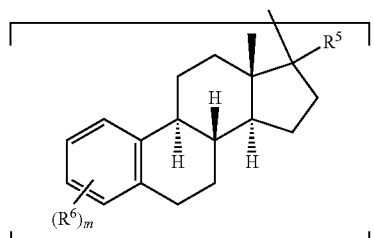
(1-5)

wherein $R^1$ to $R^5$ represent a linear, branched, or cyclic alkyl group having 1 to 4 carbon atoms, an alkenyl group having 2 to 4 carbon atoms, or an alkynyl group having 2 to 4 carbon atoms; $R^6$ represents a hydroxyl group or an alkoxy group or acyloxy group having 1 to 6 carbon atoms; and "m" represents 1 or 2.

Such a resist composition can improve the dissolution contrast of a resist film to be obtained from the composition and reduce the film shrinkage after PEB.

The polymer compound preferably has one or more repeating units selected from repeating units a1 to a5 shown by the following general formulae (2-1) to (2-5), the polymer compound having a weight average molecular weight ranging from 1,000 to 500,000,

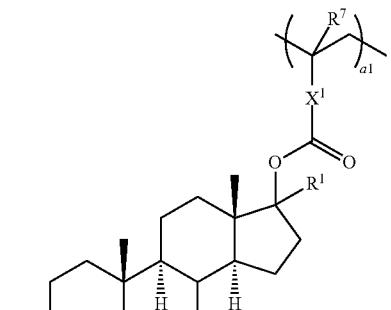
(2-1)

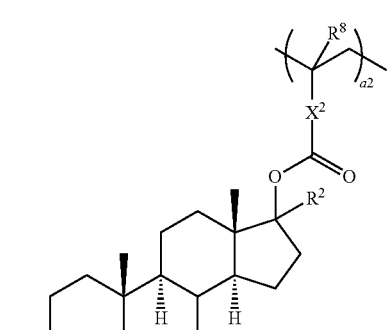
(2-2)

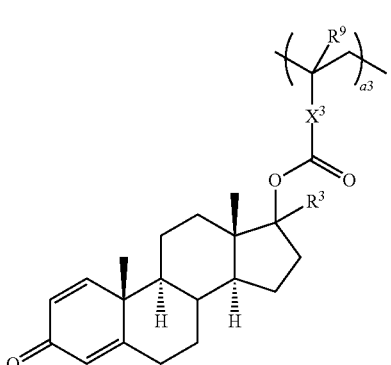
(2-3)

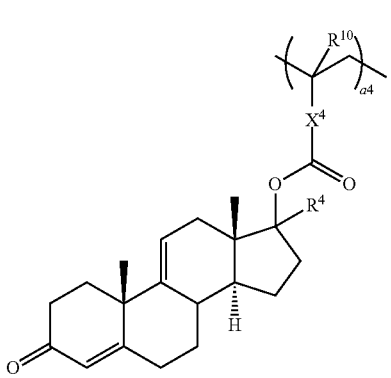
(2-4)

(2-5)

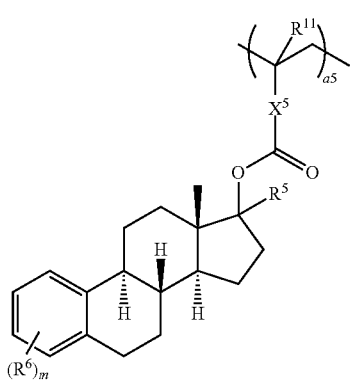

wherein $R^1$ to $R^6$ are as defined above; $X^1$ to $X^5$ represent a single bond or —C(=O)—O—$R^{12}$— where $R^{12}$ represents a linear, branched, or cyclic alkylene group having 1 to 10 carbon atoms and optionally containing an ester group, an ether group, or a lactone ring; $R^7$ to $R^{11}$ represent a hydrogen atom or a methyl group; a1 to a5 satisfy $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, and $0 < a1+a2+a3+a4+a5 \leq 1.0$.

The resist composition containing such a polymer compound can more greatly improve the dissolution contrast of a resist film to be obtained and reduce the film shrinkage after PEB.

The polymer compound is preferably further copolymerized with one or more repeating units b each containing an adhesion group selected from a hydroxyl group, a lactone ring, an ether group, an ester group, a carbonyl group, a cyano group, a sulfonate ester group, a sulfonamide group, cyclic —O—C(=O)—S—, and cyclic —O—C(=O)—NH—, with a content ratio of the repeating unit b of $0 < b < 1.0$.

Such a polymer compound can improve adhesion to a substrate.

The repeating unit b preferably contains either or both of a phenolic hydroxyl group and a lactone ring.

The polymer compound having such a repeating unit can more greatly improve adhesion to a substrate.

The repeating unit containing the phenolic hydroxyl group is preferably selected from repeating units b1 to b8 shown by the following general formulae (3), (3)

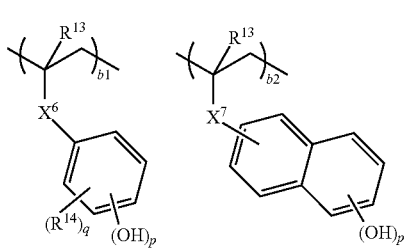

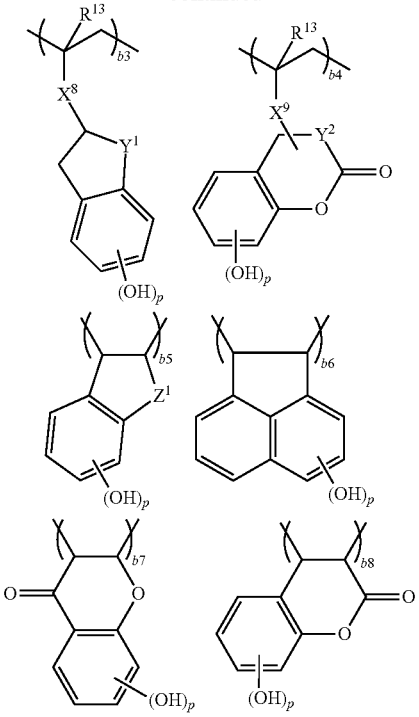

wherein $X^6$ and $X^7$ represent a single bond, —C(=O)—O—$R^{15}$—, or —C(=O)—NH—; $X^8$ and $X^9$ represent —C(=O)—O—$R^{15}$—, where $R^{15}$ represents a single bond or a linear, branched or cyclic alkylene group having 1 to 10 carbon atoms; $R^{14}$ represents a cyano group, a nitro group, a halogen atom, or a linear, branched, or cyclic alkyl group, alkoxy group, acyl group, acyloxy group, or alkoxycarbonyl group having 1 to 5 carbon atoms; $R^{13}$ may be the same or different and represents a hydrogen atom or a methyl group; $Y^1$ and $Y^2$ represent a methylene group or an ethylene group; $Z^1$ represents a methylene group, an oxygen atom, or a sulfur atom; "p" represents 1 or 2; "q" represents an integer of 0 to 4; and b1 to b8 satisfy $0 \leq b1 < 1.0$, $0 \leq b2 < 1.0$, $0 \leq b3 < 1.0$, $0 \leq b4 < 1.0$, $0 \leq b5 < 1.0$, $0 \leq b6 < 1.0$, $0 \leq b7 < 1.0$, $0 \leq b8 < 1.0$, and $0 < b1+b2+b3+b4+b5+b6+b7+b8 < 1.0$.

Such a repeating unit has an sensitizing effect when the composition is exposed to electron beam or EUV.

The polymer compound is preferably further copolymerized with one or more repeating units selected from repeating units c1 to c5 shown by the following general formulae (4), (4)

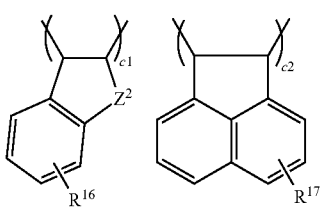

-continued

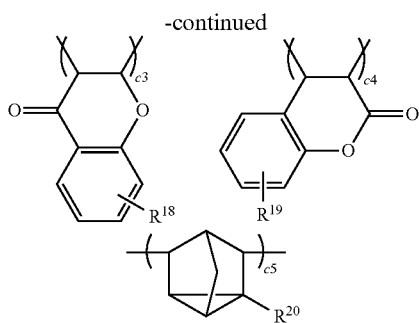

wherein $R^{16}$ to $R^{20}$ each represent a hydrogen atom, an alkyl group having 1 to 30 carbon atoms, an alkyl group partially or wholly substituted with a halogen atom, an alkoxy group, an alkanoyl group, an alkoxycarbonyl group, an aryl group having 6 to 10 carbon atoms, a halogen atom, or a 1,1,1,3,3,3-hexafluoro-2-propanol group; $Z^2$ represents a methylene group, an oxygen atom, or a sulfur atom; and c1 to c5 satisfy $0 \le c1 < 1.0$, $0 \le c2 < 1.0$, $0 \le c3 < 1.0$, $0 \le c4 < 1.0$, $0 \le c5 < 1.0$, and $0 < c1+c2+c3+c4+c5 < 1.0$.

Such a polymer compound can improve the effect of the present invention.

The polymer compound is preferably further copolymerized with one or more repeating units selected from repeating units d1 to d3 each having a sulfonium salt, shown by the following general formulae (5),

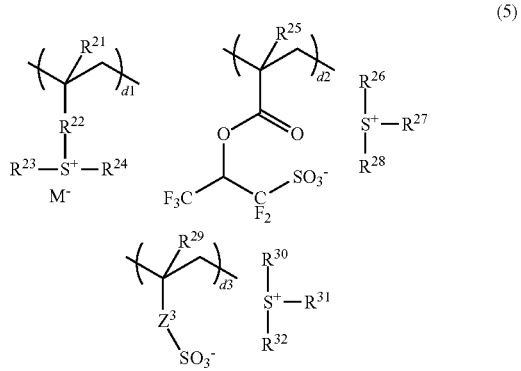

wherein $R^{21}$, $R^{25}$, and $R^{29}$ represent a hydrogen atom or a methyl group; $R^{22}$ represents a single bond, a phenylene group, —O—$R^{33}$—, or —C(=O)—Y—$R^{33}$—, where Y represents an oxygen atom or NH and $R^{33}$ represents a linear, branched, or cyclic alkylene group having 1 to 6 carbon atoms, an alkenylene group, or a phenylene group in which these groups may contain a carbonyl group, an ester group, an ether group, or a hydroxyl group; $R^{23}$, $R^{24}$, $R^{26}$, $R^{27}$, $R^{28}$, $R^{30}$, $R^{31}$, and $R^{32}$ may be the same or different and represent a linear, branched, or cyclic alkyl group having 1 to 12 carbon atoms and optionally containing a carbonyl group, an ester group, or an ether group, an aryl group having 6 to 12 carbon atoms, an aralkyl group having 7 to 20 carbon atoms, or a thiophenyl group; $Z^3$ represents a single bond, a methylene group, an ethylene group, a phenylene group, a fluorinated phenylene group, —O—$R^{34}$—, —C(=O)—O—$R^{34}$—, or —C(=O)—NH—$R^{34}$—, where $R^{34}$ represents a linear, branched, or cyclic alkylene group having 1 to 6 carbon atoms, an alkenylene group, or a phenylene group, in which these groups may contain a carbonyl group, an ester group, an ether group, or a hydroxyl group; M⁻ represents a non-nucleophilic counter ion; and d1, d2, and d3 satisfy $0 \le d1 \le 0.3$, $0 \le d2 \le 0.3$, $0 \le d3 \le 0.3$, and $0 < d1+d2+d3 \le 0.3$.

Such a polymer compound decreases acid diffusion and thus prevents the decrease in resolution due to blur by acid diffusion. Moreover, such a polymer compound allows an acid generator to disperse uniformly, thus improving edge roughness (LER, LWR).

The resist composition is preferably a chemically amplified resist composition further comprising an organic solvent and an acid generator.

The resist composition containing an organic solvent can improve its coating property with respect to a substrate or the like, for example. Moreover, the chemically amplified resist composition containing an acid generator to use acid catalyst reaction has high sensitivity and is excellent in various properties. Thus, such a composition is extremely useful.

The resist composition preferably further comprises either or both of a basic compound and a surfactant as an additive(s).

Addition of a basic compound allows, for example, acid diffusion rate in the resist film to be reduced, thus improving the resolution. Addition of a surfactant allows coating property of the resist composition to be improved or controlled.

Furthermore, the present invention provides a patterning process comprising the steps of applying the above resist composition on a substrate; performing exposure with a high energy beam after heat treatment; and performing development with a developer.

When the inventive resist composition is used in the patterning process in this manner, good pattern profile and good edge roughness can be achieved after exposure.

It is preferred that the developer used in the patterning process be one or more of 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and a negative pattern be formed by the development.

In the present invention, a negative pattern can be formed by using such a developer.

It is preferred that the developer used in the patterning process be an alkali aqueous solution, and a positive pattern be formed by the development.

In the present invention, a positive pattern can be formed by using an alkali aqueous solution as the developer.

The high energy beam is preferably an i-beam with a wavelength of 364 nm, a KrF excimer laser beam with a wavelength of 248 nm, an ArF excimer laser beam with a wavelength of 193 nm, an EUV lithography with a wavelength of 13.5 nm, or an electron beam.

In the inventive patterning process, such beams can be used as the high energy beam.

The patterning process preferably further comprises post exposure baking under a condition that a moisture content is 10 g or more per kilogram of dry air, before the development.

Such a patterning process can reduce shrinkage of the resist film and increase the amount of the resist film remaining after development.

The inventive resist composition has extremely high dissolution contrast before and after exposure, can reduce the film shrinkage after PEB, and thus can prevent the deformation of an isolated trench pattern of a negative pattern after the organic solvent development. Moreover, this composition has high resolution, exposure margin, excellent process applicability, and can provide a good pattern profile with good edge roughness after exposure. In particular, this composition can control the acid diffusion rate and thus reduce coarse-dense size difference, as well as having excellent etching resistance. Therefore, the inventive resist composition is excellent in various properties and extremely useful for practical use. More specifically, this resist composition is extremely useful and suitable to a composition for forming a fine pattern for a photomask or VLSI, a composition for forming a pattern for KrF, ArF, electron beam (EB), or EUV exposure, particularly a chemically amplified resist composition.

DETAILED DESCRIPTION OF THE PREFERRED EMBODIMENTS

As mentioned above, there have been demanded a resist composition that can improve the dissolution contrast of a resist film and reduce the film shrinkage after PEB, and a patterning process using the same.

To reduce the film shrinkage after PEB, which causes deformation of an isolated pattern in negative pattern formation by the organic solvent development, the present inventors has considered using a polymer compound (polymer) that is substituted with an acid-labile group that can deprotect a large protective group having a high boiling point so as to prevent evaporation during PEB. Consequently, the inventors found that a polymer compound having a repeating unit, especially selected from (meth) acrylic acid and derivatives thereof, containing a tertiary carboxylic ester substituted with a steroid acid-labile group is very effectively used as a base resin of a resist composition, particularly a chemically amplified resist composition, thereby bringing the present invention to completion.

That is, the present invention provides a resist composition comprising a base resin composed of a polymer compound having a repeating unit in which a hydrogen atom of a carboxyl group is substituted with one or more acid-labile groups selected from groups shown by the following general formulae (1-1) to (1-5),

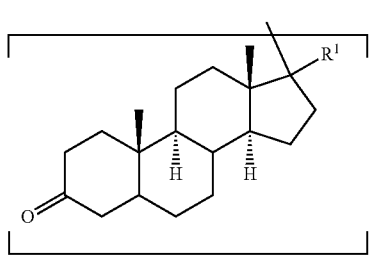
(1-1)

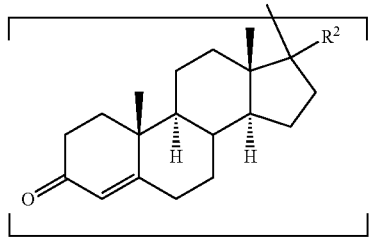
(1-2)

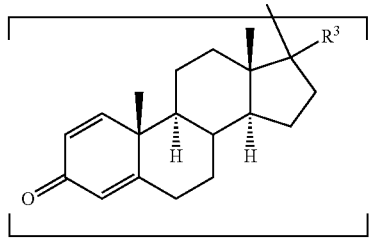
(1-3)

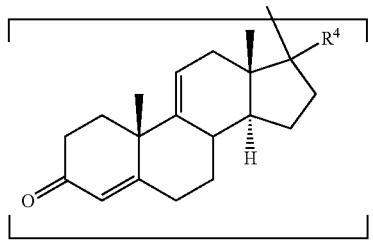
(1-4)

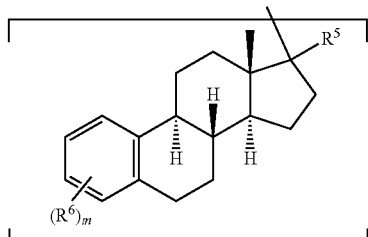
(1-5)

wherein $R^1$ to $R^5$ represent a linear, branched, or cyclic alkyl group having 1 to 4 carbon atoms, an alkenyl group having 2 to 4 carbon atoms, or an alkynyl group having 2 to 4 carbon atoms; $R^6$ represents a hydroxyl group or an alkoxy group or acyloxy group having 1 to 6 carbon atoms; and "m" represents 1 or 2.

Hereinafter, embodiments of the present invention will be described in more detail, but the present invention is not limited thereto.

[Polymer Compound]

The resist composition of the present invention contains, as a base resin, a polymer compound having a repeating unit (hereinafter, also referred to as "repeating unit a") in which a hydrogen atom of a carboxyl group is substituted with one or more acid-labile groups selected from groups shown by the following general formulae (1-1) to (1-5),

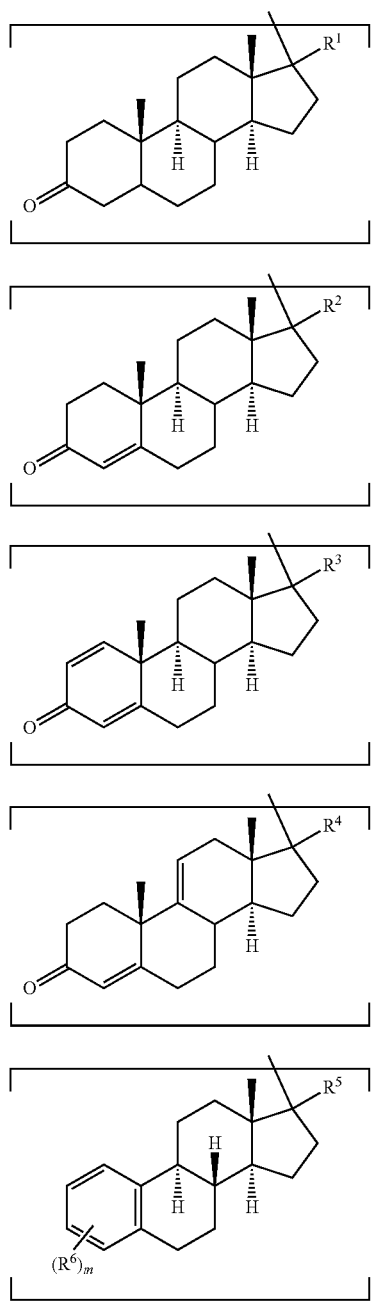

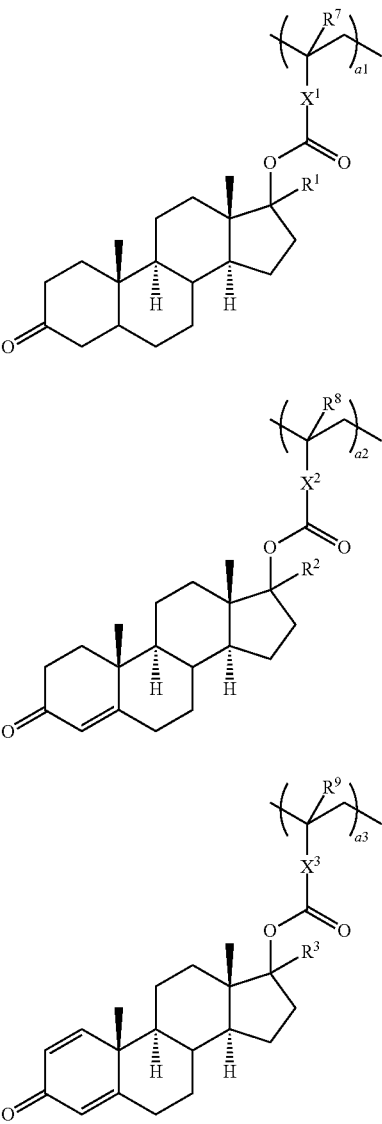

wherein $R^1$ to $R^5$ represent a linear, branched, or cyclic alkyl group having 1 to 4 carbon atoms, an alkenyl group having 2 to 4 carbon atoms, or an alkynyl group having 2 to 4 carbon atoms; $R^6$ represents a hydroxyl group or an alkoxy group or acyloxy group having 1 to 6 carbon atoms; and "m" represents 1 or 2.

The repeating unit substituted with the acid-labile group shown by the general formulae (1-1) to (1-5) is preferably (meth)acrylic acid or a derivative thereof (hereinafter, collectively referred to as (meth)acrylate) whose hydrogen atom of a carboxyl group is substituted. In particular, the inventive resist composition preferably contains a polymer compound that has one or more repeating units selected from repeating units a1 to a5 shown by the following general formulae (2-1) to (2-5) with a weight average molecular weight ranging from 1,000 to 500,000,

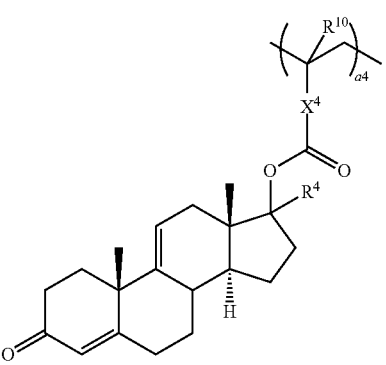

(2-5)

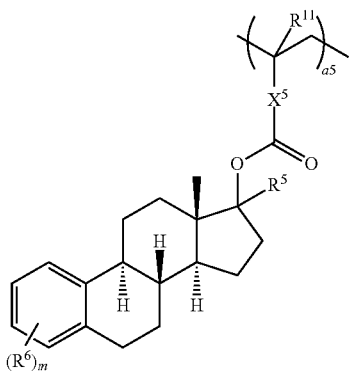

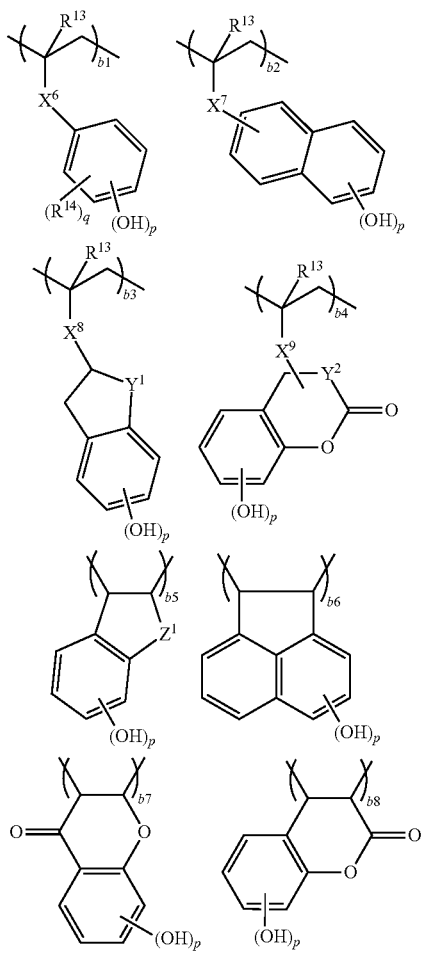

(3)

wherein $R^1$ to $R^6$ are as defined above; $X^1$ to $X^5$ represent a single bond or —C(=O)—O—$R^{12}$— where $R^{12}$ represents a linear, branched, or cyclic alkylene group having 1 to 10 carbon atoms and optionally containing an ester group, an ether group, or a lactone ring; $R^7$ to $R^{11}$ represent a hydrogen atom or a methyl group; a1 to a5 satisfy $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, and $0 < a1+a2+a3+a4+a5 \leq 1.0$.

Illustrative examples of $R^1$ to $R^5$ include a methyl group, an ethyl group, a n-propyl group, an isopropyl group, a n-butyl group, an isobutyl group, a sec-butyl group, a tert-butyl group, a vinyl group, an allyl group, a 1-propenyl group, a 2-propenyl group, an ethynyl group, a 1-propynyl group, and a 2-propynyl group.

When $R^6$ is an alkoxy group or an acyloxy group, the carbon number of $R^6$ is 1 to 6, preferably 1 to 4.

Illustrative examples of $R^{12}$ include a methylene group, an ethylene group, a propylene group, an isopropylene group, a cyclohexylene group, and an adamantylene group.

Examples of $R^{12}$ in the case of the alkylene group having 1 to 10 carbon atoms and containing a lactone ring include the following group.

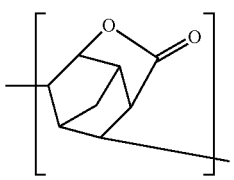

In the present invention, the polymer compound having the repeating unit substituted with the acid-labile groups shown by the general formulae (1-1) to (1-5) preferably has, in addition to (meth)acrylate repeating units a1 to a5 shown by the general formulae (2-1) to (2-5), one or more copolymerized repeating units b each containing an adhesion group selected from a hydroxyl group, a lactone ring, an ether group, an ester group, a carbonyl group, a cyano group, a sulfonate ester group, a sulfonamide group, cyclic —O—C(=O)—S—, and cyclic —O—C(=O)—NH—, with a content ratio of the repeating unit b of $0<b<1.0$. This repeating unit b preferably contains either or both of a phenolic hydroxyl group and a lactone ring.

In particular, the repeating unit b preferably contains a phenolic hydroxyl group, which has a sensitizing effect by electron beam exposure and EUV exposure. The repeating unit containing the phenolic hydroxyl group is preferably selected from repeating units b1 to b8 shown by the following general formulae (3), wherein $X^6$ and $X^7$ represent a single bond, —C(=O)—O—$R^{15}$—, or —C(=O)—NH—; $X^8$ and $X^9$ represent —C(=O)—O—$R^{15}$—, where $R^{15}$ represents a single bond or a linear, branched or cyclic alkylene group having 1 to 10 carbon atoms; $R^{14}$ represents a cyano group, a nitro group, a halogen atom, or a linear, branched, or cyclic alkyl group, alkoxy group, acyl group, acyloxy group, or alkoxycarbonyl group having 1 to 5 carbon atoms; $R^{13}$ may be the same or different and represents a hydrogen atom or a methyl group; $Y^1$ and $Y^2$ represent a methylene group or an ethylene group; $Z^1$ represents a methylene group, an oxygen atom, or a sulfur atom; "p" represents 1 or 2; "q" represents an integer of 0 to 4; and b1 to b8 satisfy $0 \leq b1<1.0$, $0 \leq b2<1.0$, $0 \leq b3<1.0$, $0 \leq b4<1.0$, $0 \leq b5<1.0$, $0 \leq b6<1.0$, $0 \leq b7<1.0$, $0 \leq b8<1.0$, and $0<b1+b2+b3+b4+b5+b6+b7+b8<1.0$.

Illustrative examples of monomers that can provide the repeating units b1 to b8 having the phenolic hydroxyl group include the following compounds.

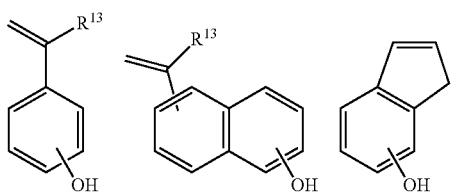

-continued

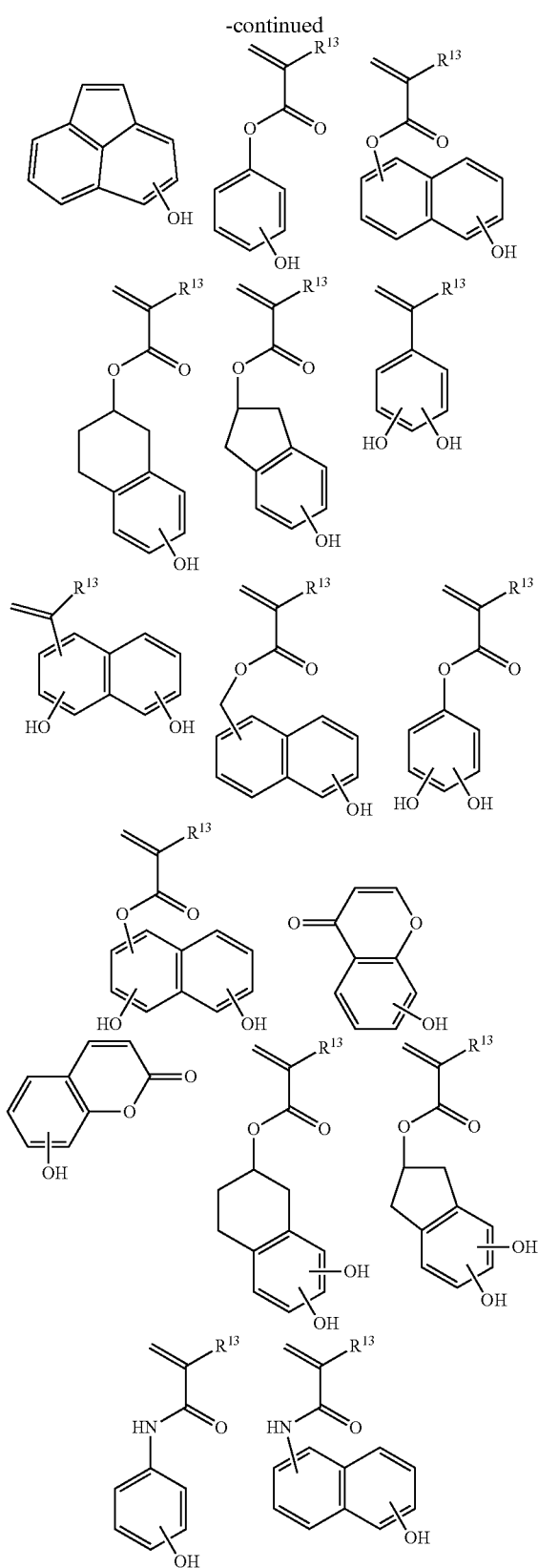

In the above formulae, R[13] is as defined above.

Illustrative examples of monomers that can provide the repeating unit b containing an adhesion group selected from a hydroxyl group other than the phenolic hydroxyl group, a lactone ring, an ether group, an ester group, a carbonyl group, a cyano group, a sulfonate ester group, a sulfonamide group, cyclic —O—C(=O)—S—, and cyclic —O—C(=O)—NH— include the following compounds.

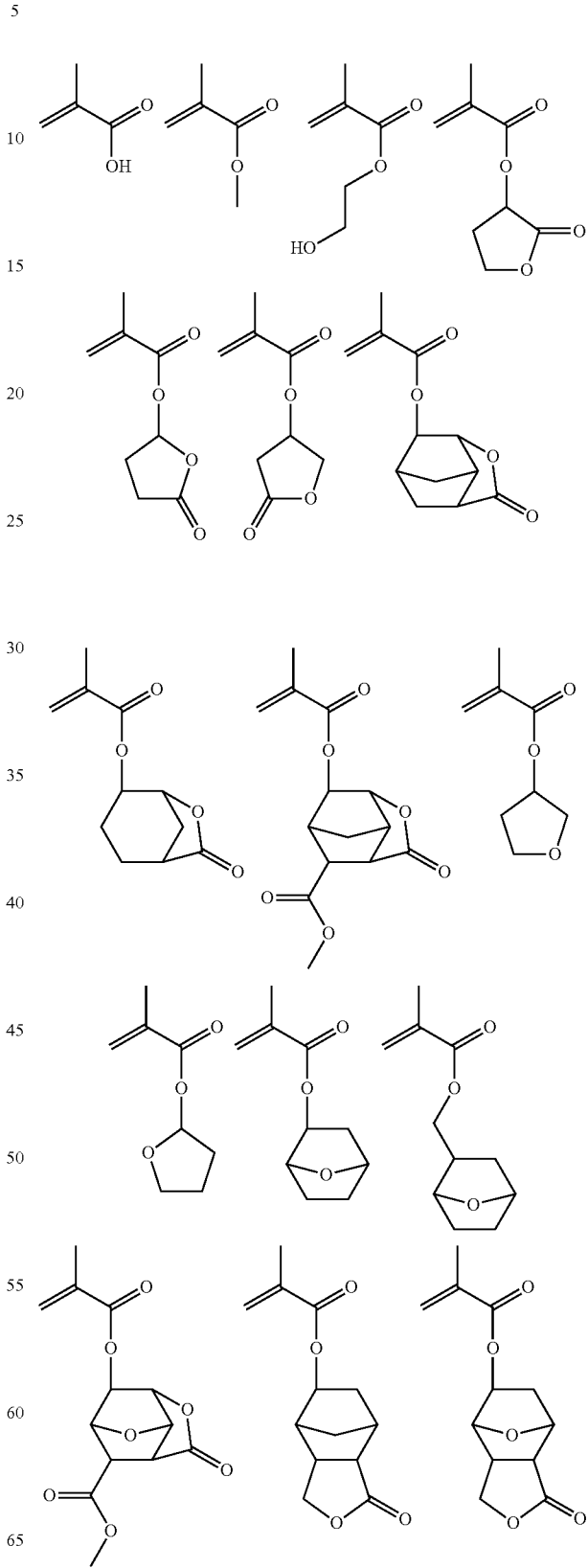

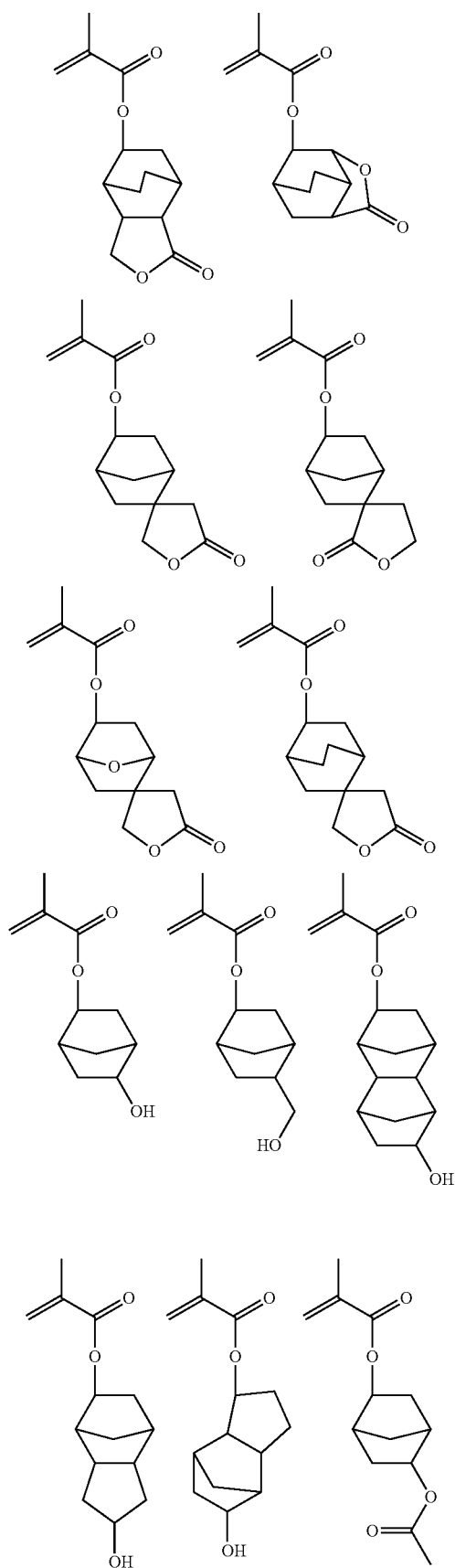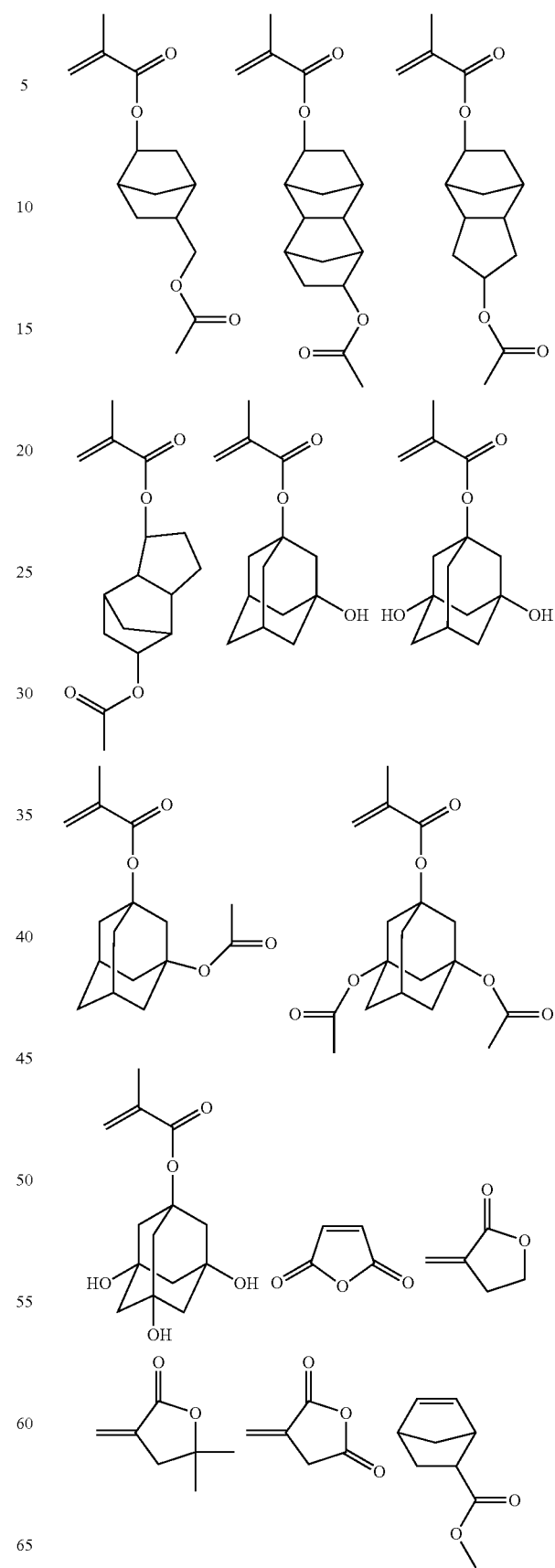

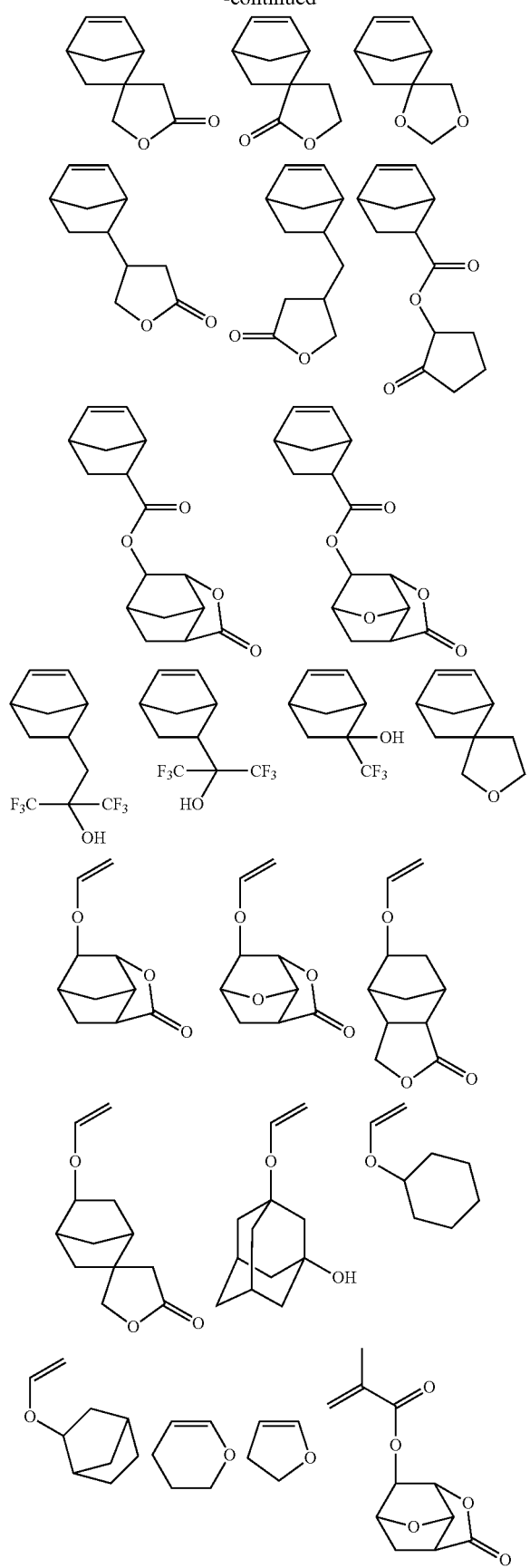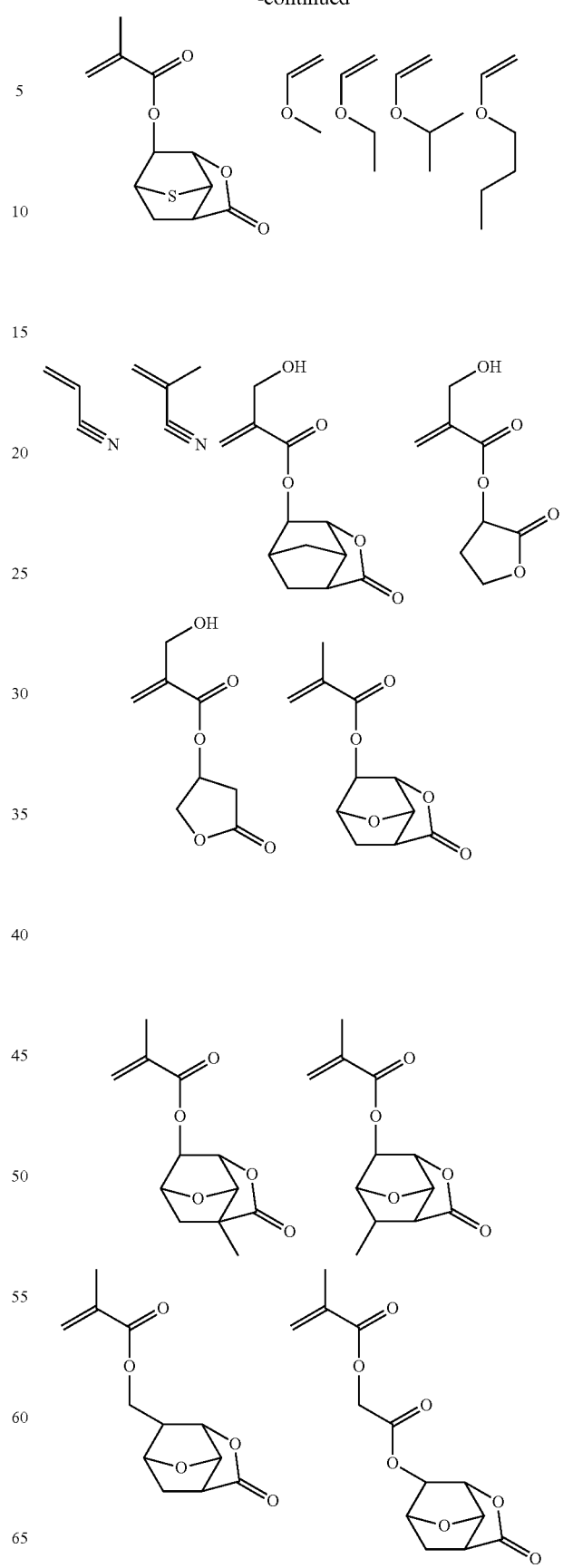

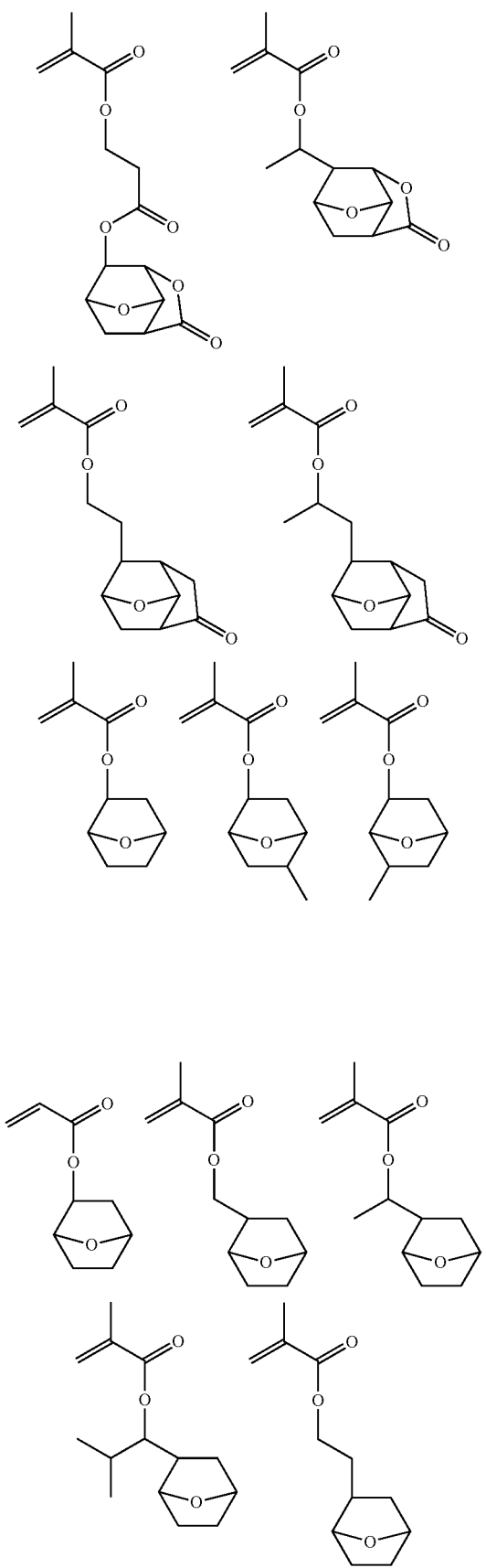
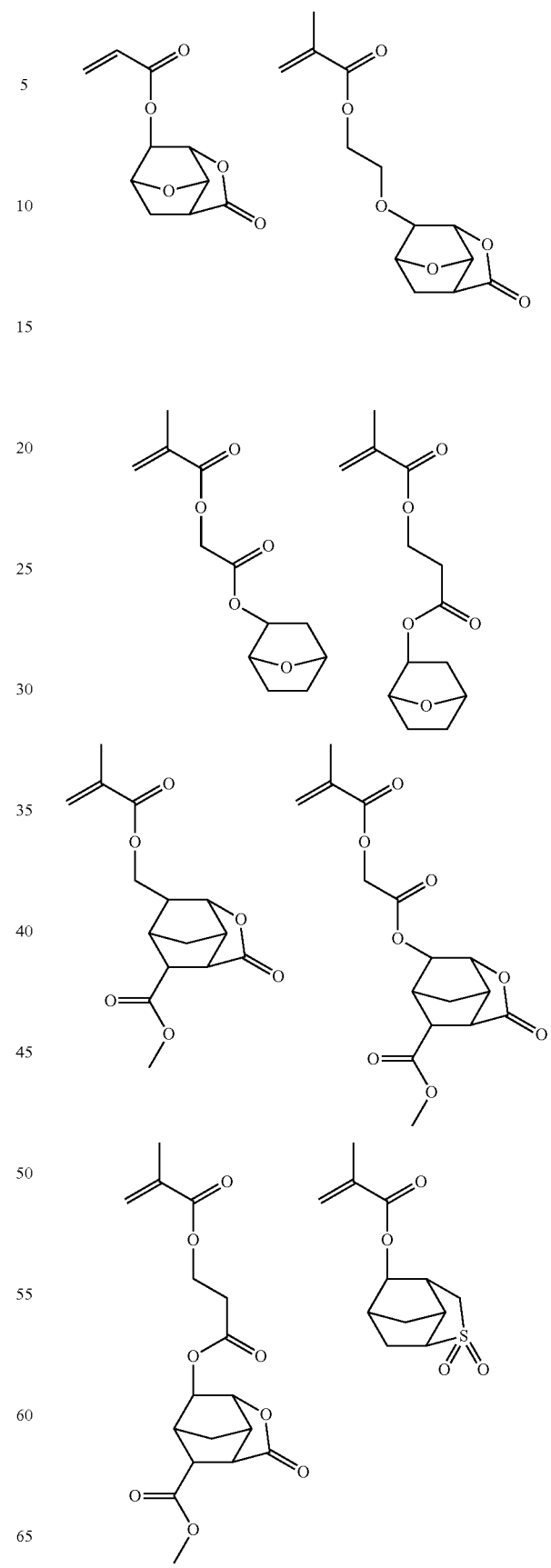

-continued
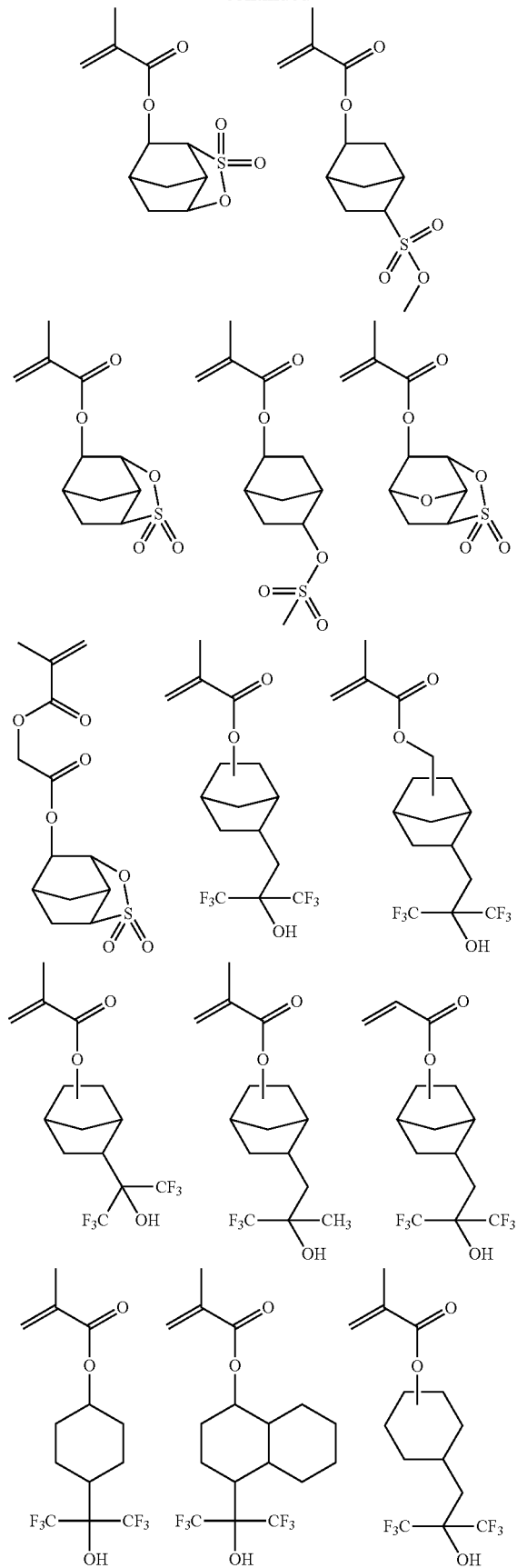
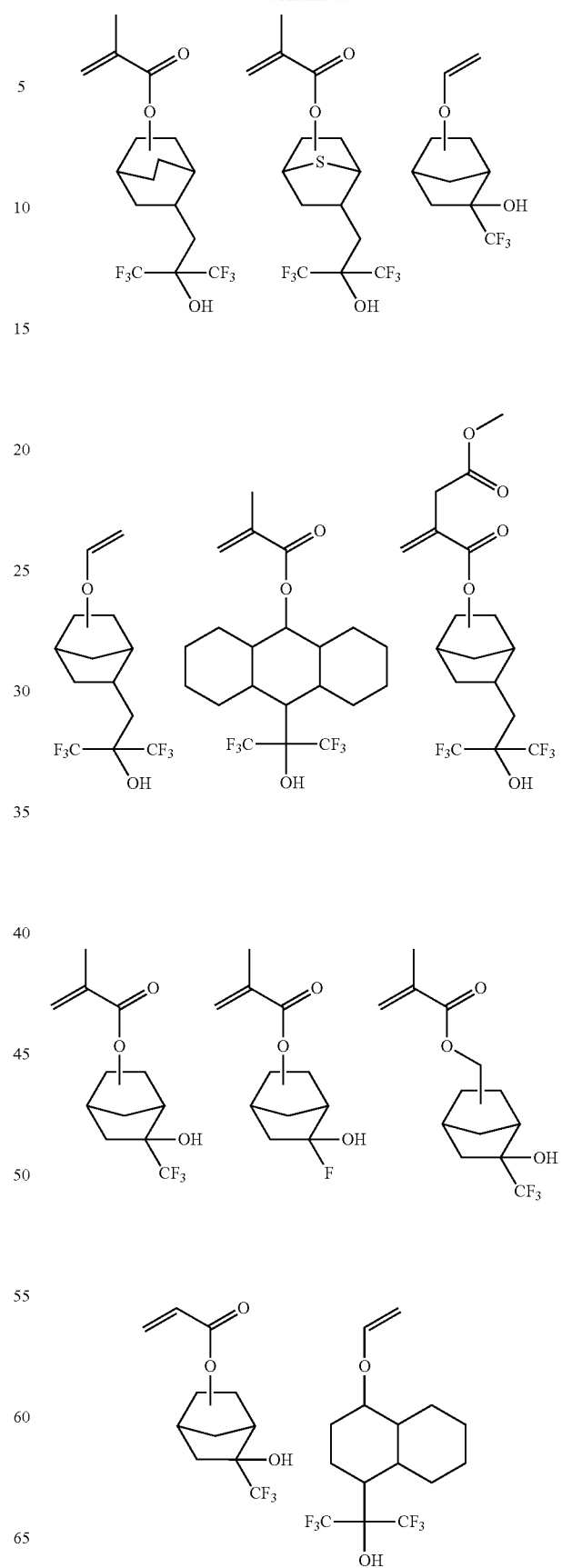

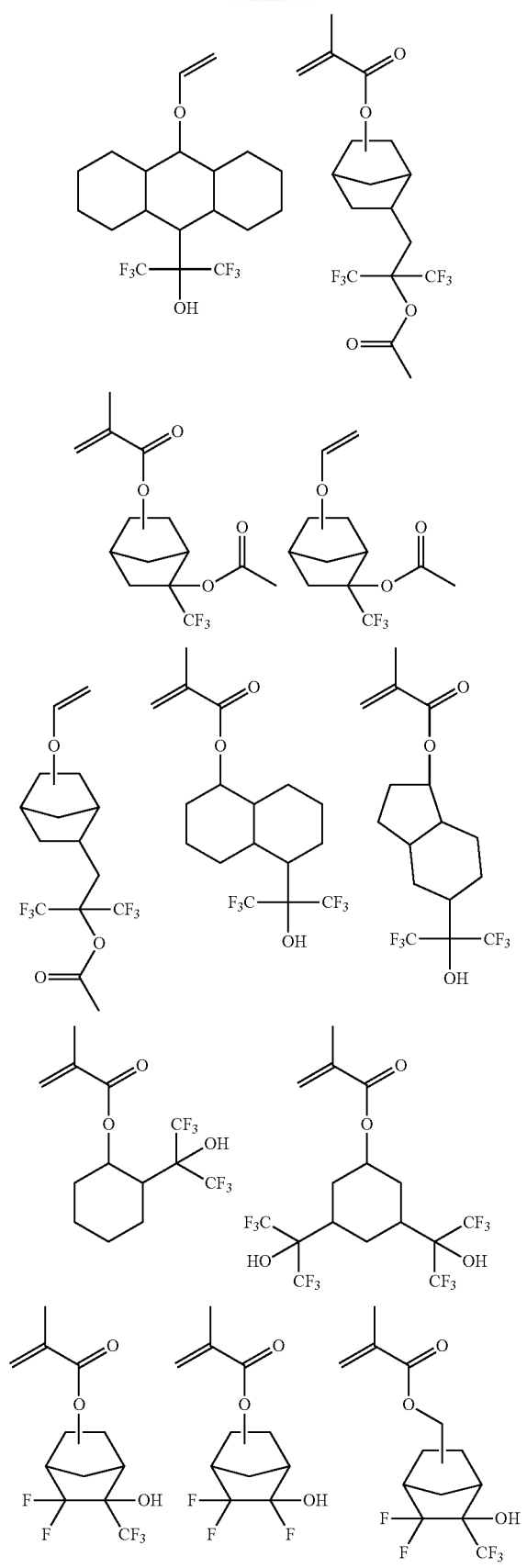
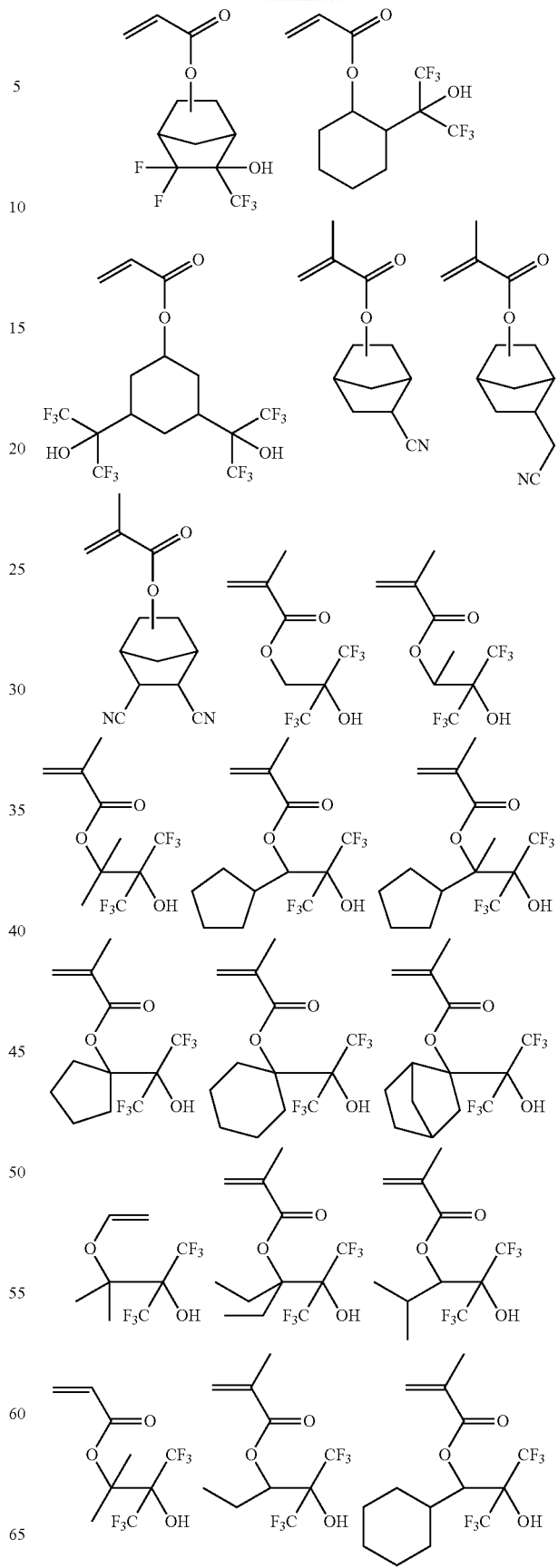

-continued
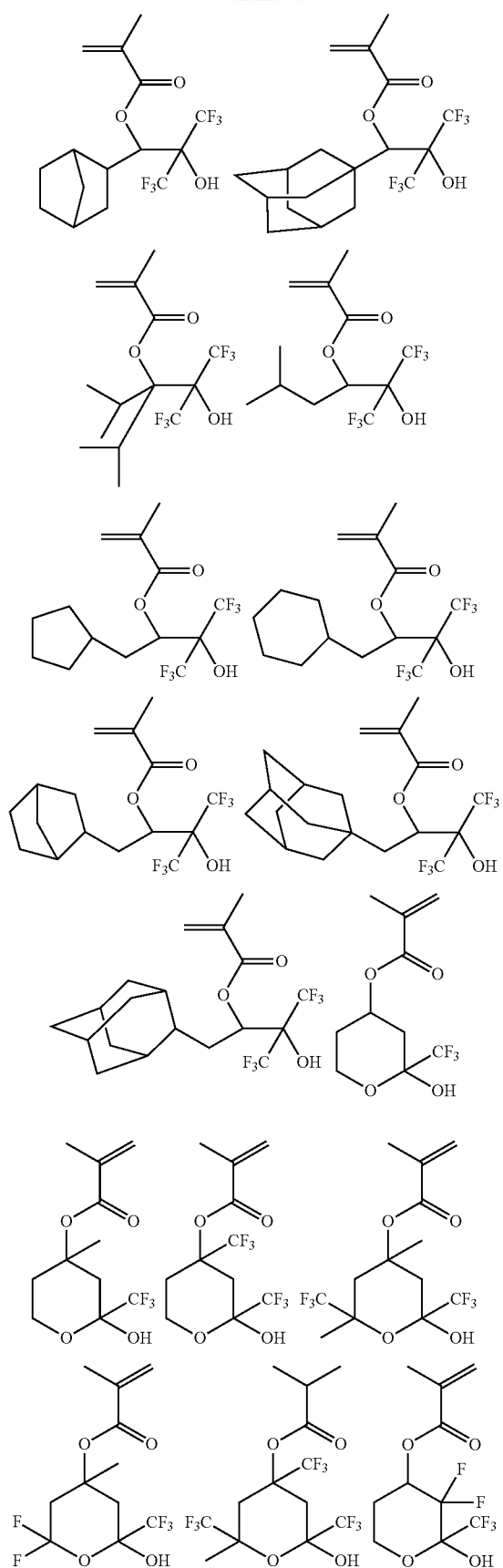
-continued
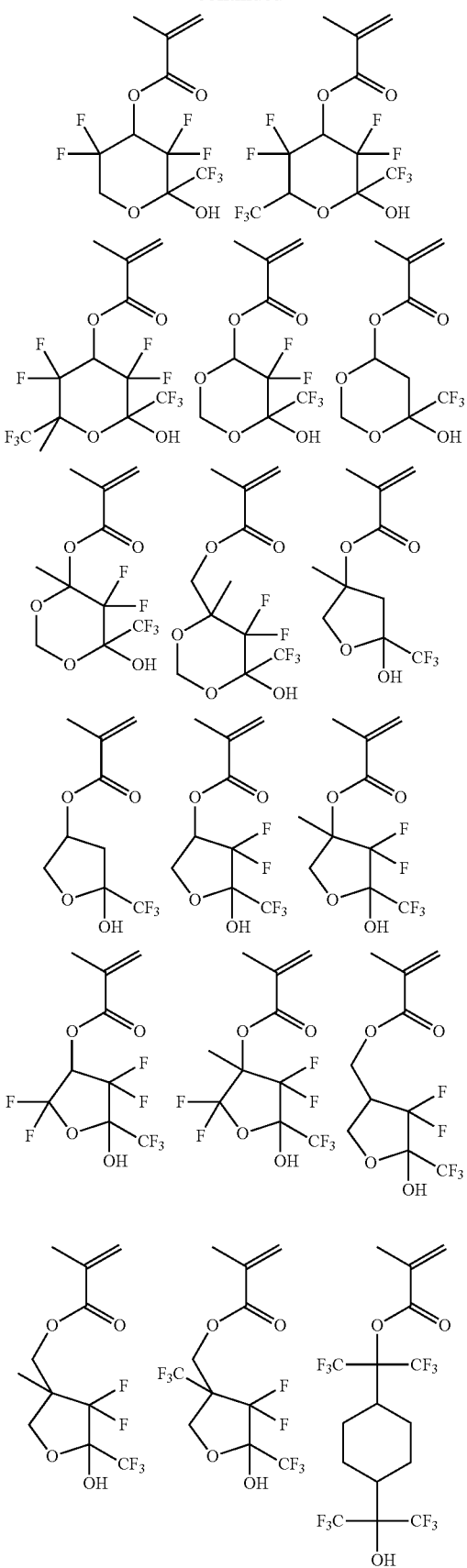

31
-continued
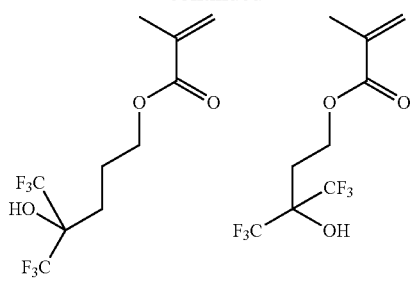
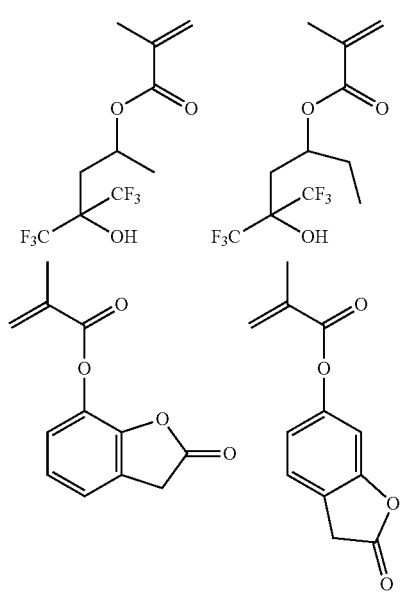
32
-continued
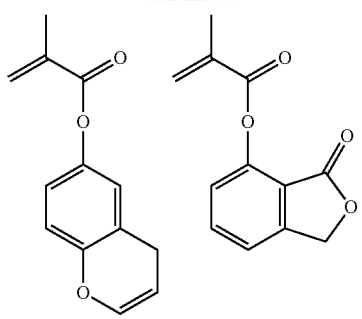
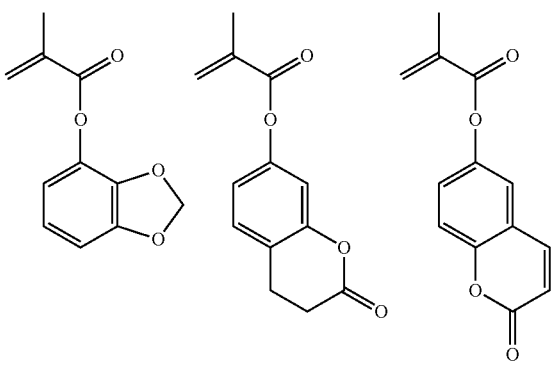
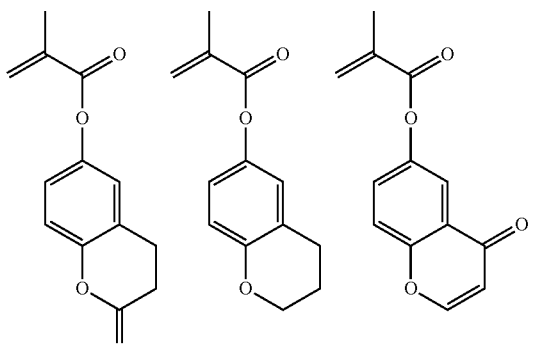
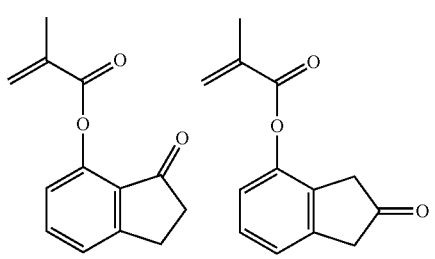
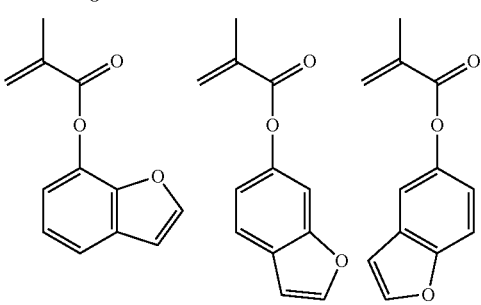
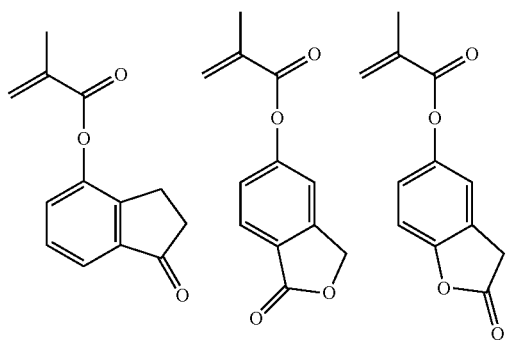
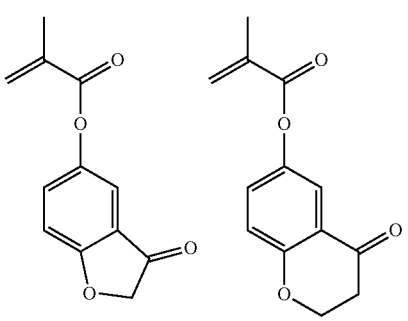

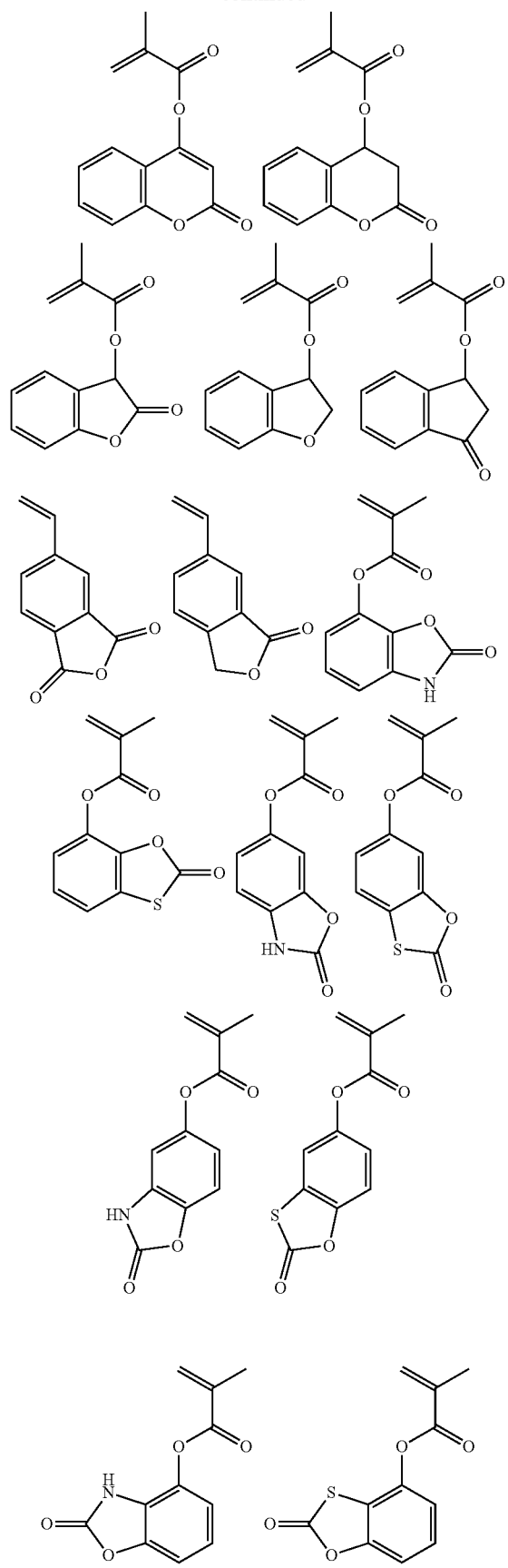
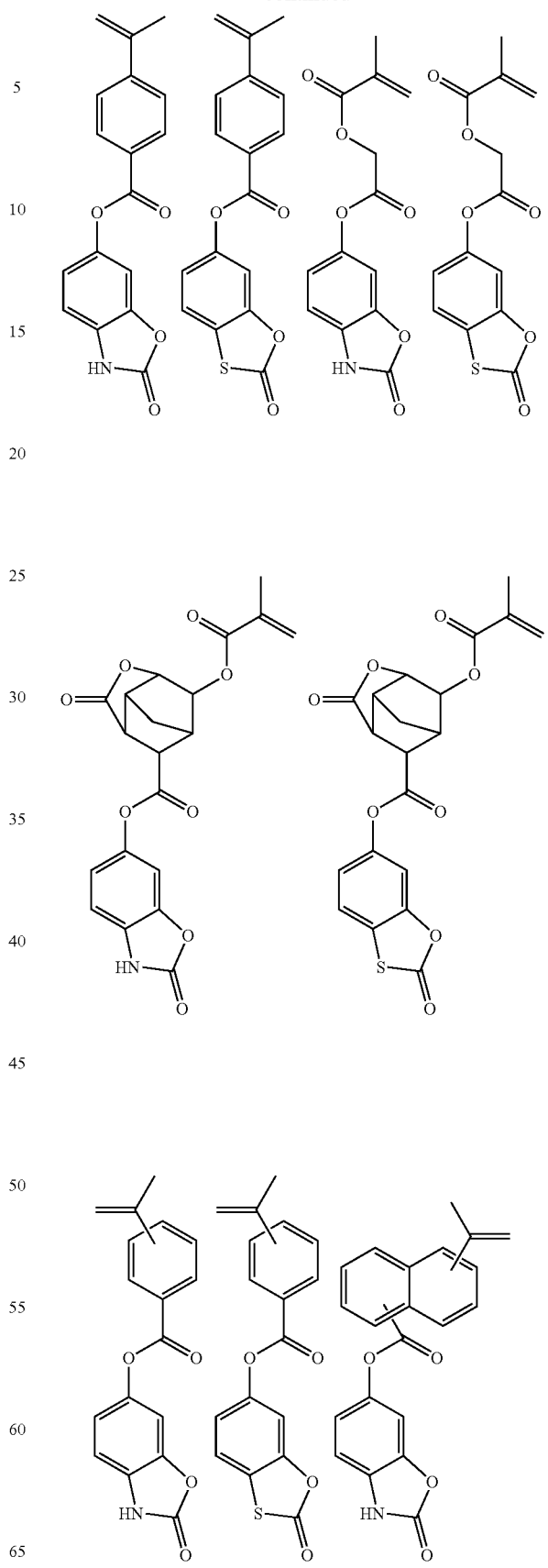

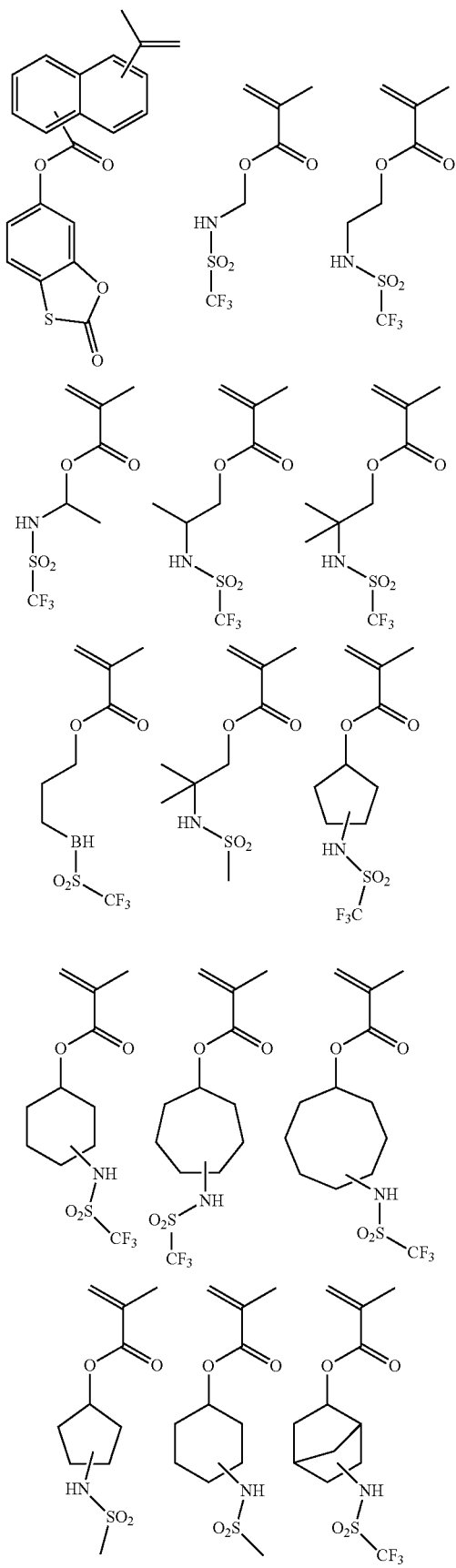
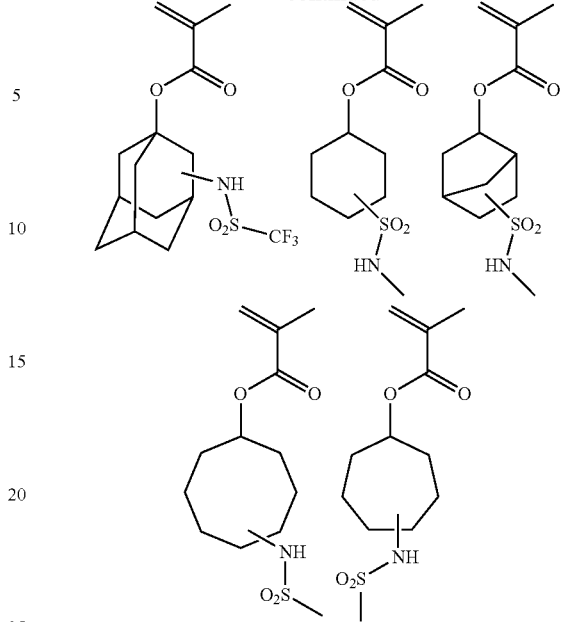

In the case that the monomer containing a hydroxyl group is used, the hydroxyl group may be substituted with acetal such as an ethoxyethoxy group, which easily deprotects by acid at polymerization, and then deprotected by weak acid and water after polymerization. Alternatively, the hydroxyl group may be substituted with an acetyl group, a formyl group, a pivaloyl group, or the like, and then subjected to alkaline hydrolysis after polymerization.

The polymer compound contained in the inventive resist composition may further copolymerized with one or more repeating units selected from repeating units c1 to c5 (indene, acenaphthylene, chromone, cumarine, norbornadiene, and derivatives thereof; hereinafter, the repeating units c1 to c5 also referred to as "repeating unit c") shown by the following general formulae (4).

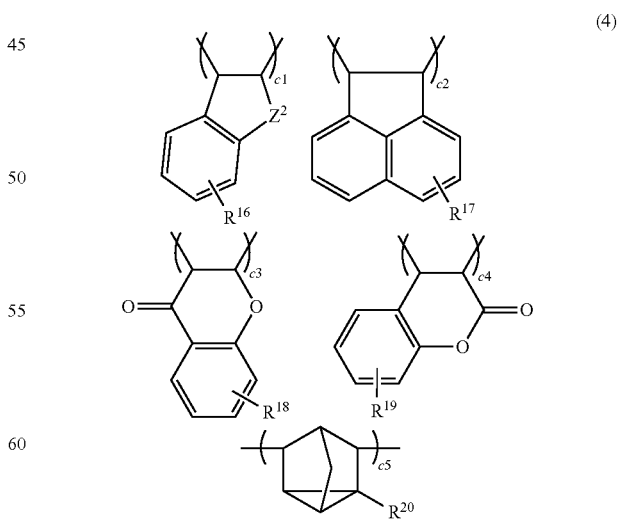

wherein $R^{16}$ to $R^{20}$ each represent a hydrogen atom, an alkyl group having 1 to 30 carbon atoms, an alkyl group partially or wholly substituted with a halogen atom, an alkoxy group, an alkanoyl group, an alkoxycarbonyl group, an aryl group having 6 to 10 carbon atoms, a halogen atom, or a 1,1,1,3,3,3-hexafluoro-2-propanol group; $Z^2$ represents a methylene group, an oxygen atom, or a sulfur atom; and c1 to c5 satisfy $0 \leq c1 < 1.0$, $0 \leq c2 < 1.0$, $0 \leq c3 < 1.0$, $0 \leq c4 < 1.0$, $0 \leq c5 < 1.0$, and $0 < c1+c2+c3+c4+c5 < 1.0$.

In this case, illustrative examples of monomers that can provide the repeating units c1 to c5 include the following compounds.

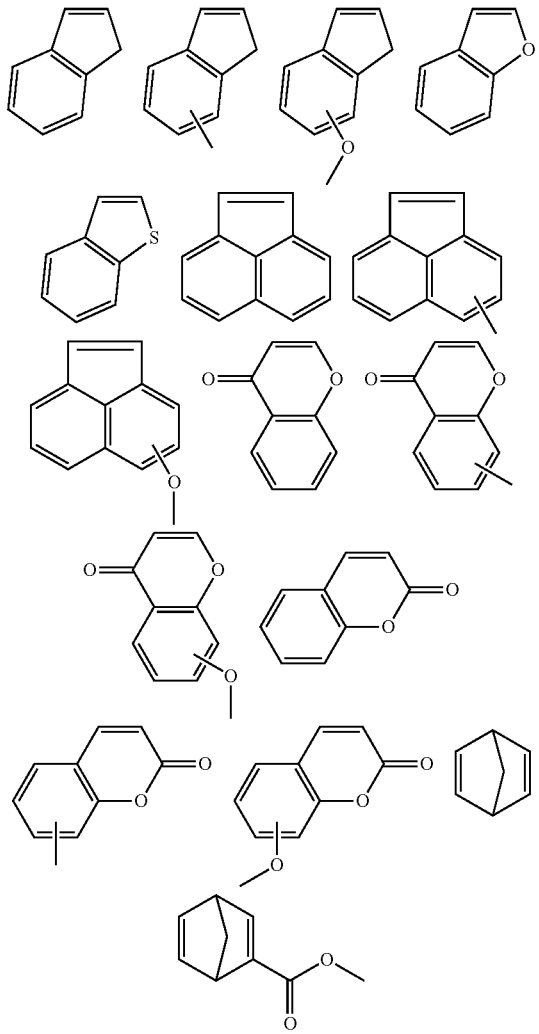

Acid generator d of an onium salt having polymerizable olefin may be further copolymerized therewith.

Japanese Patent Laid-Open Publication No. H04-230645, No. 2005-84365, and No. 2006-045311 propose a sulfonium salt and an iodonium salt having polymerizable olefin, capable of generating a specific sulfonic acid. In addition, Japanese Patent Laid-Open Publication No. 2006-178317 proposes a sulfonium salt in which sulfonic acid directly bonds to a main chain.

The polymer compound contained in the inventive resist composition is preferably further copolymerized with one or more repeating units selected from repeating units d1 to d3 each having a sulfonium salt, shown by the following general formulae (5),

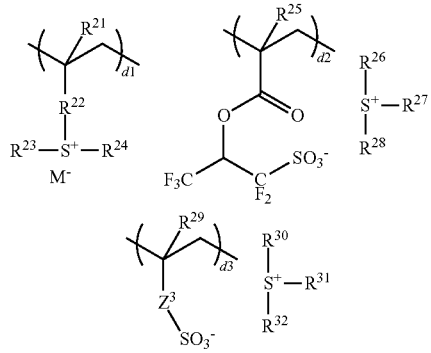

(5)

wherein $R^{21}$, $R^{25}$, and $R^{29}$ represent a hydrogen atom or a methyl group; $R^{22}$ represents a single bond, a phenylene group, —O—$R^{33}$—, or —C(=O)—Y—$R^{33}$—, where Y represents an oxygen atom or NH and $R^{33}$ represents a linear, branched, or cyclic alkylene group having 1 to 6 carbon atoms, an alkenylene group, or a phenylene group in which these groups may contain a carbonyl group, an ester group, an ether group, or a hydroxyl group; $R^{23}$, $R^{24}$, $R^{26}$, $R^{27}$, $R^{28}$, $R^{30}$, $R^{31}$, and $R^{32}$ may be the same or different and represent a linear, branched, or cyclic alkyl group having 1 to 12 carbon atoms and optionally containing a carbonyl group, an ester group, or an ether group, an aryl group having 6 to 12 carbon atoms, an aralkyl group having 7 to 20 carbon atoms, or a thiophenyl group; $Z^3$ represents a single bond, a methylene group, an ethylene group, a phenylene group, a fluorinated phenylene group, —O—$R^{34}$—, —C(=O)—O—$R^{34}$—, or —C(=O)—NH—$R^{34}$—, where $R^{34}$ represents a linear, branched, or cyclic alkylene group having 1 to 6 carbon atoms, an alkenylene group, or a phenylene group, in which these groups may contain a carbonyl group, an ester group, an ether group, or a hydroxyl group; $M^-$ represents a non-nucleophilic counter ion; and d1, d2, and d3 satisfy $0 \leq d1 \leq 0.3$, $0 \leq d2 \leq 0.3$, $0 \leq d3 \leq 0.3$, and $0 < d1+d2+d3 \leq 0.3$.

Examples of the non-nucleophilic counter ion M include halide ions such as chloride ion and bromide ion; fluoroalkylsulfonates such as triflate, 1,1,1-trifluoroethanesulfonate, and nonafluorobutanesulfonate; arylsulfonates such as tosylate, benzenesulfonate, 4-fluorobenzenesulfonate, and 1,2,3,4,5-pentafluorobenzenesulfonate; alkylsulfonates such as mesylate and butanesulfonate; imide acids such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

In this manner, an acid generator may bond to a main chain of the polymer (the polymer compound). This allows acid diffusion to be decreased, thus preventing the decrease in resolution due to blur by acid diffusion. Moreover, edge roughness (LER, LWR) can be improved by dispersing the acid generator uniformly.

The inventive resist composition requires containing the polymer compound having the repeating unit a, as a repeating unit containing an acid-labile group. In addition to this, the polymer compound may be further copolymerized with repeating unit e of (meth)acrylate substituted with an acid-labile group $R^{36}$ or repeating unit f of hydroxystyrene substituted with an acid-labile group $R^{38}$, shown by the following general formulae (7),

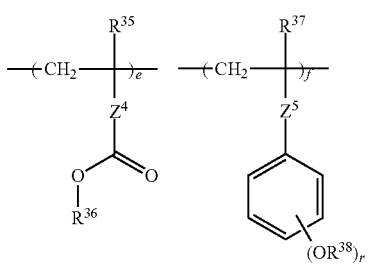

(7)

wherein $R^{35}$ and $R^{37}$ represent a hydrogen atom or a methyl group; $R^{36}$ and $R^{38}$ represent an acid-labile group other than the groups shown by the general formulae (1-1) to (1-5); $Z^4$ represents a single bond, a phenylene group, a naphthylene group, or —C(=O)—O—$R^{39}$—, where $R^{39}$ represents a linear, branched, or cyclic alkylene group having 1 to 10 carbon atoms and optionally containing an ester group, an ether group, or a lactone ring; $Z^5$ represents a single bond, an ester group, or an amido group; "r" represents 1 or 2; and "e" and "f" satisfy $0 \le e \le 0.5$ and $0 \le f \le 0.5$.

Examples of repeating unit g that can be copolymerized other than the repeating units a, b, c, d, e, and f include repeating units derived from styrene, vinylnaphthalene, vinylanthracene, vinylpyrene, and methyleneindane (The content ratio of the repeating unit g is $0 \le g \le 0.5$)

The acid-labile groups other than the groups shown by the general formulae (1-1) to (1-5) (the acid-labile groups shown by $R^{36}$ and $R^{38}$ in the general formula (7)) are variously selected and may be the same or different from each other. In particular, there may be mentioned the following groups shown by the general formulae (A-1) to (A-3).

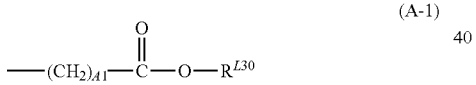

(A-1)

(A-2)

(A-3)

In the formula (A-1), $R^{L30}$ represents a tertiary alkyl group having 4 to 20, preferably 4 to 15 carbon atoms, a trialkylsilyl group containing alkyl groups having 1 to 6 carbon atoms, an oxoalkyl group having 4 to 20 carbon atoms, or a group shown by the formula (A-3). Illustrative examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group; illustrative examples of the trialkylsilyl group include a trimethylsilyl group, a triethylsilyl group, and a dimethyl-tert-butylsilyl group; and illustrative examples of the oxoalkyl group include a 3-oxocyclohexyl group, a 4-methyl-2-oxooxan-4-yl group, and a 5-methyl-2-oxooxolan-5-yl group. A1 is an integer of 0 to 6.

Illustrative examples of the acid-labile group of the formula (A-1) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Other examples thereof include substituents shown by the formulae (A-1)-1 to (A-1)-10.

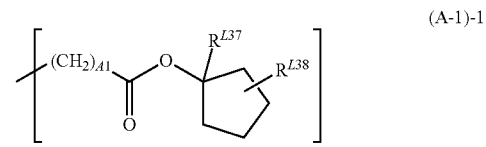

(A-1)-1

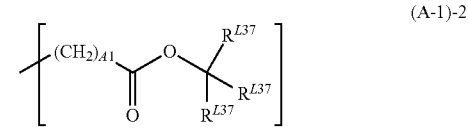

(A-1)-2

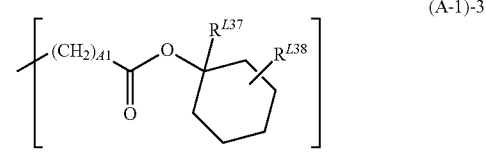

(A-1)-3

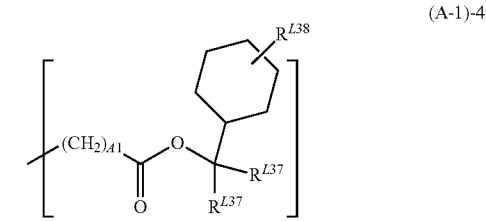

(A-1)-4

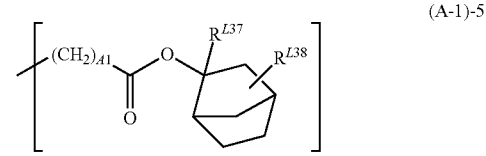

(A-1)-5

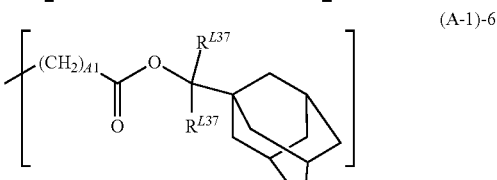

(A-1)-6

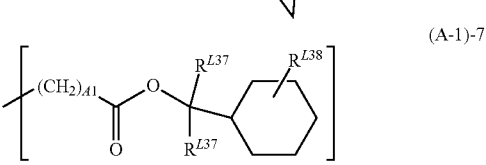

(A-1)-7

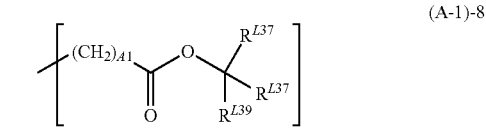

(A-1)-8

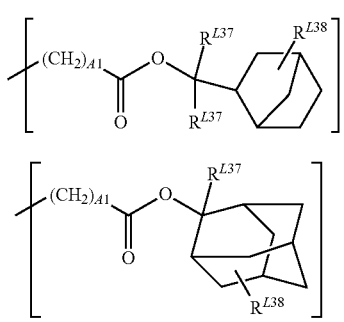

(A-1)-9

(A-1)-10

In the above formulae, each $R^{L37}$ may be the same or different, and represents a linear, branched, or cyclic alkyl group having 1 to 10 carbon atoms or an aryl group having 6 to 20 carbon atoms, and $R^{L38}$ represents a hydrogen atom or a linear, branched, or cyclic alkyl group having 1 to 10 carbon atoms.

Each $R^{L39}$ may be the same or different, and represents a linear, branched, or cyclic alkyl group having 2 to 10 carbon atoms or an aryl group having 6 to 20 carbon atoms.

A1 is as defined above.

In the formula (A-2), $R^{L31}$ and $R^{L32}$ represent a hydrogen atom or a linear, branched, or cyclic alkyl group having 1 to 18, preferably 1 to 10 carbon atoms. Illustrative examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group.

$R^{L33}$ represents a monovalent hydrocarbon group having 1 to 18, preferably 1 to 10 carbon atoms, and optionally containing a heteroatom such as an oxygen atom. For example, there may be mentioned a linear, branched, or cyclic alkyl group and a group in which a part of hydrogen atoms in these groups is substituted with a hydroxyl group, an alkoxy group, an oxo group, an amino group, an alkylamino group, or the like. Illustrative examples thereof include the following substituted alkyl groups.

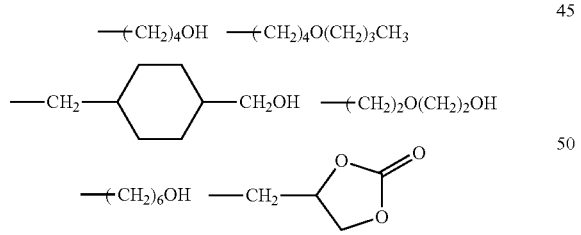

$R^{L31}$ and $R^{L32}$, $R^{L31}$ and $R^{L33}$, and $R^{L32}$ and $R^{L33}$ may be bonded to form a ring together with the carbon atoms to which these groups are bonded; and when the ring is formed, $R^{L31}$, $R^{L32}$, and $R^{L33}$ that participate in the ring formation each represent a linear or branched alkylene group having 1 to 18, preferably 1 to 10 carbon atoms. The carbon number in the ring is preferably 3 to 10, particularly preferably 4 to 10.

Among the acid-labile groups shown by the formula (A-2), illustrative examples of the linear or branched one include groups of the following formulae (A-2)-1 to (A-2)-35.

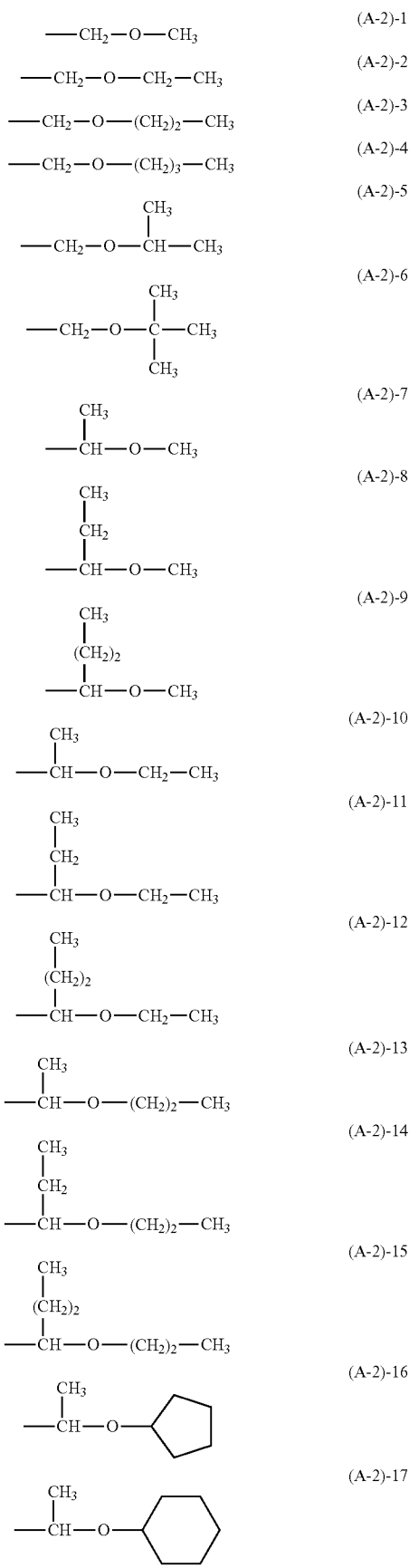

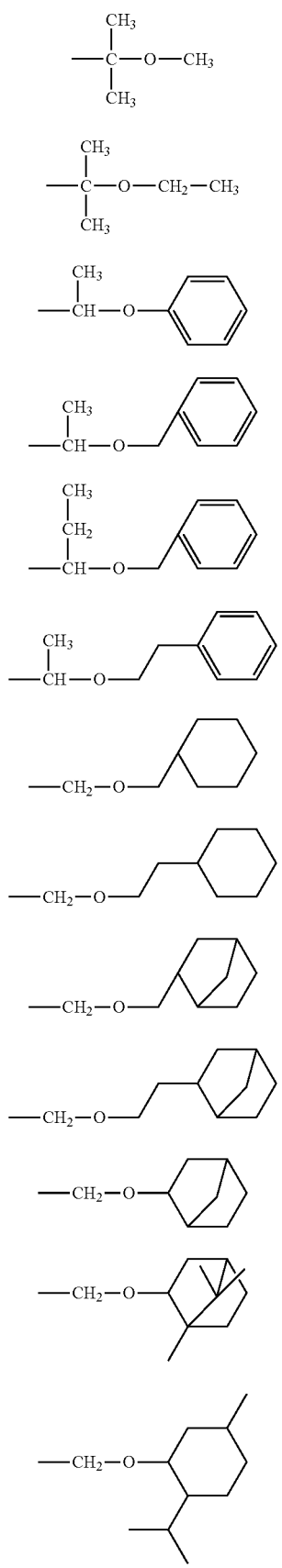

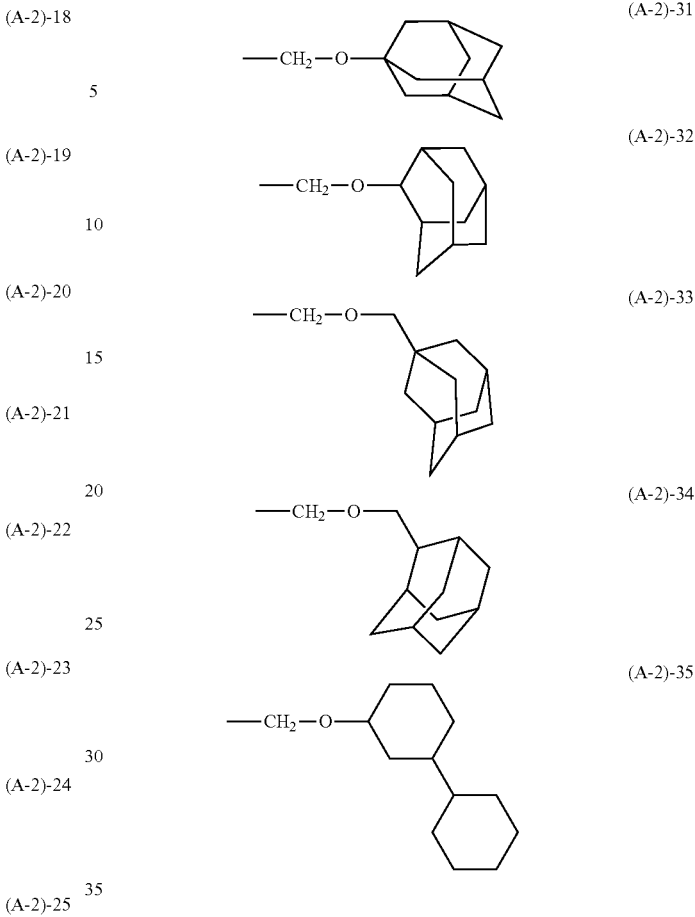

Among the acid-labile groups shown by the formula (A-2), illustrative examples of the cyclic one include a tetrahydrofuran-2-yl group, a 2-methyltetrahydrofuran-2-yl group, a tetrahydropyran-2-yl group, and a 2-methyltetrahydropyran-2-yl group.

The base resin may be linked through an acid-labile group shown by the general formula (A-2a) or (A-2b) to form intermolecular or intramolecular crosslinking.

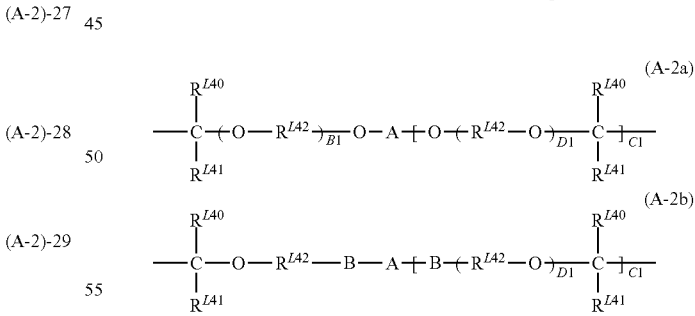

In the above formulae, $R^{L40}$ and $R^{L41}$ represent a hydrogen atom or a linear, branched, or cyclic alkyl group having 1 to 8 carbon atoms. Alternatively, $R^{L40}$ and $R^{L41}$ may be bonded to form a ring together with the carbon atoms to which these groups are bonded; and when the ring is formed, $R^{L40}$ and $R^{L41}$, which participate in the ring formation, represent a linear or branched alkylene group having 1 to 8 carbon atoms. $R^{L42}$ represents a linear, branched, or cyclic alkylene group having 1 to 10 carbon atoms; B1 and D1 represent an integer of 0 to 10, preferably 0 to 5; and C1 represents an integer of 1 to 7. "A" represents an aliphatic or alicyclic saturated hydrocarbon group, an aromatic hydrocarbon group, or a heterocyclic group having 1 to 50 carbon atoms with a valency of (C1+1), in which these groups may contain a heteroatom, or a part of hydrogen atoms bonding to the carbon atom may be substituted with a hydroxyl group, a carboxyl group, a carbonyl group, or a fluorine atom. "B" represents —C(=O)—O—, —NH—C(=O)—O—, or —NH—C(=O)—NH—.

In this case, "A" is preferably a linear, branched, or cyclic alkylene group, alkyltriyl group, alkyltetrayl group having 2 to 4 valency and 1 to 20 carbon atoms, or an arylene group having 6 to 30 carbon atoms, in which these groups may contain a heteroatom, or a part of hydrogen atoms bonding to the carbon atom may be substituted with a hydroxyl group, a carboxyl group, an acyl group, or a halogen atom. C1 is preferably an integer of 1 to 3.

Illustrative examples of the crosslinking acetal group shown by the general formulae (A-2a) and (A-2b) include groups of the following formulae (A-2)-36 to (A-2)-43.

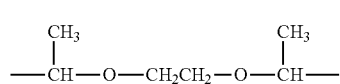
(A-2)-36

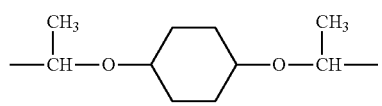
(A-2)-37

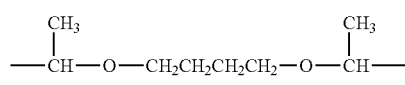
(A-2)-38

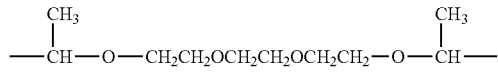
(A-2)-39

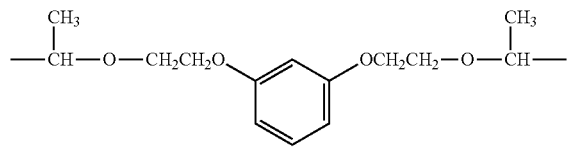
(A-2)-40

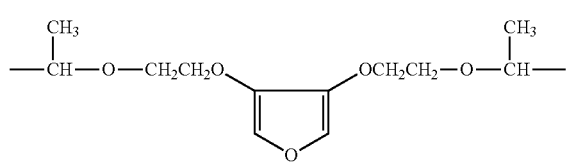
(A-2)-41

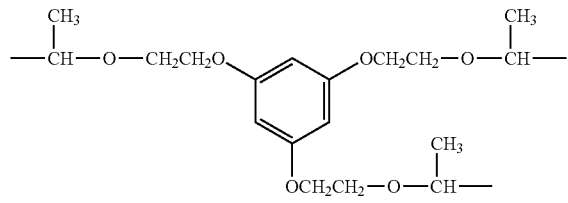
(A-2)-42

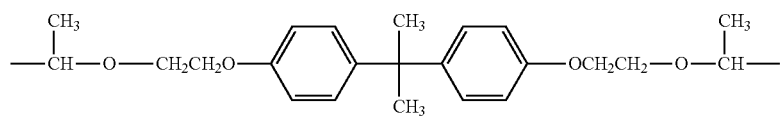
(A-2)-43

In the formula (A-3), $R^{L34}$, $R^{L35}$, and $R^{L36}$ represent a monovalent hydrocarbon group such as a linear, branched, or cyclic alkyl group having 1 to 20 carbon atoms, optionally containing a heteroatom such as an oxygen atom, a sulfur atom, a nitrogen atom, and a fluorine atom. $R^{L34}$ and $R^{L35}$, $R^{L34}$ and $R^{L36}$, and $R^{L35}$ and $R^{L36}$ may be bonded to form a ring having 3 to 20 carbon atoms together with the carbon atoms to which these groups are bonded.

Illustrative examples of the tertiary alkyl group shown by the formula (A-3) include a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, and a tert-amyl group.

Other examples of the tertiary alkyl group include groups of the formulae (A-3)-1 to (A-3)-18.

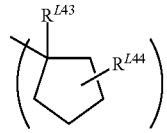
(A-3)-1

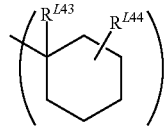
(A-3)-2

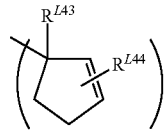
(A-3)-3

-continued

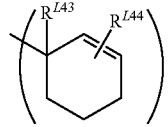
(A-3)-4

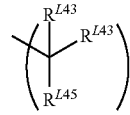
(A-3)-5

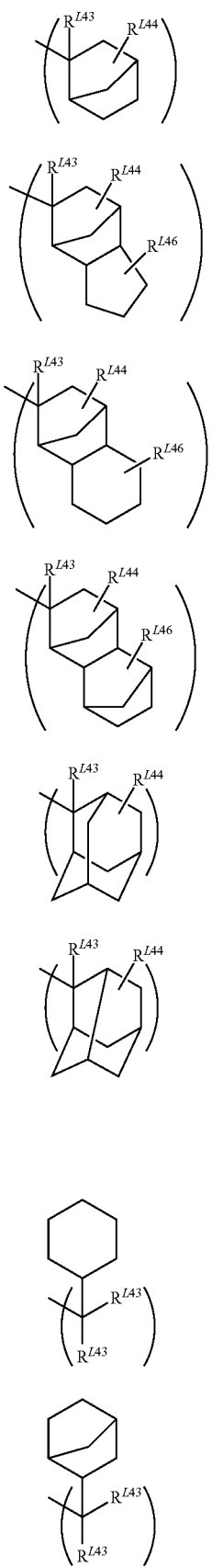
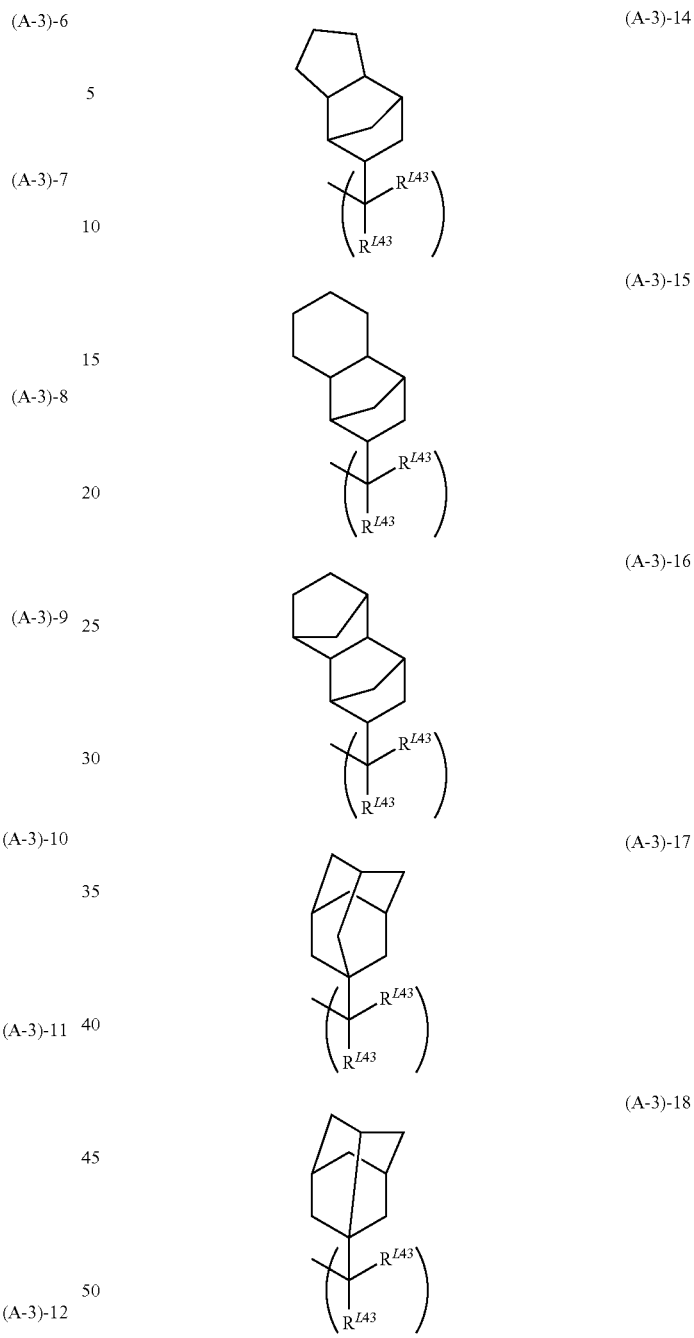

In the formulae (A-3)-1 to (A-3)-18, each $R^{L43}$ may be the same or different, and represents a linear, branched, or cyclic alkyl group having 1 to 8 carbon atoms, or an aryl group having 6 to 20 carbon atoms, such as a phenyl group and a naphthyl group. $R^{L44}$ and $R^{L46}$ represent a hydrogen atom or a linear, branched, or cyclic alkyl group having 1 to 20 carbon atoms. $R^{L45}$ represents an aryl group having 6 to 20 carbon atoms, such as a phenyl group.

Furthermore, as shown in the following formulae (A-3)-19 and (A-3)-20, the polymer may contain $R^{L47}$ which represents a group with two or more valency such as an alkylene group and an arylene group to form intermolecular or intramolecular crosslinking.

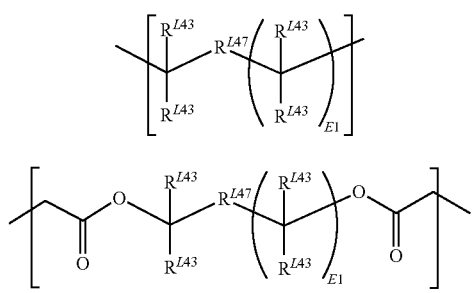

(A-3)-19

(A-3)-20

In the formulae (A-3)-19 and (A-3)-20, $R^{L43}$ is as defined above; $R^{47}$ represents a linear, branched, or cyclic alkylene group having 1 to 20 carbon atoms, or an arylene group such as a phenylene group, in which these group may contain a heteroatom such as an oxygen atom, a sulfur atom, and a nitrogen atom; and E1 represents an integer of 1 to 3.

Preferable examples of the repeating unit e in which a hydrogen atom of the carboxyl group is substituted with the acid-labile group shown by the formula (A-3) include a repeating unit of (meth)acrylate having the exo structure, shown by the formula (A-3)-21,

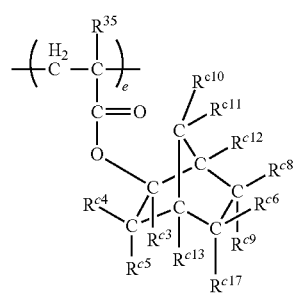

(A-3)-21 wherein $R^{35}$ and "e" are as defined above; $R^{c3}$ represents a linear, branched, or cyclic alkyl group having 1 to 8 carbon atoms, or an optionally substituted aryl group having 6 to 20 carbon atoms; $R^{c4}$ to $R^{c9}$, $R^{c12}$, and $R^{c13}$ independently represent a hydrogen atom or a monovalent hydrocarbon group having 1 to 15 carbon atoms and optionally containing a heteroatom; and $R^{c10}$ and $R^{c11}$ represent a hydrogen atom. $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$ may be bonded to form a ring, and in this case, the groups that participate in the ring formation represent a divalent hydrocarbon group having 1 to 15 carbon atoms and optionally containing a heteroatom. Alternatively, $R^{c4}$ and $R^{c13}$, $R^{c10}$ and $R^{c13}$, or $R^{c6}$ and $R^{c8}$ may be directly bonded to form a double bond between the groups bonding to adjacent carbons. Note that this formula also represents enantiomer.

Examples of an ester monomer that can provide the repeating unit having the exo structure shown by the formula (A-3)-21 are described in Japanese Patent Laid-Open Publication No. 2000-327633. Illustrative examples thereof are shown below, although it is not limited thereto.

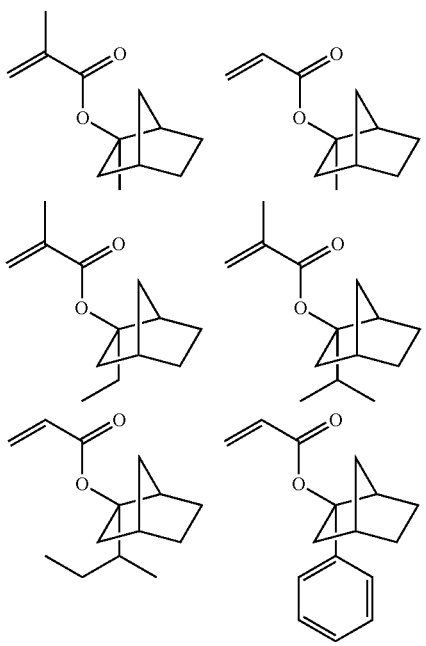

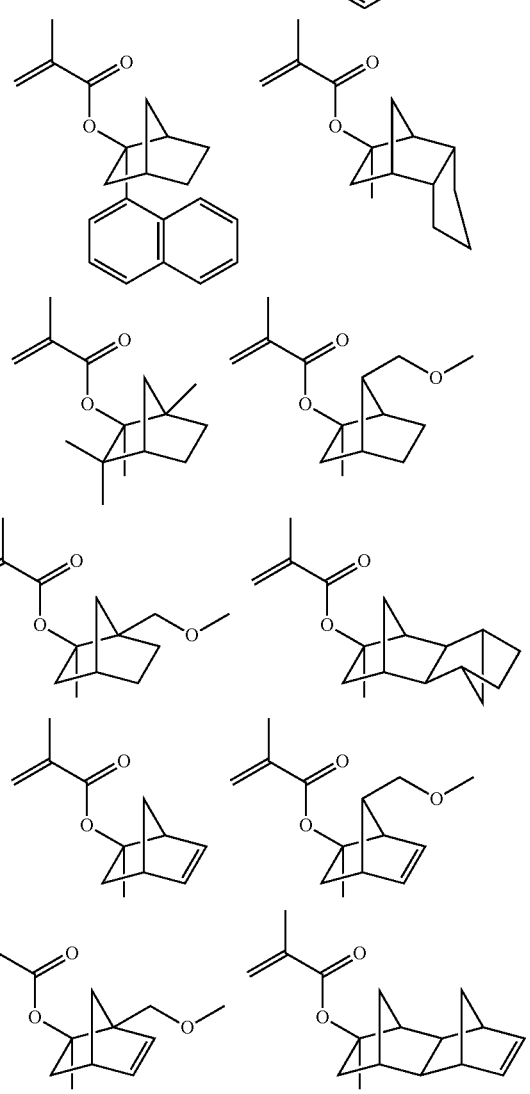

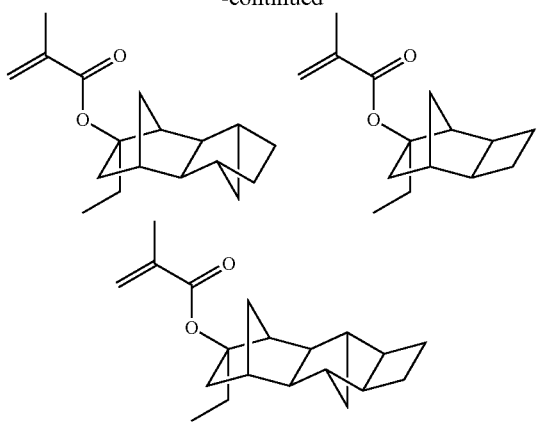

Other examples of the repeating unit e in which a hydrogen atom of the carboxyl group is substituted with the acid-labile group shown by the formula (A-3) include a repeating unit of (meth)acrylate having furandiyl, tetrahydrofurandiyl, or oxanorbornanediyl, shown by the formula (A-3)-22, (A-3)-22

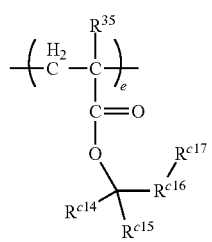

wherein $R^{35}$ and "e" are as defined above; $R^{c14}$ and $R^{c15}$ independently represent a linear, branched, or cyclic monovalent hydrocarbon group having 1 to 10 carbon atoms; $R^{c14}$ and $R^{c15}$ may be bonded to form an alicyclic hydrocarbon ring together with the carbon atoms to which these groups are bonded; $R^{c16}$ represents a divalent group selected from furandiyl, tetrahydrofurandiyl, or oxanorbornanediyl; and $R^{c17}$ represents a hydrogen atom or a linear, branched, or cyclic monovalent hydrocarbon group having 1 to 10 carbon atoms and optionally containing a heteroatom.

Illustrative examples of a monomer that can provide the repeating unit substituted with the acid-labile group having furandiyl, tetrahydrofurandiyl, or oxanorbornanediyl include the following compounds. In the following formulae, Ac and Me denote an acetyl group and a methyl group, respectively.

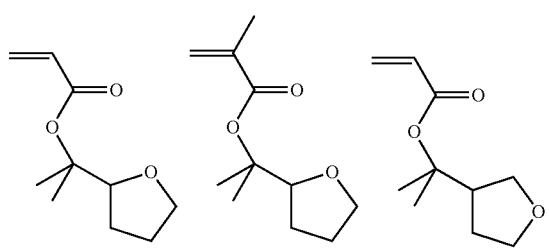

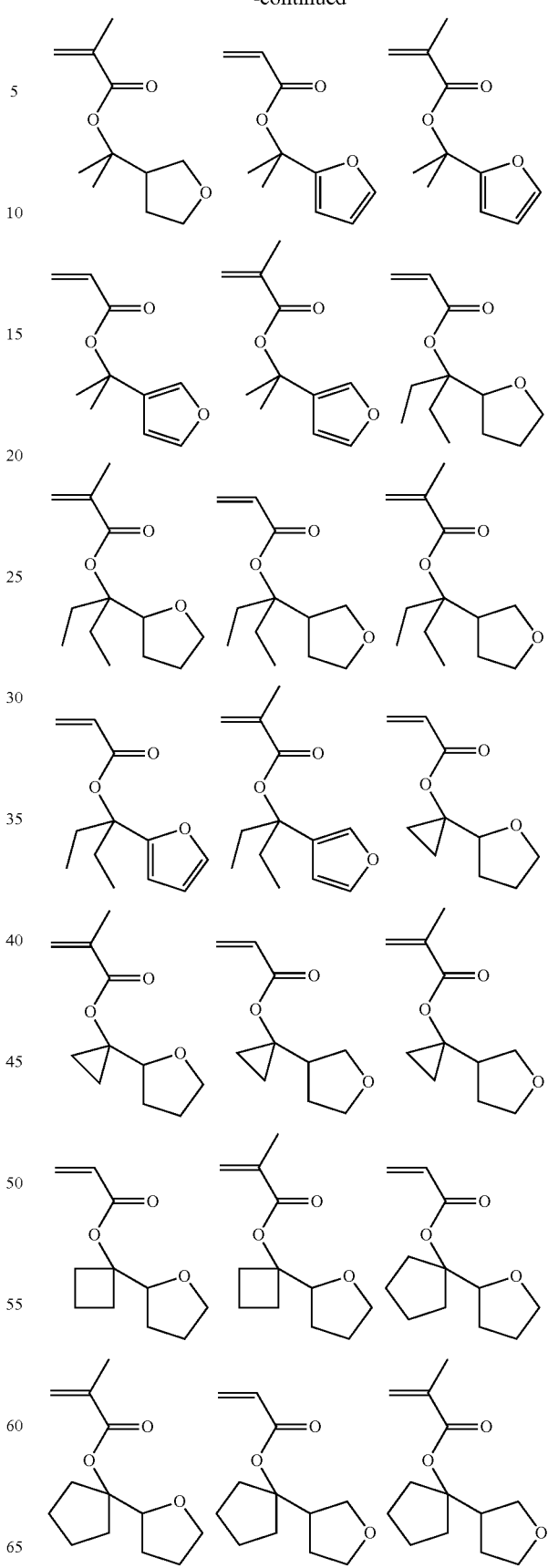

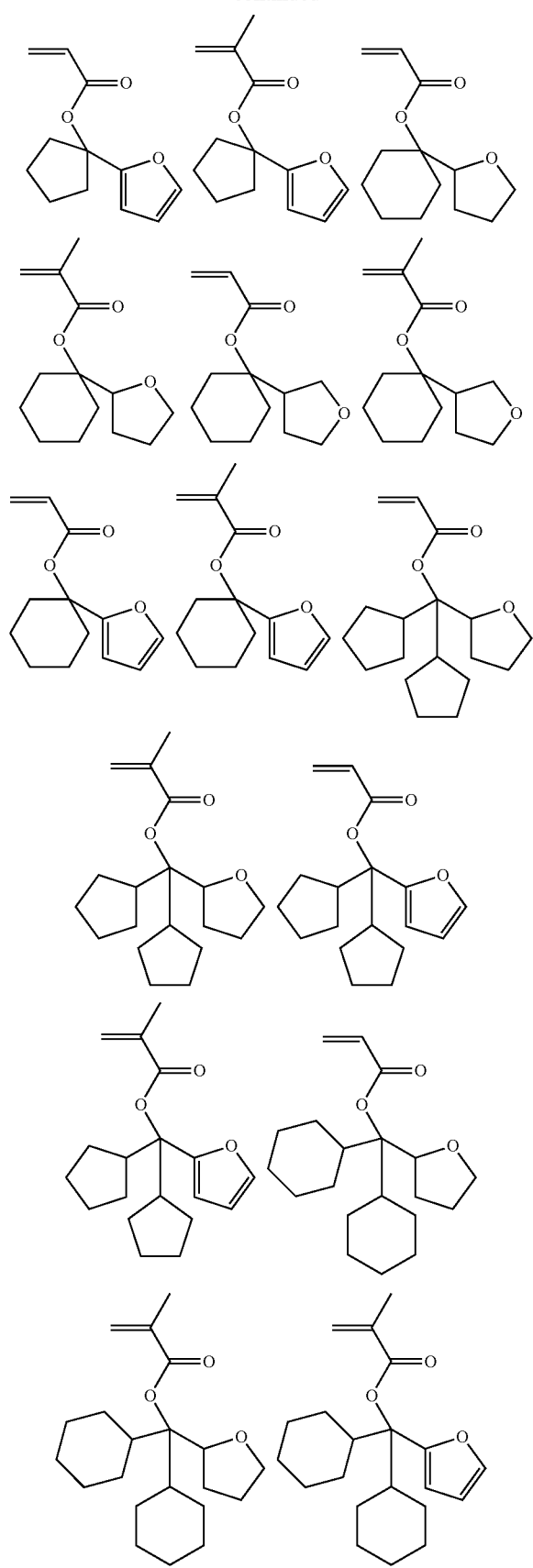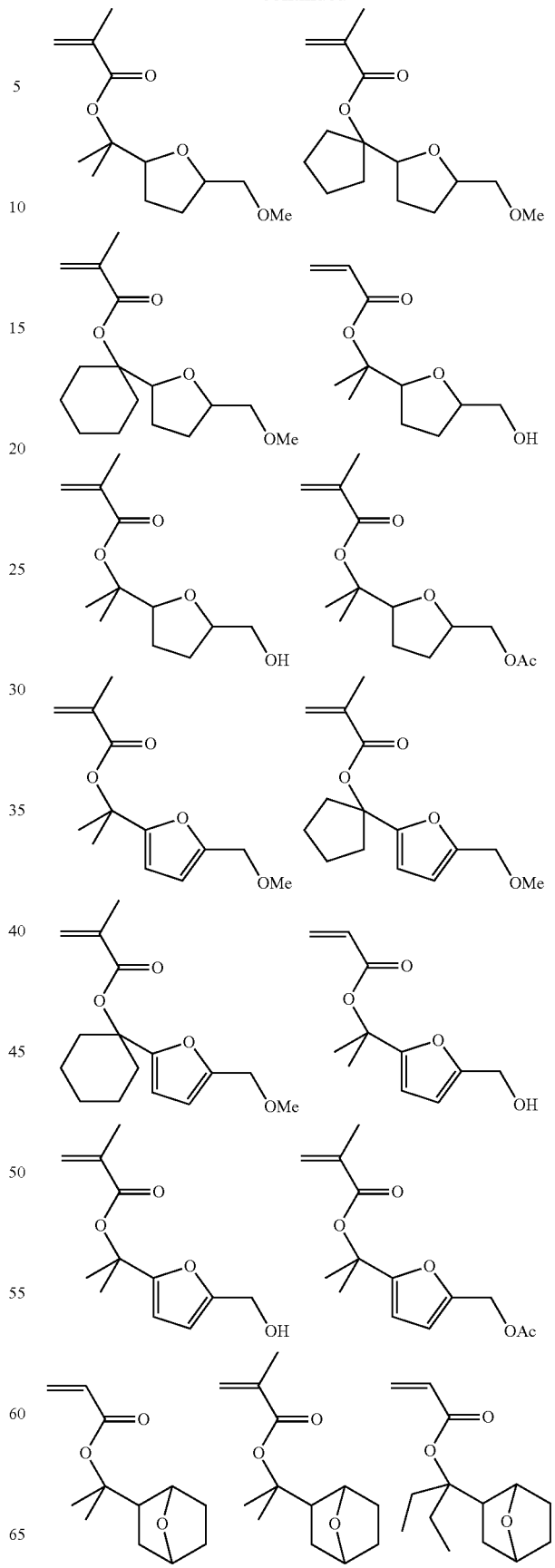

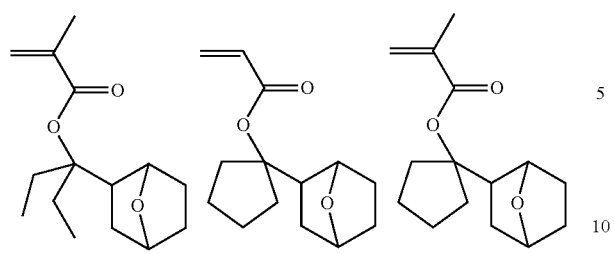
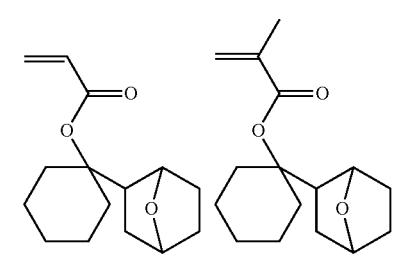
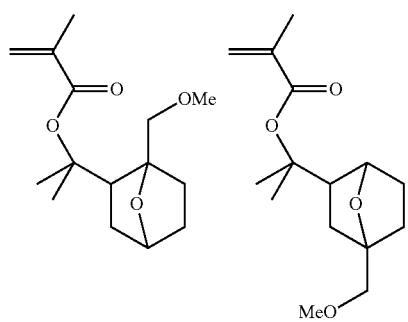
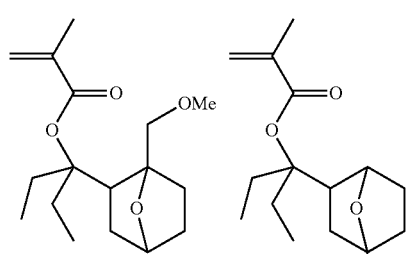
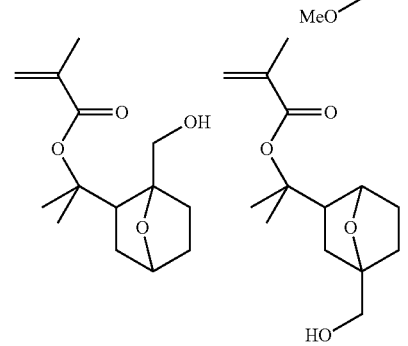
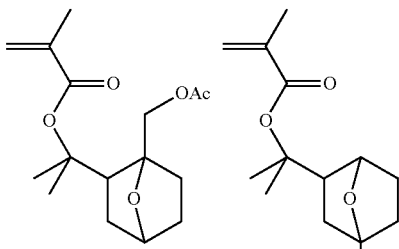
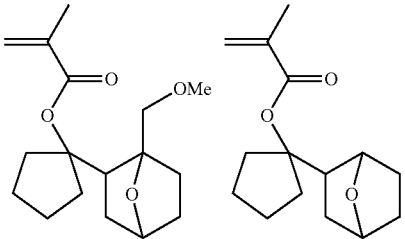
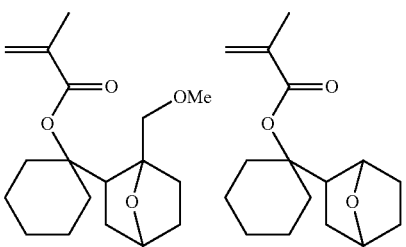
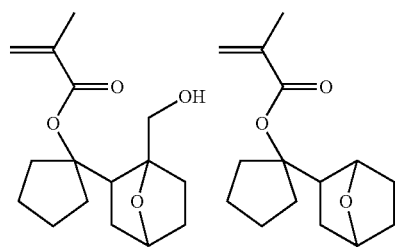
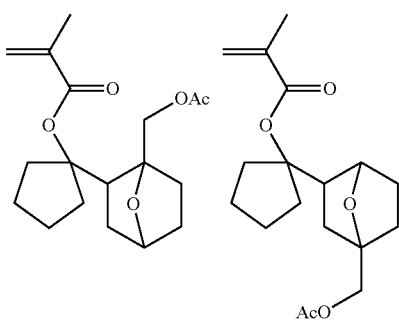
[Method for Producing Polymer Compound]
One method for synthesizing the polymer compound contained in the inventive resist composition is thermal polymerization of intended monomers corresponding to the repeating units a to g in the presence of a radical polymerization initiator in an organic solvent to obtain a copolymerized polymer compound.

Illustrative examples of the organic solvent used in the polymerization include toluene, benzene, tetrahydrofuran, diethyl ether, and dioxane. Illustrative examples of the polymerization initiator include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. These materials can be polymerized by heating preferably at 50 to 80° C. The reaction time is 2 to 100 hours, preferably 5 to 20 hours.

In the case that hydroxystyrene or hydroxyvinylnaphthalene is copolymerized, acetoxystyrene or acetoxyvinylnaphthalene may be used in place of hydroxystyrene or hydroxyvinylnaphthalene for polymerization, followed by deprotection of the acetoxy group by alkaline hydrolysis to form polyhydroxystyrene or hydroxypolyvinylnaphthalene.

As a base for the alkaline hydrolysis, aqueous ammonia and triethylamine may be used. The reaction temperature is −20 to 100° C., preferably 0 to 60° C. The reaction time is 0.2 to 100 hours, preferably 0.5 to 20 hours.

The ratio of the repeating units a1 to a5 and b to g are as follows.

a1 to a5 satisfy $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, and $0 < a1+a2+a3+a4+a5 \leq 1.0$, preferably $0 \leq a1 \leq 0.9$, $0 \leq a2 \leq 0.9$, $0 \leq a3 \leq 0.9$, $0 \leq a4 \leq 0.9$, $0 \leq a5 \leq 0.9$, and $0.01 \leq a1+a2+a3+a4+a5 \leq 0.9$, more preferably $0 \leq a1 \leq 0.8$, $0 \leq a2 \leq 0.8$, $0 \leq a3 \leq 0.8$, $0 \leq a4 \leq 0.8$, $0 \leq a5 \leq 0.8$, and $0.02 \leq a1+a2+a3+a4+a5 \leq 0.8$, much more preferably $0 \leq a1 \leq 0.7$, $0 \leq a2 \leq 0.7$, $0 \leq a3 \leq 0.7$, $0 \leq a4 \leq 0.7$, $0 \leq a5 \leq 0.7$, and $0.03 \leq a1+a2+a3+a4+a5 \leq 0.7$.

b satisfies $0 \leq b < 1.0$, preferably $0.1 \leq b \leq 0.9$, more preferably $0.15 \leq b \leq 0.8$.

c satisfies $0 \leq c < 1.0$, preferably $0 \leq c \leq 0.9$, more preferably $0 \leq c \leq 0.8$. Here, c represents c1+c2+c3+c4+c5.

d satisfies $0 \leq d \leq 0.5$, preferably $0 \leq d \leq 0.4$, more preferably $0 \leq d \leq 0.3$. Here, d represents d1+d2+d3.

e satisfies $0 \leq e \leq 0.5$, preferably $0 \leq e \leq 0.4$, more preferably $0 \leq e \leq 0.3$.

f satisfies $0 \leq f \leq 0.5$, preferably $0 \leq f \leq 0.4$, more preferably $0 \leq f \leq 0.3$.

g satisfies $0 \leq g \leq 0.5$, preferably $0 \leq g \leq 0.4$, more preferably $0 \leq g \leq 0.3$.

In addition, the ratio is preferably $0.2 \leq a1+a2+a3+a4+a5+b+c \leq 1.0$, particularly $0.3 \leq a1+a2+a3+a4+a5+b+c \leq 1.0$, and a1+a2+a3+a4+a5+b+c+d+e+f+g=1.

For example, a1+a2+a3+a4+a5+b+c=1 means that the total amount of the repeating units a1, a2, a3, a4, a5, b, and c is 100 mol % with respect to the total amount of the whole repeating units in the polymer compound containing the repeating units a1, a2, a3, a4, a5, b, and c. a1+a2+a3+a4+a5+b+c<1 means that the total amount of the repeating units a1, a2, a3, a4, a5, b, and c is less than 100 mol % with respect to the total amount of the whole repeating units, and the polymer compound contains other repeating units in addition to the repeating units a1, a2, a3, a4, a5, b, and c.

The polymer compound used in the inventive resist composition preferably has a weight average molecular weight of 1,000 to 500,000, more preferably 2,000 to 30,000. When the weight average molecular weight is 1,000 or more, the resist composition has sufficient heat resistance. When it is 500,000 or less, there is no possibility of lowering solubility in an alkaline solution and causing a footing profile after patterning.

Herein, the weight average molecular weight (Mw) is measured by gel permeation chromatography (GPC) in terms of polystyrene.

If the molecular weight distribution (Mw/Mn) of multi-component copolymer is wide in the polymer compound used in the inventive resist composition, foreign matters may be found on the pattern or the pattern profile may degrade after exposure due to polymers having low molecular weight or high molecular weight. The influence of the molecular weight and the molecular weight distribution increases with miniaturization of pattern rule. Thus, to obtain the resist composition usable for a fine pattern, the molecular weight distribution of the multicomponent polymer to be used is preferably 1.0 to 2.0, particularly in a narrow range of 1.0 to 1.5.

In addition, it is also possible to blend two or more polymers having a different composition ratio, molecular weight distribution, or molecular weight.

<Resist Composition>

The polymer compound contained in the inventive resist composition is suitable for a base resin of a resist composition, particularly a chemically amplified resist composition. A resist composition using such a polymer compound as the base resin and appropriately combining with an organic solvent, an acid generator, a dissolution control agent, a basic compound, a surfactant, and other additives as needed is highly sensitive because dissolution rate of the polymer compound into a developer is enhanced at the exposed part by catalytic reaction. This resist composition can provide a resist film that has high dissolution contrast, high resolution, exposure margin, excellent process applicability, good pattern profile after exposure, and excellent etching resistance. In particular, this composition can control the acid diffusion and thus reduce coarse-dense size difference. Thus, the inventive resist composition is highly practical and effective as a resist composition for VLSI.

In particular, the chemically amplified resist composition containing an acid generator to use acid catalyst reaction has high sensitivity and is excellent in various properties. Thus, such a composition is extremely useful.

Moreover, addition of a dissolution control agent into the resist composition increases the difference in dissolution rate between the exposed part and the unexposed part, thus improving the resolution.

Furthermore, addition of a basic compound allows, for example, acid diffusion rate in the resist film to be reduced, thus improving the resolution. Addition of a surfactant allows coating property of the resist composition to be improved or controlled.

As mentioned above, the inventive resist composition may contain an acid generator to utilize the composition as a chemically amplified resist composition used in the inventive patterning process. For example, a compound capable of generating an acid by responding to an active beam or a radiation beam (photo acid generator) may be contained therein. The photo acid generator component may be any compound capable of generating an acid by exposure with a high energy beam. Examples of the suitable photo acid generator include a sulfonium salt, an iodonium salt, a sulfonyldiazomethane, an N-sulfonyloxyimide, and an oxime-O-sulfonate type acid generator. These compounds may be used solely or in combination of two or more kinds, as described later in detail.

Illustrative examples of the acid generator are described in paragraphs (0122) to (0142) of Japanese Patent Laid-Open Publication No. 2008-111103.

The inventive resist composition may contain one or more of an organic solvent, a basic compound, a dissolution control agent, a surfactant, and acetylene alcohol, as mentioned above.

Illustrative examples of the organic solvent are disclosed, for example, in paragraphs (0144) and (0145) of Japanese Patent Application Laid-Open No. 2008-111103, including ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and a mixed solvent thereof. Illustrative examples of the basic compound are disclosed in paragraphs (0146) to (0164), including primary, secondary, or tertiary amine compounds, particularly amine compounds having a hydroxyl group, an ether group, an ester group, a lactone ring, a cyano group, or a sulfonate ester group. Illustrative examples of the surfactant are disclosed in paragraphs (0165) and (0166), the dissolution control agent in paragraphs (0155) to (0178) of Japanese Patent Laid-Open Publication No. 2008-122932, and the acetylene alcohols in paragraphs (0179) to (0182) of the same publication. In addition, a polymer-type quencher described in Japanese Patent Laid-Open Publication No. 2008-239918 may also be added. By applying this quencher to the resist surface after coating, rectangularity of the resist after patterning can be enhanced. The polymer-type quencher also has the effects to prevent film loss of the pattern when a top coat for immersion exposure is formed thereon as well as prevent rounding of the pattern head.

The formulation amount of the acid generator is preferably 0.01 to 100 parts by mass, particularly 0.1 to 80 parts by mass, based on 100 parts by mass of the base resin. The formulation amount of the organic solvent is preferably 50 to 10,000 parts by mass, particularly 100 to 5,000 parts by mass, based on 100 parts by mass of the base resin. The formulation amount of the dissolution control agent is preferably 0 to 50 parts by mass, particularly 0 to 40 parts by mass, the formulation amount of the basic compound is preferably 0 to 100 parts by mass, particularly 0.001 to 50 parts by mass, and the formulation amount of the surfactant is preferably 0 to 10 parts by mass, particularly 0.0001 to 5 parts by mass, based on 100 parts by mass of the base resin.

When the inventive resist composition, for example, a chemically amplified resist composition that contains an organic solvent, a polymer compound having the repeating unit substituted with the acid-labile groups shown by the general formulae (1-1) to (1-5), an acid generator, and a basic compound is used for manufacturing various integrated circuits, known lithography techniques can be used, although it is not particularly limited thereto.

The inventive resist composition, particularly the chemically amplified resist composition, as mentioned above, can be used, for example, not only for lithography in semiconductor circuit formation but also in formation of a mask circuit pattern, a micromachine, or a thin-film magnetic head circuit.

(Patterning Process)

The present invention provides a patterning process including the steps of applying the inventive resist composition on a substrate; performing exposure with a high energy beam after heat treatment; and performing development with a developer.

For example, the inventive resist composition is applied onto a substrate for integrated circuit manufacture (e.g., Si, $SiO_2$, SiN, SiON, TiN, WSi, BPSG, SOG, and an organic antireflective film) or a substrate for mask circuit manufacture (e.g., Cr, CrO, CrON, MoSi, and $SiO_2$) by an appropriate coating method including spin coating, roll coating, flow coating, dip coating, spray coating, and doctor coating, so as to give a film thickness of 0.1 to 2.0 μm. This substrate is then pre-baked on a hot plate at 60 to 150° C. for 10 seconds to 30 minutes, preferably at 80 to 120° C. for 30 seconds to 20 minutes.

Then, the intended pattern is exposed to light directly or through a prescribed mask with a light source selected from high energy beams such as an ultraviolet ray, a far ultraviolet ray, an electron beam, an X-ray, an excimer laser beam, a γ-beam, a synchrotron radiation beam, and a vacuum ultraviolet ray (soft X-ray). The exposure is performed with an exposure dose of preferably about 1 to 200 $mJ/cm^2$, more preferably 10 to 100 $mJ/cm^2$, or preferably about 0.1 to 100 μC, more preferably 0.5 to 50 μC. Then, post exposure baking (PEB) is performed on a hot plate at 60 to 150° C. for 10 seconds to 30 minutes, preferably at 80 to 120° C. for 30 seconds to 20 minutes.

PEB may be performed in the air or in a nitrogen gas stream, and is preferably performed under a humid condition. The PEB condition with high temperature and humidity means that heat treatment is performed under a condition that the moisture content is preferably 10 g or more, more preferably 15 g or more, much more preferably 20 g or more per kilogram of dry air. The condition that the moisture content is 10 g per kilogram of dry air corresponds to 60% humidity at 23° C.

Water becomes $H_3O^+$ in the presence of a strong acid and then adds to an olefin produced by deprotection reaction, thereby producing an alcohol. The alcohol has high boiling point and thus is difficult to evaporate from the resist film. This is a mechanism of reducing shrinkage of the resist film. In addition, the alcohol has low solubility in an organic solvent developer and thus increases the remaining amount of the resist film after development.

PEB is most preferably performed on a hot plate, under a moisture environment with high humidity. The resist film may be baked while high temperature and high humidity steam is sprayed on the film.

As the film shrinkage rate after PEB decreases, the deformation rate of an isolated trench pattern tends to decrease. The aforementioned Non-Patent Document 4 describes that the film shrinkage rate after PEB is 15%, which causes deformation of an isolated trench pattern. Thus, the film shrinkage rate after PEB is preferably 15% or less, more preferably 12% or less, much more preferably 10% or less.

Then, the film is developed with an alkali aqueous developer such as tetramethylammonium hydroxide (TMAH), tetraethylammonium hydroxide (TEAH), tetrapropylammonium hydroxide (TPAH), and tetrabutylammonium hydroxide (TBAH) with a concentration of 0.1 to 10 mass %, preferably 2 to 10 mass %, particularly preferably 2 to 8 mass %, for 3 seconds to 3 minutes, preferably 5 seconds to 2 minutes, by a common method such as dip method, puddle method, and spray method. This development makes the photo-exposed part dissolve in the developer while the unexposed is insoluble, thereby forming an intended positive pattern on the substrate. The inventive resist composition is suitable for fine patterning by a high energy beam, especially an i-beam, a KrF excimer laser beam, an ArF excimer laser beam, an electron beam, a vacuum ultraviolet ray (soft X-ray), an X-ray, a γ-ray, or a synchrotron radiation beam. In particular, this composition is suitable for fine patterning by an i-beam with a wavelength of 364 nm, a KrF excimer laser beam with a wavelength of 248 nm, an ArF excimer laser beam with a wavelength of 193 nm, an EUV lithography with a wavelength of 13.5 nm, or an electron beam.

As the developer using tetramethylammonium hydroxide (TMAH), a 2.38 mass % TMAH aqueous solution is most widely used. This concentration corresponds to 0.26 N. The TEAH, TPAH, and TBAH aqueous solutions are also preferably used with the same normality. The concentrations of TEAH, TPAH, and TBAH corresponding to 0.26 N are 3.84 mass %, 5.31 mass %, and 6.78 mass %, respectively.

TEAH, TPAH, and TBAH having a longer alkyl chain are more effective than the generally and widely used TMAH aqueous solution to reduce swelling during development and prevent pattern collapse. Japanese Patent No. 3429592 discloses an example using the TBAH aqueous solution for development of a highly water-repellent polymer having no hydrophilic group, obtained by copolymerizing repeating units having an alicyclic structure such as adamantyl methacrylate with repeating units having an acid-labile group such as tert-butyl methacrylate.

In a 32-nm or less pattern resolved with EB or EUV, phenomena such as line wiggling, connection between lines, and fall of the connected line occur. These phenomena are supposed to be caused by connection between lines swollen during development. The swollen lines contain the developer and thus are so soft like a sponge that they fall down easily by a stress during rinsing. The developer having a longer alkyl chain is difficult to swell lines, thus preventing pattern collapse.

Alternatively, a negative pattern can be obtained by the organic solvent development. The developer used in this development may be one or more of 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

After completion of development, rinsing is performed. The rinsing solution is preferably a solvent that is miscible with the developer and does not dissolve the resist film. Preferable examples of the solvent include alcohols having 3 to 10 carbon atoms, ether compound having 8 to 12 carbon atoms, and alkane, alkene, alkyne, or aromatic solvents having 6 to 12 carbon atoms.

Illustrative examples of the alkane having 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Illustrative example of the alkene having 6 to 12 carbon atoms include hexene, heptene, octene, cyclohexene, methylcyclohexene, dimethylcyclohexene, cycloheptene, and cyclooctene. Illustrative examples of the alkyne having 6 to 12 carbon atoms include hexyne, heptyne, and octyne. Illustrative examples of the alcohol having 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Illustrative examples of the ether compound having 8 to 12 carbon atoms include one or more solvents selected from di-n-butyl ether, diisobutyl ether, di-sec-butyl ether, di-n-pentyl ether, diisopentyl ether, di-sec-pentyl ether, di-tert-amyl ether, and di-n-hexyl ether.

In addition to the foregoing solvents, aromatic solvents including toluene, xylene, ethylbenzene, isopropylbenzene, tert-butylbenzene, and mesitylene may be used.

EXAMPLES

Hereinafter, the present invention will be specifically described with reference to Synthesis Examples, Comparative Synthesis Examples, Examples, and Comparative Examples, but the present invention is not limited thereto.

The weight average molecular weight (Mw) is measured by gel permeation chromatography (GPC) in terms of polystyrene.

[Synthesis Example 1] Synthesis of Monomer

Monomers used in synthesis of polymer compounds were synthesized in the following manner.

[Synthesis Example 1-1] Synthesis of Monomer 1

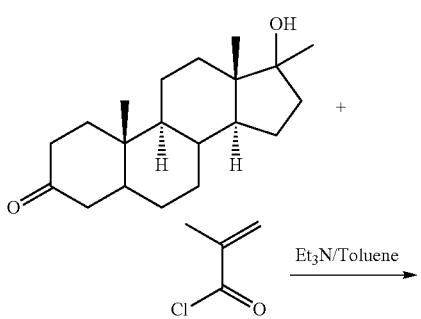

-continued

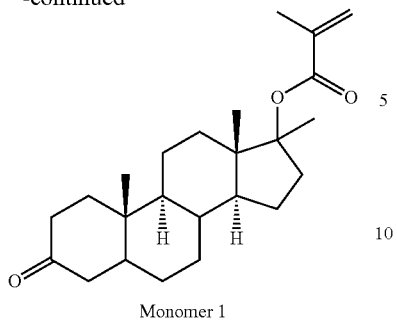

Monomer 1 wherein Et denotes an ethyl group.

To a mixture of 120 g of methacrylic acid chloride, 300 g of 17α-methylandrostan-17β-ol-3-one, and 1,500 g of toluene was added 111 g of triethylamine while stirring under ice-cooling. Thereafter, the mixture was stirred at room temperature for 16 hours. The mixture was then subjected to a usual aqueous post-treatment (aqueous work-up), and the solvent was distilled off to obtain a crude product. The product was purified by column chromatography to obtain an intended product, Monomer 1.

[Synthesis Example 1-2] Synthesis of Monomer 2

Monomer 2 was synthesized in the same manner as in Synthesis Example 1-1 except that 17α-methylandrostan-17β-ol-3-one was changed to methyltestosterone.

[Synthesis Example 1-3] Synthesis of Monomer 3

Monomer 3 was synthesized in the same manner as in Synthesis Example 1-1 except that 17α-methylandrostan-17β-ol-3-one was changed to β-hydroxy-17-methylandrosta-1,4-dien-3-one.

[Synthesis Example 1-4] Synthesis of Monomer 4

Monomer 4 was synthesized in the same manner as in Synthesis Example 1-1 except that 17α-methylandrostan-17β-ol-3-one was changed to β-hydroxy-17-methylandrosta-4,9(11)-dien-3-one.

[Synthesis Example 1-5] Synthesis of Monomer 5

Monomer 5 was synthesized in the same manner as in Synthesis Example 1-1 except that 17α-methylandrostan-17β-ol-3-one was changed to mestranol.

[Synthesis Example 1-6] Synthesis of Monomer 6

Monomer 6 was synthesized in the same manner as in Synthesis Example 1-1 except that methacrylic acid chloride was changed to methacrylic acid-5-carboxylic acid-4-oxatricyclo[4.2.1.0$^{3,7}$]nonan-5-one-2-yl.

Structures of Monomers 1 to 6 synthesized in Synthesis Examples 1-1 to 1-6 are shown below.

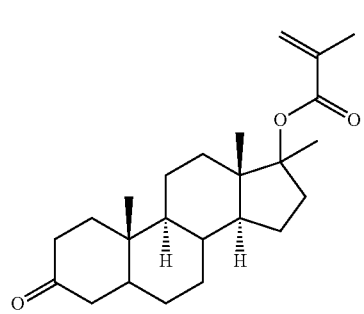

Monomer 1

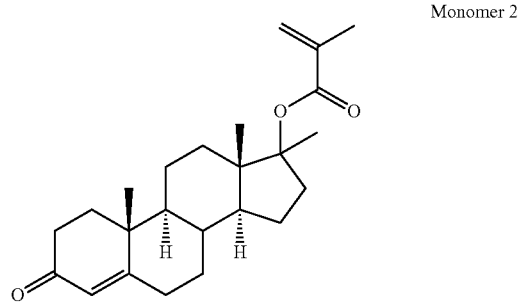

Monomer 2

Monomer 3

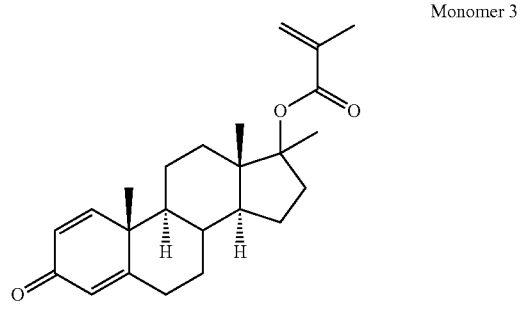

Monomer 4

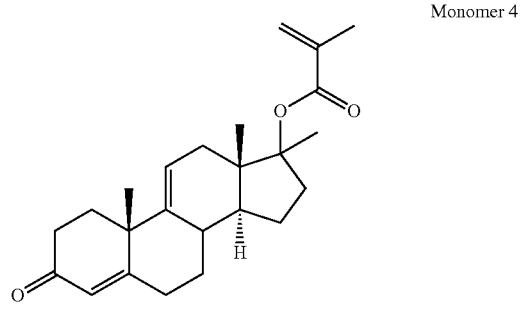

Monomer 5

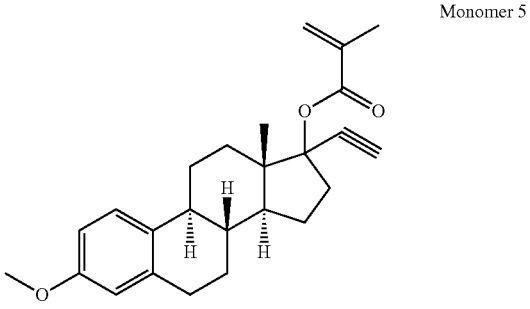

-continued

Monomer 6

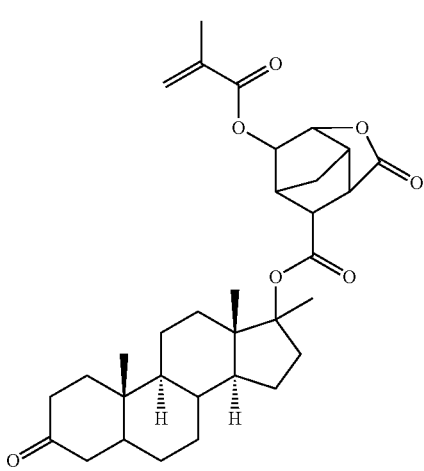

Synthesis Example 2

Synthesis of Polymer Compound (Polymer)

Polymers 1 to 6 were synthesized by using Monomers 1 to 6 obtained in Synthesis Examples 1-1 to 1-6. The structures of PAG monomers 1 and 2 used in Synthesis Example 2 and Comparative Synthesis Example are as follows.

PAG monomer 1

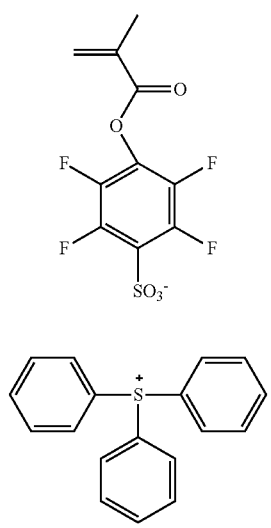

-continued

PAG monomer 2

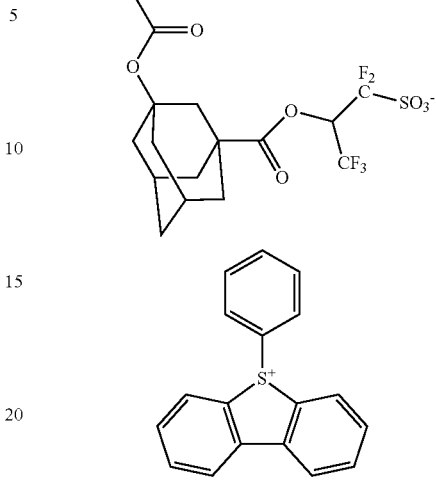

[Synthesis Example 2-1] Synthesis of Polymer 1

A 2 L flask was charged with 9.3 g of Monomer 1, 3.5 g of methacrylic acid 3-hydroxy-1-adamantyl ester, 10.2 g of methacrylic acid 2-oxooxolan-3-yl ester, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, filtered, and dried at 60° C. to obtain a white polymer.

The obtained polymer was analyzed by $^{13}$C-NMR, $^{1}$H-NMR, and GPC, consequently finding the following results.

Copolymerization Composition Ratio (Mole Ratio)

Monomer 1: methacrylic acid 3-hydroxy-1-adamantyl ester: methacrylic acid 2-oxooxolan-3-yl ester=0.25:0.15:0.60

Weight average molecular weight (Mw)=9,800

Molecular weight distribution (Mw/Mn)=1.62

This polymer compound was named Polymer 1.

Polymer 1

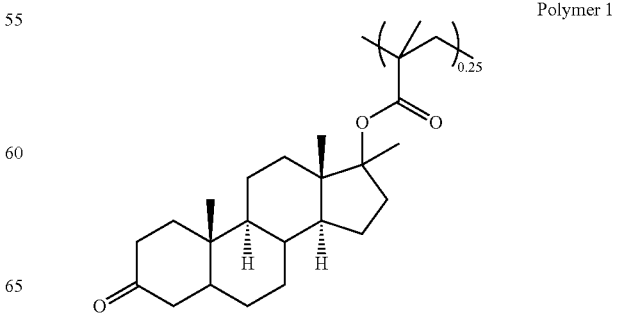

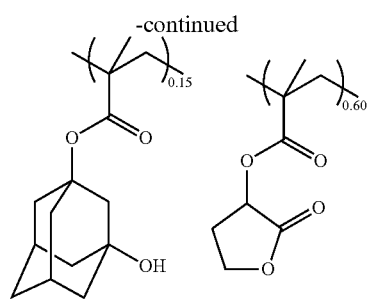
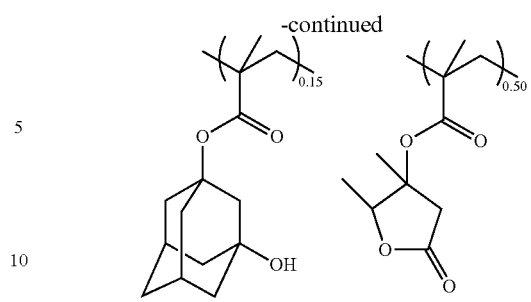

[Synthesis Example 2-2] Synthesis of Polymer 2

A 2 L flask was charged with 4.2 g of methacrylic acid 3-tert-butyl-3-cyclopentyl ester, 8.3 g of Monomer 6, 2.4 g of methacrylic acid 3-hydroxy-1-adamantyl ester, 9.9 g of β-methacryloxy-β,γ-dimethyl-γ-butyrolactone, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, filtered, and dried at 60° C. to obtain a white polymer.

The obtained polymer was analyzed by $^{13}$C-NMR, $^{1}$H-NMR, and GPC, consequently finding the following results.
Copolymerization Composition Ratio (Mole Ratio)
methacrylic acid 3-tert-butyl-3-cyclopentyl ester:Monomer 6:methacrylic acid 3-hydroxy-1-adamantyl ester: β-methacryloxy-β,γ-dimethyl-γ-butyrolactone=0.20:0.15:0.15:0.50
Weight average molecular weight (Mw)=9,200
Molecular weight distribution (Mw/Mn)=1.69

This polymer compound was named Polymer 2.

[Synthesis Example 2-3] Synthesis of Polymer 3

A 2 L flask was charged with 3.7 g of Monomer 2, 5.7 g of 4-tert-amyloxystyrene, 4.1 g of methacrylic acid 3,5-dimethyl-4-hydroxyphenyl ester, 9.0 g of methacrylic acid 3-oxo-2,7-dioxatricyclo[4.2.1.0$^{4,8}$]nonan-9-yl ester, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, filtered, and dried at 60° C. to obtain a white polymer.

The obtained polymer was analyzed by $^{13}$C-NMR, $^{1}$H-NMR, and GPC, consequently finding the following results.
Copolymerization Composition Ratio (Mole Ratio)
Monomer 2:4-tert-amyloxystyrene:methacrylic acid 3,5-dimethyl-4-hydroxyphenyl ester:methacrylic acid 3-oxo-2,7-dioxatricyclo[4.2.1.0$^{4,8}$]nonan-9-yl ester=0.10:0.30:0.20:0.40
Weight average molecular weight (Mw)=8,300
Molecular weight distribution (Mw/Mn)=1.69

This polymer compound was named Polymer 3.

Polymer 2

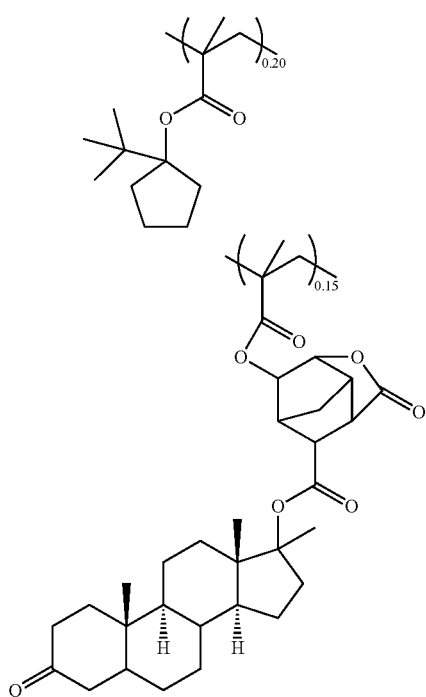

Polymer 3

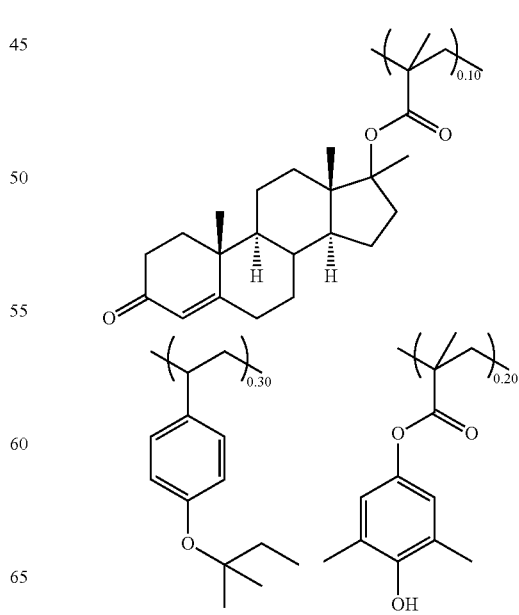

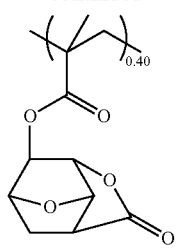

[Synthesis Example 2-4] Synthesis of Polymer 4

A 2 L flask was charged with 3.7 g of Monomer 3, 7.0 g of methacrylic acid 4-tert-butoxyphenyl ester, 3.6 g of methacrylic acid 4-hydroxyphenyl ester, 5.6 g of methacrylic acid 3-oxo-2,7-dioxatricyclo[4.2.1.0$^{4,8}$]nonan-9-yl ester, 8.6 g of PAG monomer 1, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, and then the obtained white solid was filtered, and dried under reduced pressure at 60° C. to obtain a white polymer.

The obtained polymer was analyzed by $^{13}$C-NMR, $^1$H-NMR, and GPC, consequently finding the following results.

Copolymerization Composition Ratio (Mole Ratio)

Monomer 3:methacrylic acid 4-tert-butoxyphenyl ester: methacrylic acid 4-hydroxyphenyl ester:methacrylic acid 3-oxo-2,7-dioxatricyclo[4.2.1.0$^{4,8}$]nonan-9-yl ester:PAG monomer 1=0.10:0.30:0.20:0.25:0.15

Weight average molecular weight (Mw)=8,500

Molecular weight distribution (Mw/Mn)=1.91

This polymer compound was named Polymer 4.

Polymer 4

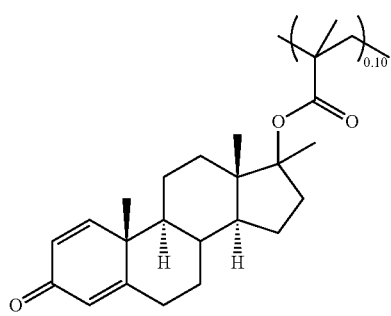

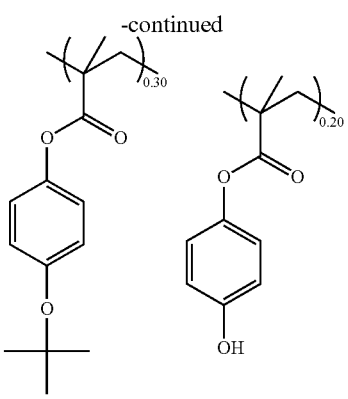

[Synthesis Example 2-5] Synthesis of Polymer 5

A 2 L flask was charged with 3.7 g of Monomer 4, 5.7 g of 4-tert-amyloxystyrene, 3.6 g of methacrylic acid 4-hydroxyphenyl ester, 5.6 g of methacrylic acid 3-oxo-2,7-dioxatricyclo[4.2.1.0$^{4,8}$]nonan-9-yl ester, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, and then the obtained white solid was filtered, and dried under reduced pressure at 60° C. to obtain a white polymer.

The obtained polymer was analyzed by $^{13}$C-NMR, $^1$H-NMR, and GPC, consequently finding the following results.

Copolymerization Composition Ratio (Mole Ratio)

Monomer 4:4-tert-amyloxystyrene:methacrylic acid 4-hydroxyphenyl ester:methacrylic acid 3-oxo-2,7-dioxatricyclo[4.2.1.0$^{4,8}$]nonan-9-yl ester:PAG monomer 2=0.10:0.30:0.20:0.25:0.15

Weight average molecular weight (Mw)=7,500

Molecular weight distribution (Mw/Mn)=1.95

This polymer compound was named Polymer 5.

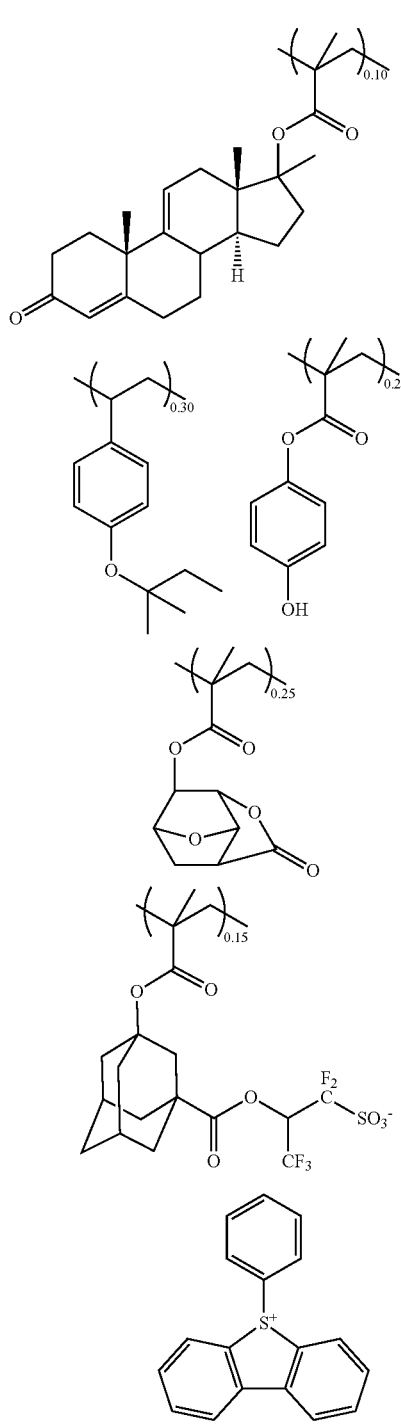

[Synthesis Example 2-6] Synthesis of Polymer 6

A 2 L flask was charged with 3.8 g of Monomer 5, 5.7 g of 4-tert-amyloxystyrene, 3.6 g of methacrylic acid 4-hydroxyphenyl ester, 5.6 g of methacrylic acid 3-oxo-2,7-dioxatricyclo[4.2.1.0$^{4,8}$]nonan-9-yl ester, 11.0 g of PAG monomer 2, and 40 g of tetrahydrofuran as a solvent. This reaction vessel was cooled to −70° C. in a nitrogen atmosphere, then degassed under reduced pressure and blown with nitrogen three times. After heating to room temperature, 1.2 g of azobisisobutyronitrile (AIBN) was added thereto as a polymerization initiator. The temperature was then increased to 60° C., and the solution reacted for 15 hours. The reaction solution was precipitated in 1 L of isopropyl alcohol, and then the obtained white solid was filtered, and dried under reduced pressure at 60° C. to obtain a white polymer.

The obtained polymer was analyzed by $^{13}$C-NMR, $^1$H-NMR, and GPC, consequently finding the following results.

Copolymerization Composition Ratio (Mole Ratio)

Monomer 5:4-tert-amyloxystyrene:methacrylic acid 4-hydroxyphenyl ester:methacrylic acid 3-oxo-2,7-dioxatricyclo[4.2.1.0$^{4,8}$]nonan-9-yl ester:PAG monomer 2=0.10:0.30:0.20:0.25:0.15

Weight average molecular weight (Mw)=7,900

Molecular weight distribution (Mw/Mn)=1.88

This polymer compound was named Polymer 6.

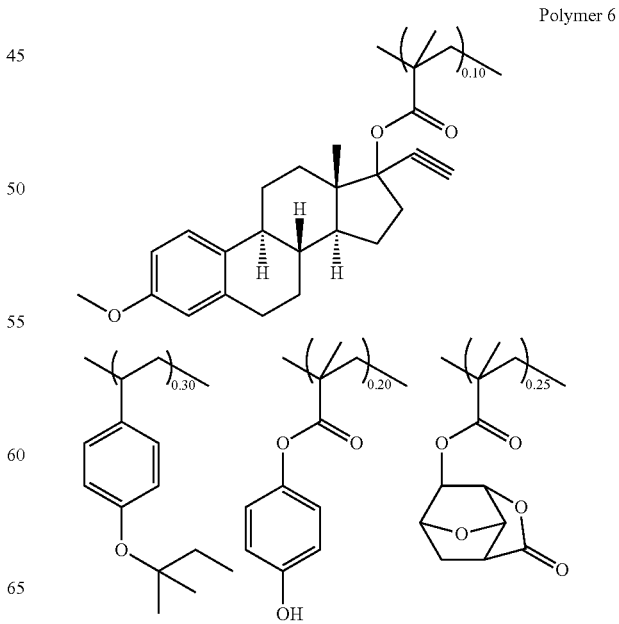

-continued

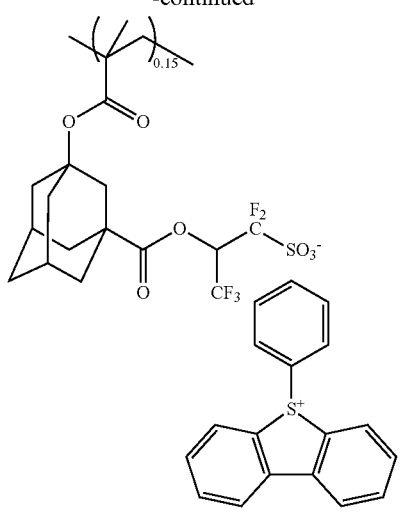

Comparative Synthesis Example 1

Comparative polymer 1 was synthesized in the same manner as in Synthesis Example 2.

Copolymerization Composition Ratio (Mole Ratio)

methacrylic acid 3-isopropyl-3-cyclopentyl ester:methacrylic acid 3-hydroxy-1-adamantyl ester:methacrylic acid 2-oxooxolan-3-yl ester=0.50:0.10:0.40

Weight average molecular weight (Mw)=9,300

Molecular weight distribution (Mw/Mn)=1.82

This polymer compound was named Comparative polymer 1.

Comparative polymer 1

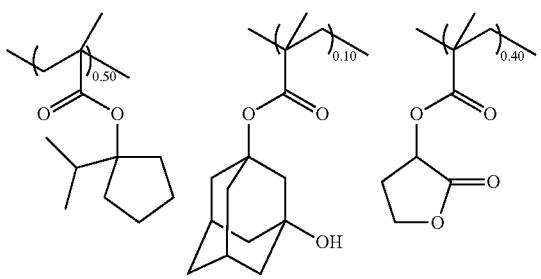

Comparative Synthesis Example 2

Comparative polymer 2 was synthesized in the same manner as in Synthesis Example 2.

Copolymerization Composition Ratio (Mole Ratio)

methacrylic acid 1-(adamantan-1-yl)-1-methylethyl ester:4-tert-amyloxystyrene:methacrylic acid 4-hydroxyphenyl ester:methacrylic acid 3-oxo-2,7-dioxatricyclo[4.2.1.0$^{4,8}$] nonan-9-yl ester:PAG monomer 2=0.20:0.20:0.20:0.25:0.15

Weight average molecular weight (Mw)=7,700

Molecular weight distribution (Mw/Mn)=1.89

This polymer compound was named Comparative polymer 2.

Comparative polymer 2

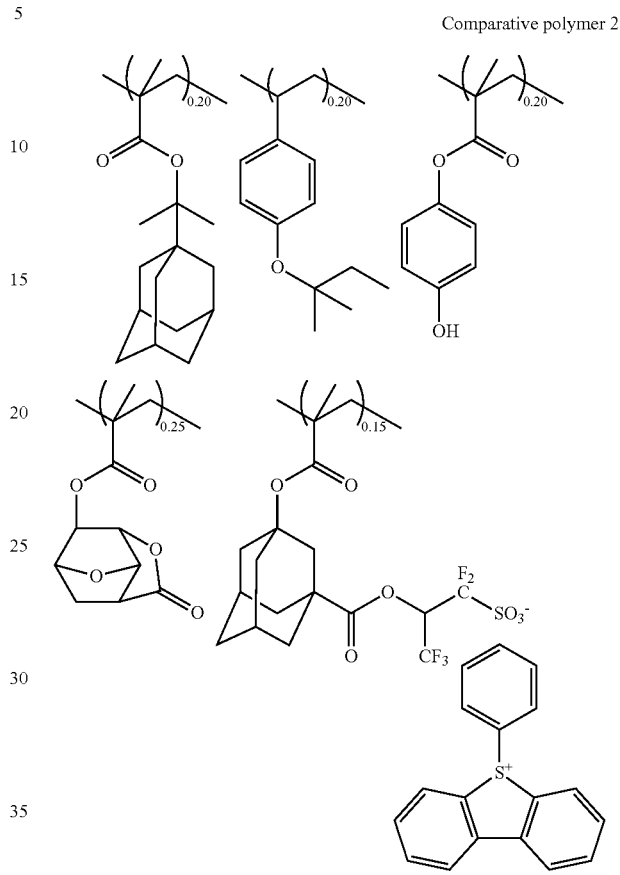

Examples 1 to 6 and Comparative Examples 1 and 2

Preparation of Resist Composition

The polymer compounds (Polymers 1 to 6 and Comparative polymers 1 and 2) thus synthesized were each dissolved in a solvent containing 100 ppm of a surfactant, FC-4430 available from Sumitomo 3M, Ltd., with the composition shown in Table 1 to form solutions. The solutions were filtered through a 0.2-μm filter to prepare resist compositions (Examples 1 to 6 and Comparative Examples 1 and 2).

The components shown in Table 1 are as follows.

Polymers 1 to 6: compounds obtained in Synthesis Examples 2-1 to 2-6

Comparative polymers 1 and 2: compounds obtained in Comparative Synthesis Examples 1 and 2

Organic solvent: PGMEA (propylene glycol monomethyl ether acetate)

CyH (cyclohexane)

GBL (γ-butyrolactone)

Acid generator: PAG 1, PAG 2 (shown by the following structural formulae)

PAG 1
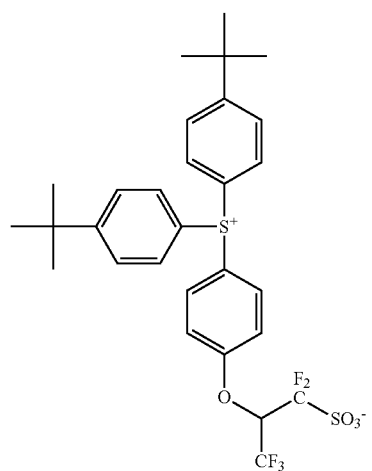
PAG 2
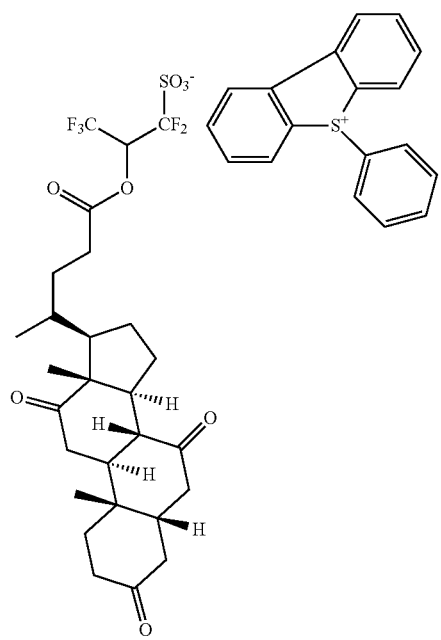
Basic compound: Quencher 1, Quencher 2 (shown by the following structural formulae)
Quencher 1
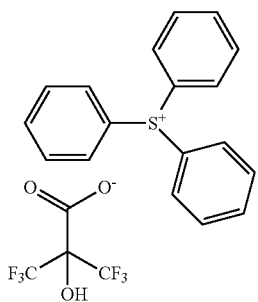
Quencher 2
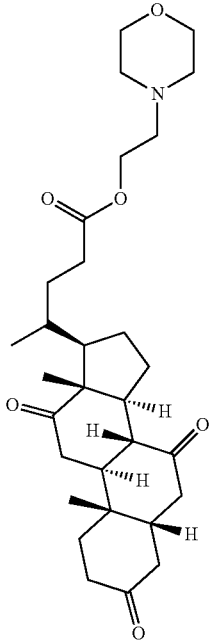
Water-repellent polymer 1 (shown by the following structural formula)
Molecular weight (Mw)=10,100
Dispersity (Mw/Mn)=1.51
Water-repellent polymer 1
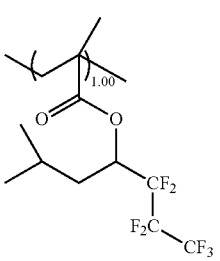

TABLE 1

| Resist composition | Polymer (part by mass) | Acid generator (part by mass) | Basic compound (part by mass) | Water-repellent polymer (part by mass) | Organic solvent (part by mass) |
|---|---|---|---|---|---|
| Example 1 | Polymer 1 (100) | PAG 1 (6.5) | Quencher 1 (4.0) | Water-repellent polymer 1 (5.0) | PGMEA (2,000) GBL (250) |
| Example 2 | Polymer 2 (100) | PAG 1 (6.5) | Quencher 1 (4.0) | Water-repellent polymer 1 (5.0) | PGMEA (2,000) GBL (250) |
| Example 3 | Polymer 3 (100) | PAG 2 (30) | Quencher 2 (1.5) | — | PGMEA (2,000) GBL (250) |
| Example 4 | Polymer 4 (100) | PAG 2 (30) | Quencher 2 (1.5) | — | PGMEA (2,000) GBL (250) |
| Example 5 | Polymer 5 (100) | — | Quencher 2 (1.5) | — | PGMEA (500) CyH (1,500) |
| Example 6 | Polymer 6 (100) | — | Quencher 2 (1.5) | — | PGMEA (500) CyH (1,500) |
| Comparative Example 1 | Comparative polymer 1 (100) | PAG 1 (6.5) | Quencher 1 (4.0) | Water-repellent polymer 1 (5.0) | PGMEA (2,000) GBL (250) |
| Comparative Example 2 | Comparative polymer 2 (100) | — | Quencher 2 (1.5) | — | PGMEA (500) CyH (1,500) |

ArF Exposure Evaluation

Spin-on carbon film ODL-102, manufactured by Shin-Etsu Chemical Co., Ltd., was formed on a silicon wafer with a film thickness of 200 nm, and silicon-containing spin-on hard mask SHB-A940 was formed thereon with a film thickness of 35 nm to obtain a substrate for a tri-layer process. On this substrate, the resist composition prepared with the composition shown in Table 1 (Examples 1, 2, and Comparative Example 1) was applied by spin coating and then baked with a hot plate at a temperature shown in Table 2 for 60 seconds to form a resist film 90 nm thick.

These films were exposed to light by an ArF excimer laser liquid immersion scanner (NSR-610C, manufactured by Nikon Corporation, NA=1.30, σ=0.98/0.78, dipole opening 20°, Azimuthally polarized illumination, 6% halftone phase shift mask) with various exposure dose. After exposure, baking (PEB) was performed at a temperature shown in Table 2 by a manual hot plate to which the air containing 25 g of moisture per kilogram of dry air at 40° C. (50% humidity) was supplied with a flow rate of 2 L/min by a precisely controlled humidity-supplying apparatus SRG-1R-AS, manufactured by Daiichikagaku Inc. After PEB for 60 seconds, puddle development was carried out with a developer of n-butyl acetate for 30 seconds to form a 40-nm line and space pattern. Sensitivity at this time and line width roughness (LWR) after development were measured with a length measuring SEM (CG-4000, manufactured by Hitachi High-Technologies Corp.). The result is given in Table 2.

TABLE 2

| Resist composition | PEB temperature (° C.) | Sensitivity (mJ/cm$^2$) | LWR (nm) |
|---|---|---|---|
| Example 1 | 90 | 28 | 3.2 |
| Example 2 | 90 | 32 | 3.5 |
| Comparative Example 1 | 85 | 37 | 4.3 |

Electron Beam Lithography Evaluation

For lithography evaluation, the resist composition prepared with the composition shown in Table 1 (Examples 3 to 6 and Comparative Example 2) was applied on a 6-inch diameter Si substrate subjected to HMDS (hexamethyldisilazane) vapor prime, by spin coating with clean track Mark 5 (manufactured by Tokyo Electron, Ltd.). Then, the composition was pre-baked on a hot plate at 110° C. for 60 seconds to form a resist film with a thickness of 100 nm. To this was drawn in a vacuum chamber with HL-800D (manufactured by Hitachi, Ltd.) with a HV voltage of 50 keV.

After drawing, PEB was performed at a temperature shown in Table 3, by a manual hot plate to which the air containing 25 g of moisture per kilogram of dry air at 40° C. (50% humidity) was supplied with a flow rate of 2 L/min by a precisely controlled humidity-supplying apparatus SRG-1R-AS, manufactured by Daiichikagaku Inc. Then, puddle development was carried out with a 2.38 mass % TMAH aqueous solution for 30 seconds to obtain a positive pattern.

The obtained resist pattern was evaluated in the following manner.

A minimum dimension at an exposure dose which allows a 120-nm line and space pattern of 1:1 resolution was defined as resolution, and line width roughness (LWR) of the 120-nm LS pattern was measured by SEM.

Table 3 shows the resist compositions, results of sensitivity in EB exposure, resolution, and LWR thereof.

TABLE 3

| Resist composition | PEB temperature (° C.) | Sensitivity (μC/cm$^2$) | Resolution (nm) | LWR (nm) |
|---|---|---|---|---|
| Example 3 | 85 | 30 | 80 | 5.8 |
| Example 4 | 85 | 31 | 80 | 5.8 |
| Example 5 | 85 | 38 | 75 | 4.3 |
| Example 6 | 75 | 37 | 75 | 4.2 |
| Comparative Example 2 | 85 | 37 | 85 | 6.3 |

The results of Tables 2 and 3 demonstrate that Examples 1 to 6, which contain the polymer compound having the repeating unit substituted with the acid-labile groups shown by the general formulae (1-1) to (1-5), had appropriate resolution, sensitivity and LWR.

In addition, when the polymer-type acid generator was copolymerized (Examples 4 to 6), LWR property was more improved than Example 3, which contains no polymer-type acid generator. This indicates that the polymer compound used in the inventive resist composition exhibited very excellent resolution and small LWR by synergism due to copolymerization with the acid generator.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A resist composition comprising:
an organic solvent;
an acid generator, and
a base resin comprising a polymer compound having one or more repeating units selected from repeating units a1 to a5 shown by the following general formulae (2-1) to (2-5), the polymer compound having a weight average molecular weight ranging from 1,000 to 500,000,

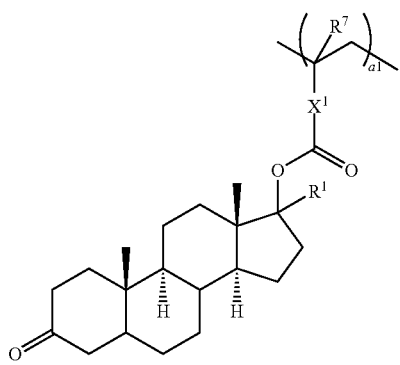

(2-1)

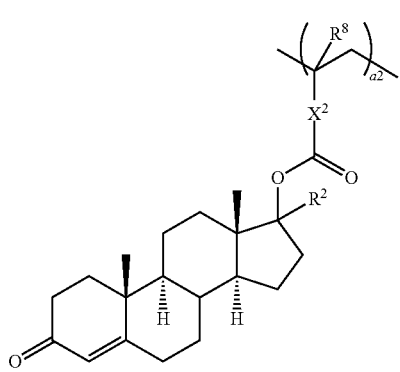

(2-2)

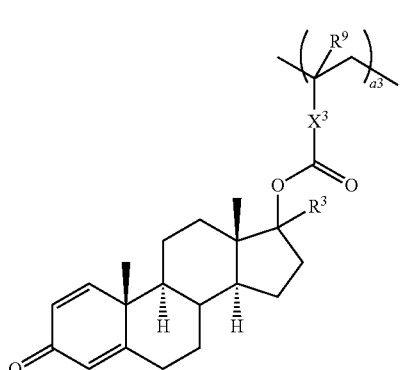

(2-3)

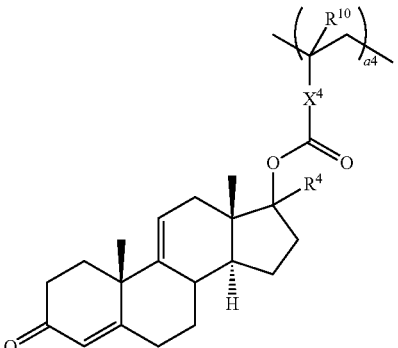

(2-4)

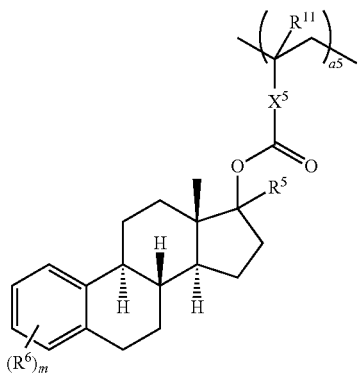

(2-5)

wherein $R^1$ and $R^3$ to $R^5$ represent a linear, branched, or cyclic alkyl group having 1 to 4 carbon atoms, an alkenyl group having 2 to 4 carbon atoms, or an alkynyl group having 2 to 4 carbon atoms; $R^2$ represents a linear, branched, or cyclic alkyl group having 1 to 4 carbon atoms, an alkenyl group having 2 to 4 carbon atoms, or an alkynyl group having 3 to 4 carbon atoms; $R^6$ represents a hydroxyl group or an alkoxy group or an acyloxy group having 1 to 6 carbon atoms; and "m" represents 1 or 2; $X^1$ to $X^5$ represent a single bond or —C(=O)—O—$R^{12}$— where $R^{12}$ represents a linear, branched, or cyclic alkylene group having 1 to 10 carbon atoms and optionally containing an ester group, an ether group, or a lactone ring; $R^7$ to $R^{11}$ represent a hydrogen atom or a methyl group; a1 to a5 satisfy 0≤a1<0.2, 0≤a2<0.2, 0≤a3<0.2, 0≤a4<0.2, 0≤a5<0.2, and 0<a1+a2+a3+a4+a5<0.2.

2. The resist composition according to claim 1, wherein the polymer compound is further copolymerized with one or more repeating units b each containing an adhesion group selected from a hydroxyl group, a lactone ring, an ether group, an ester group, a carbonyl group, a cyano group, a sulfonate ester group, a sulfonamide group, cyclic —O—C(=O)—S—, and cyclic —O—C(=O)—NH—, with a content ratio of the repeating unit b of 0<b<1.0.

3. The resist composition according to claim 2, wherein the repeating unit b contains either or both of a phenolic hydroxyl group and a lactone ring.

4. The resist composition according to claim 3, wherein the repeating unit containing the phenolic hydroxyl group is selected from repeating units b1 to b8 shown by the following general formulae (3), (3)

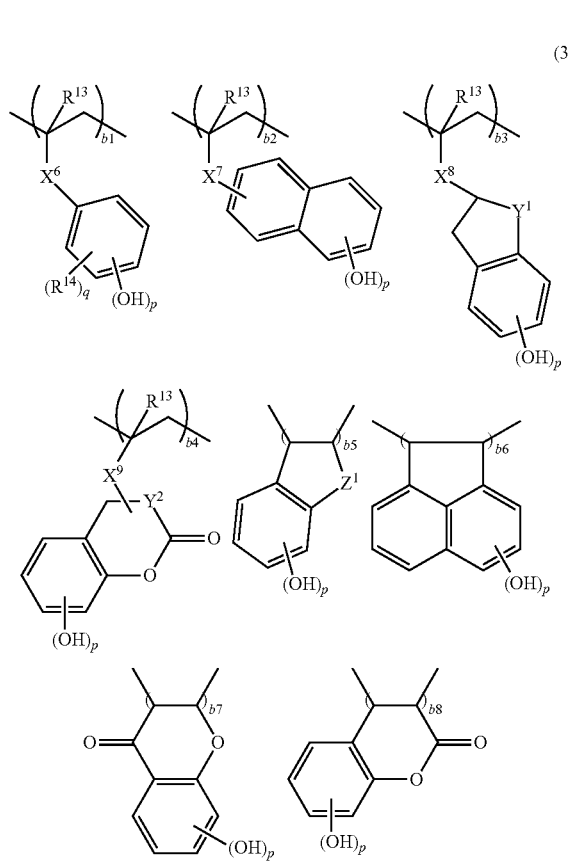

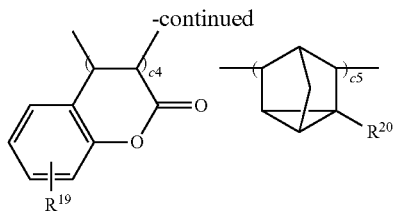

wherein $X^6$ and $X^7$ represent a single bond, —C(=O)—O—$R^{15}$—, or —C(=O)—NH—; $X^8$ and $X^9$ represent —C(=O)—O—$R^{15}$—, where $R^{15}$ represents a single bond or a linear, branched or cyclic alkylene group having 1 to 10 carbon atoms; $R^{14}$ represents a cyano group, a nitro group, a halogen atom, or a linear, branched, or cyclic alkyl group, alkoxy group, acyl group, acyloxy group, or alkoxycarbonyl group having 1 to 5 carbon atoms; $R^{13}$ may be the same or different and represents a hydrogen atom or a methyl group; $Y^1$ and $Y^2$ represent a methylene group or an ethylene group; $Z^1$ represents a methylene group, an oxygen atom, or a sulfur atom; "p" represents 1 or 2; "q" represents an integer of 0 to 4; and b1 to b8 satisfy 0≤b1<1.0, 0≤b2<1.0, 0≤b3<1.0, 0≤b4<1.0, 0≤b5<1.0, 0≤b6<1.0, 0≤b7<1.0, 0≤b8<1.0, and 0<b1+b2+b3+b4+b5+b6+b7+b8<1.0.

5. The resist composition according to claim 2, wherein the polymer compound is further copolymerized with one or more repeating units selected from repeating units c1 to c5 shown by the following general formulae (4), (4)

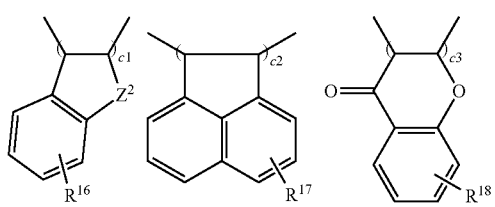

-continued

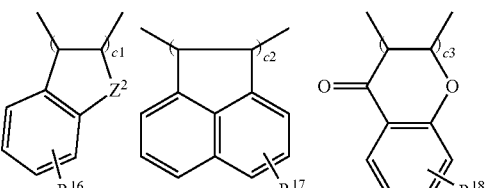

wherein $R^{16}$ to $R^{20}$ each represent a hydrogen atom, an alkyl group having 1 to 30 carbon atoms, an alkyl group partially or wholly substituted with a halogen atom, an alkoxy group, an alkanoyl group, an alkoxycarbonyl group, an aryl group having 6 to 10 carbon atoms, a halogen atom, or a 1,1,1,3,3,3-hexafluoro-2-propanol group; $Z^2$ represents a methylene group, an oxygen atom, or a sulfur atom; and c1 to c5 satisfy 0≤c1<1.0, 0≤c2<1.0, 0≤c3<1.0, 0≤c4<1.0, 0≤c5<1.0, and 0<c1+c2+c3+c4+c5<1.0.

6. The resist composition according to claim 1, wherein the polymer compound is further copolymerized with one or more repeating units selected from repeating units c1 to c5 shown by the following general formulae (4), (4)

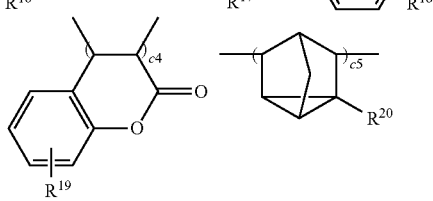

wherein $R^{16}$ to $R^{20}$ each represent a hydrogen atom, an alkyl group having 1 to 30 carbon atoms, an alkyl group partially or wholly substituted with a halogen atom, an alkoxy group, an alkanoyl group, an alkoxycarbonyl group, an aryl group having 6 to 10 carbon atoms, a halogen atom, or a 1,1,1,3,3,3-hexafluoro-2-propanol group; $Z^2$ represents a methylene group, an oxygen atom, or a sulfur atom; and c1 to c5 satisfy 0≤c1<1.0, 0≤c2<1.0, 0≤c3<1.0, 0≤c4<1.0, 0≤c5<1.0, and 0<c1+c2+c3+c4+c5<1.0.

7. The resist composition according to claim 1, wherein the polymer compound is further copolymerized with one or more repeating units selected from repeating units d1 to d3 each having a sulfonium salt, shown by the following general formulae (5), (5)

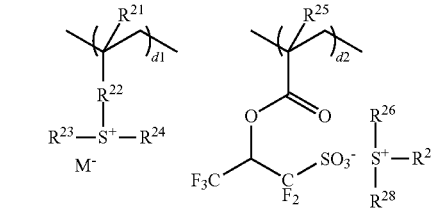

-continued

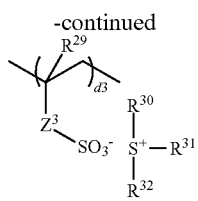

wherein $R^{21}$, $R^{25}$, and $R^{29}$ represent a hydrogen atom or a methyl group; $R^{22}$ represents a single bond, a phenylene group, —O—$R^{33}$—, or —C(=O)—Y—$R^{33}$—, where Y represents an oxygen atom or NH and $R^{33}$ represents a linear, branched, or cyclic alkylene group having 1 to 6 carbon atoms, an alkenylene group, or a phenylene group in which these groups may contain a carbonyl group, an ester group, an ether group, or a hydroxyl group; $R^{23}$, $R^{24}$, $R^{26}$, $R^{27}$, $R^{28}$, $R^{30}$, $R^{31}$, and $R^{32}$ may be the same or different and represent a linear, branched, or cyclic alkyl group having 1 to 12 carbon atoms and optionally containing a carbonyl group, an ester group, or an ether group, an aryl group having 6 to 12 carbon atoms, an aralkyl group having 7 to 20 carbon atoms, or a thiophenyl group; $Z^3$ represents a single bond, a methylene group, an ethylene group, a phenylene group, a fluorinated phenylene group, —O—$R^{34}$—, —C(=O)—O—$R^{34}$—, or —C(=O)—NH—$R^{34}$—, where $R^{34}$ represents a linear, branched, or cyclic alkylene group having 1 to 6 carbon atoms, an alkenylene group, or a phenylene group, in which these groups may contain a carbonyl group, an ester group, an ether group, or a hydroxyl group; $M^-$ represents a non-nucleophilic counter ion; and d1, d2, and d3 satisfy 0≤d1≤0.3, 0≤d2≤0.3, 0≤d3≤0.3, and 0<d1+d2+d3≤0.3.

8. The resist composition according to claim 1, further comprising either or both of a basic compound and a surfactant as an additive(s).

9. A patterning process comprising the steps of applying the resist composition according to claim 1 on a substrate; performing exposure with a high energy beam after heat treatment; and performing development with a developer.

10. The patterning process according to claim 9, wherein the developer used in the patterning process is one or more of 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and a negative pattern is formed by the development.

11. The patterning process according to claim 9, wherein the developer used in the patterning process is an alkali aqueous solution, and a positive pattern is formed by the development.

12. The patterning process according to claim 9, wherein the high energy beam is an i-beam with a wavelength of 364 nm, a KrF excimer laser beam with a wavelength of 248 nm, an ArF excimer laser beam with a wavelength of 193 nm, an EUV lithography with a wavelength of 13.5 nm, or an electron beam.

13. The patterning process according to claim 9, further comprising post exposure baking under a condition that a moisture content is 10 g or more per kilogram of dry air, before the development.

* * * * *